(12) United States Patent
Leong et al.

(10) Patent No.: US 9,800,643 B2
(45) Date of Patent: *Oct. 24, 2017

(54) CODING FOR REAL-TIME STREAMING UNDER PACKET ERASURES

(71) Applicant: CALIFORNIA INSTITUTE OF TECHNOLOGY, Pasadena, CA (US)

(72) Inventors: Derek Leong, Pasadena, CA (US); Asma Qureshi, Pasadena, CA (US); Yunkai Wei, Pasadena, CA (US); Tracey C. Ho, Pasadena, CA (US)

(73) Assignee: CALIFORNIA INSTITUTE OF TECHNOLOGY, Pasadena, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/360,926

(22) Filed: Nov. 23, 2016

(65) Prior Publication Data

US 2017/0093948 A1 Mar. 30, 2017

Related U.S. Application Data

(63) Continuation of application No. 14/080,686, filed on Nov. 14, 2013, now Pat. No. 9,531,780.

(Continued)

(51) Int. Cl.
*H04L 29/06* (2006.01)
*H03M 13/15* (2006.01)
(Continued)

(52) U.S. Cl.
CPC ...... *H04L 65/607* (2013.01); *H03M 13/1515* (2013.01); *H03M 13/23* (2013.01); *H03M 13/2721* (2013.01); *H03M 13/293* (2013.01); *H03M 13/373* (2013.01); *H03M 13/3723* (2013.01); *H03M 13/2921* (2013.01); *H03M 13/2924* (2013.01)

(58) Field of Classification Search
CPC . H04L 65/607; H04M 13/23; H04M 13/2909; H04M 13/2921; H04M 13/293; H04M 13/373; H04M 13/3761
USPC .......................................... 709/237
See application file for complete search history.

(56) References Cited

U.S. PATENT DOCUMENTS 5,870,412 A * 2/1999 Schuster ........... H03M 13/2703
714/752
6,694,478 B1 * 2/2004 Martinian ........... H03M 13/373
370/394

(Continued)

FOREIGN PATENT DOCUMENTS

EP 1206040 A2 * 5/2002 .......... H03M 13/373

OTHER PUBLICATIONS

E. Martinian, "Dynamic information and constraints in source and channel coding," PhD. Thesis, M.I.T., Sep. 2004.*

(Continued)

*Primary Examiner* — David Lazaro
*Assistant Examiner* — Robert Shaw
(74) *Attorney, Agent, or Firm* — Steinfl + Bruno LLP

(57) ABSTRACT

A computer-based real-time streaming system under packet erasures wherein created messages can be decoded within a fixed delay form their creation is presented. Various code construction methods and corresponding hardware implementation for different cases of erasure link models are also presented.

17 Claims, 23 Drawing Sheets

Related U.S. Application Data

(60) Provisional application No. 61/726,131, filed on Nov. 14, 2012.

(51) Int. Cl.
*H03M 13/27* (2006.01)
*H03M 13/37* (2006.01)
*H03M 13/23* (2006.01)
*H03M 13/29* (2006.01)

(56) References Cited

U.S. PATENT DOCUMENTS

| | | | | |
|---|---|---|---|---|
| 7,676,735 B2* | 3/2010 | Luby | ................ | H03M 13/1515 |
| | | | | 714/755 |
| 7,930,617 B1* | 4/2011 | Gass | ................ | H03M 13/1515 |
| | | | | 714/756 |
| 2003/0101408 A1* | 5/2003 | Martinian | ............ | H03M 13/03 |
| | | | | 714/776 |
| 2006/0279437 A1* | 12/2006 | Luby | ................ | H03M 13/1515 |
| | | | | 341/50 |
| 2010/0100791 A1* | 4/2010 | Abu-Surra | ........... | H03M 13/118 |
| | | | | 714/752 |
| 2011/0200117 A1* | 8/2011 | Veltman | ........... | H04N 21/23406 |
| | | | | 375/240.25 |
| 2011/0274180 A1* | 11/2011 | Lee | ........................ | H04N 19/30 |
| | | | | 375/240.25 |

OTHER PUBLICATIONS

F. Didier, "Efficient erasure decoding of Reed-Solomon codes", Jan. 2009 <http://arxiv.org/pdf/0901.1886.pdf>.*

M.G. Luby, M. Mitzenmacher, M.A. Shokrollahi, and D.A. Spielma, "Efficient erasure correcting codes", IEEE Transactions on Information Theory, 47(2), Feb. 2001, pp. 569-584.*

Z. Li, A. Khisti and B. Girod, "Correcting erasure bursts with minimum decoding delay," 45th Asilomar Conference on Signals, Systems and Computers (ASILOMAR), IEEE, 2011, pp. 33-39.*

\* cited by examiner

400B

410B — Consider a rectangular grid with d rows, where each column represents one encoded packet of normalized unit size. Each cell in the grid contains one symbol of normalized size $1/d$. The top $d - z$ rows of the grid contain the message (information) symbols, while the bottom $z$ rows contain the parity symbols

420B — Insert the $c(d - z)$ message symbols of message $k$, which is created at time step $(k - 1)c + 1$, into the cells in the top $d$-$z$ rows of columns $(k - 1)c + 1, ..., (k - 1)c + c$. Zero padding or repeated symbols may be used if there are fewer than $c(d - z)$ message symbols

430B — Apply the component systematic block code from Step 460A to each diagonal on the grid, to generate the parity symbols in the bottom $z$ rows

440B — Transmit each column of $d$ symbols as a packet at the corresponding time step

450B — At the receiver, recover the erased message symbols by taking the bit-wise modulo-2 sum of appropriate codeword symbols on each diagonal

FIG. 8B $(c,d) = (3,6), \rho_h = 1/2, \rho_l = 2/3, s_h = 0.9, s_l = 0.4, \underline{M_i}$ denotes part of encoded $M_i$.

FIG. 15

CODING FOR REAL-TIME STREAMING UNDER PACKET ERASURES

CROSS REFERENCE TO RELATED APPLICATIONS

The present application is a continuation of U.S. patent application Ser. No. 14/080,686 filed on Nov. 14, 2013 which, in turn, claims priority to U.S. Provisional Patent Application No. 61/726,131, filed on Nov. 14, 2012, for "Coding Scheme for Real-Time Streaming Communications", all of which are herein incorporated by reference in their entirety.

Throughout the present disclosure reference will be made to the enclosed Annex A1 and Annex A2, both of which make part of the present disclosure.

STATEMENT OF GOVERNMENT GRANT

This invention was made with government support under FA9550-10-1-0166 awarded by the Air Force. The government has certain rights in the invention.

BACKGROUND

Technical Field

The present disclosure relates to methods and algorithms related to the field of coding for real-time streaming systems which is covered in various areas such as information theory, coding theory and communication theory, with applications in computer science and telecommunication. In particular, the present disclosure presents novel code constructions for real-time streaming systems, with strict per message decoding deadlines, that perform optimally under various packet erasure models.

Description of the Prior Art

The systems literature on real-time streaming deals mainly with the transmission of media content (i.e., video and audio) over the internet, with the user-perceived quality of the received stream as the performance metric. In practice, the encoding of the raw media content, packetization of the coded data (possibly with interleaving) for transmission, and application of forward error correction (FEC) codes are usually performed by different components of the system separately (e.g. [11], [12] of Annex A1). FEC codes (e.g. exclusive-or parity, Reed-Solomon as described in [13], [14] of Annex A1 respectively), if used, are typically applied to blocks of packets to generate separate parity or repair packets. Furthermore, the code design is not explicitly optimized with respect to a per-message decoding delay requirement. The patent of Rasmussen et al. (as per [17] of Annex A1) describes a system in which a live stream of data is divided into segments, each of which is encoded into one or more transmission blocks using an FEC code (e.g., [18] of Annex A1, Reed-Solomon); these blocks are optionally subdivided and interleaved in a variety of ways before being transmitted over one or more channels. A similar streaming system is also considered in the patent of Luby et al. (as per [19] of Annex A1), which describes computationally efficient methods for decoding FEC-encoded blocks to achieve low latency.

SUMMARY

The various embodiments according to the present disclosure consider a real-time streaming system where messages created at regular time intervals at a source are encoded for transmission to a receiver over a packet erasure link. According to some embodiments of the present disclosure, the messages created by the source are high and low priority messages according to a periodic pattern. The receiver must subsequently decode each message within a given delay from its creation time while taking into account, if applicable, a corresponding priority of the message. Unlike previous work that aim to minimize the expected message decoding delay, or achieve a decoding failure probability that decays exponentially with delay (e.g. [4]-[6] per Annex A1), the real-time streaming model according to the various embodiments of the present disclosure features hard message decoding deadlines. Novel code construction to comply with such streaming system model is presented in this disclosure, with more detailed information in Annex A1 and Annex A2 which both make part of the present disclosure.

According to a first aspect of the present disclosure, a computer-based method for real-time streaming of a plurality of independent messages over a communication link is presented, the computer-based method comprising the steps: i) providing via a computer, a message size s of the plurality of independent messages, ii) providing via a computer, a message creation interval c based on a number of time steps, wherein the message creation interval defines the time interval between creation times of two consecutive messages; iii) providing via a computer, a packet size, wherein the packet size defines a size of an encoded packet transmitted at each time step; iv) providing via a computer, a link erasure characteristic, wherein the link erasure characteristic defines a communication link over which the encoded packet is transmitted; v) providing via a computer, a fixed decoding delay d in number of time steps, wherein the fixed decoding delay defines a delay with respect to a creation time of a message from the plurality of independent messages within which the message must be decoded, via a computer-based decoder, based on one or more transmitted encoded packets; vi) based on the steps i)-v), generating via a computer an encoding algorithm; vii) based on step vi), generating via a computer a decoding algorithm; viii) creating a computer-based encoder operatively implementing the encoding algorithm in one or more of hardware, firmware and software of the computer-based encoder, and ix) creating a computer-based decoder operatively implementing the decoding algorithm in one or more of hardware, firmware and software of the computer-based decoder, wherein a message of the plurality of independent messages encoded by the computer-based encoder into one or more encoded packets and transmitted over a communication link having the link erasure characteristic is decoded by the computer-based decoder within the fixed decoding delay from a creation time of the message.

According to a second aspect of the present disclosure, a computer-based based real-time streaming system is presented, comprising: a computer-based source module configured to create a message of a plurality of independent messages of uniform size at a creation time and encode the message into a plurality of sub-packets of a plurality of encoded packets, and a computer-based receiver module configured to decode the message of the plurality of independent messages within a fixed time delay from the creation time based on a subset of the plurality of encoded packets, wherein the plurality of encoded packets are transmitted by the computer-based source module over a communication link to the computer-based receiver module; wherein the computer-based receiver module receives the subset of the plurality of encoded packets, and wherein an encoded packet of the plurality of encoded packets is encoded according to a set of parameters comprising: a) a link erasure characteristic of the communication link, b) the fixed time delay, c) the uniform size, d) a desired size of the encoded packet, and e) a time interval between two consecutive creation times.

Further aspects of the disclosure are shown in the specification, which include Annex A1 and Annex A2, drawings and claims of the present application.

BRIEF DESCRIPTION OF THE DRAWINGS

FIG. 4B shows a flowchart of a method for constructing a diagonally interleaved intersession code according to an embodiment of the present disclosure, using the systematic block code constructed according to the method presented in FIG. 4A.

FIG. 6 shows the d symbols of a codeword vector produced by a systematic block code C (e.g. Theorem 4 of Annex A1), for (c, d, z)=(5, 36, 24). For each i∈{1, . . . , d−z}, all the (degenerate) parity symbols below the information symbol a[i] in column i of the table have a value of a[i].

FIG. 7 shows the d symbols of a codeword vector produced by a systematic block code C (e.g. Theorem 5 of Annex A1), for a case (a) wherein (c, d, z)=(5, 48, 12), and a case (b) wherein (c, d, z)=(5, 39, 12). In (a), because r'=z, there are no virtual information symbols. In (b), because r'<z, there are virtual information symbols on the second last row (in parentheses). For each i∈{1, . . . , z}, the value of the parity symbol b[i] is given by the bit-wise modulo-2 sum (e.g. exclusive-or) of the actual and virtual information symbols above it, in column i of the table.

FIGS. 8A-8B shows the d symbols of a codeword vector produced by a systematic block code C (e.g. Theorem 6 of Annex A1), for a case (a) wherein (c, d, z)=(5, 84, 60), and a case (b) wherein (c, d, z)=(5, 57, 42). In (a), because r'=z', there are no virtual information symbols. In (b), because r'<z', there are virtual information symbols on the [(d−z−r')/z'+1]$^{th}$ row (in parentheses). For each i∈{1, . . . , z'}, the value of the non-degenerate parity symbol b[i] is given by the bit-wise modulo-2 sum (e.g. exclusive-or) of the actual and virtual information symbols above it, in column i of the table.

FIG. 15 shows a construction of proportional time-invariant intra-session codes.

DETAILED DESCRIPTION

Figure 1:
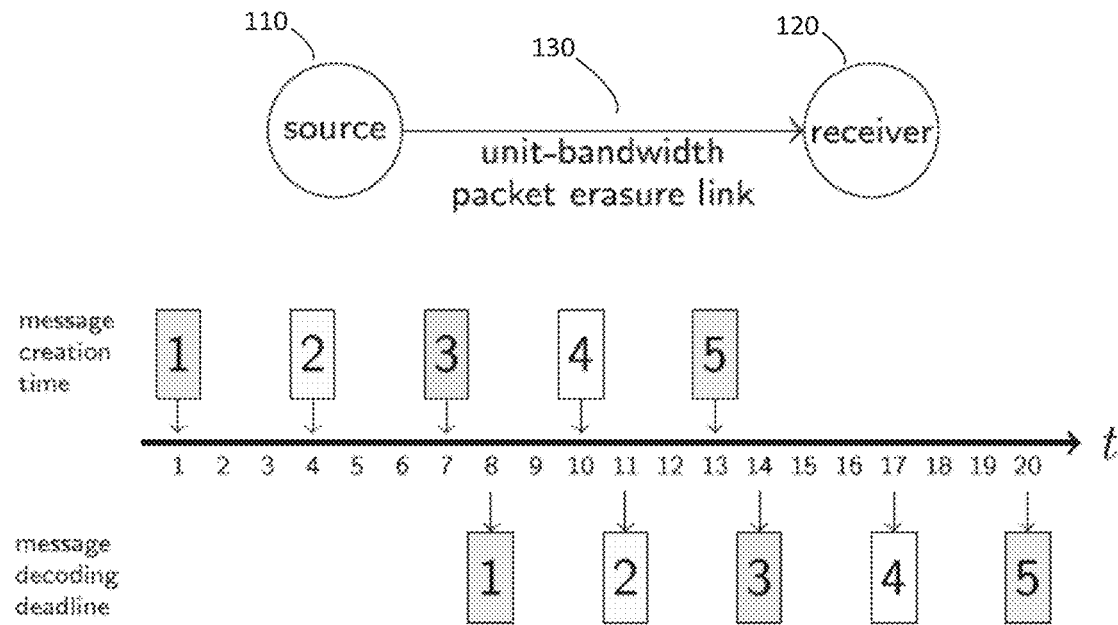
FIG. 1 shows a diagram of a real-time streaming system for (c, d)=(3, 8), with five messages {1, . . . , 5}. Messages are created at regular intervals of c time steps at the source, and must be decoded within a delay of d time steps from their respective creation times at the receiver. At each time step t, the source transmits a single data packet of normalized unit size over the packet erasure link.

FIG. 1 is a graphical representation of a real-time data streaming system comprising a source module (110) and a receiver module (120), with a directed unit-bandwidth packet erasure link (130) from the source module to the receiver module. Independent messages of uniform size s>0 are created at regular intervals of c (e.g. positive integer contained in $\mathbb{Z}^+$) time steps at the source module. At each time step t (e.g. positive integer), the source module transmits a single data packet of normalized unit size (e.g. packet size of 1) over the packet erasure link. Either the entire packet is received (e.g. instantaneously) by the receiver module (120) at a time step t, or the entire packet is erased (e.g. lost) and never received by the receiver module (120). The receiver module (120) must subsequently decode each message within a delay of d (e.g. positive integer) time steps from its creation time. FIG. 1 depicts this real-time streaming system for an instance of (c, d)=(3, 8), with five messages (1, 2, . . . , 5) created at the source module (110) at instances (1, 4, . . . , 13) and with associated decoding deadlines at instances (8, 11, . . . , 20).

Figure 13:
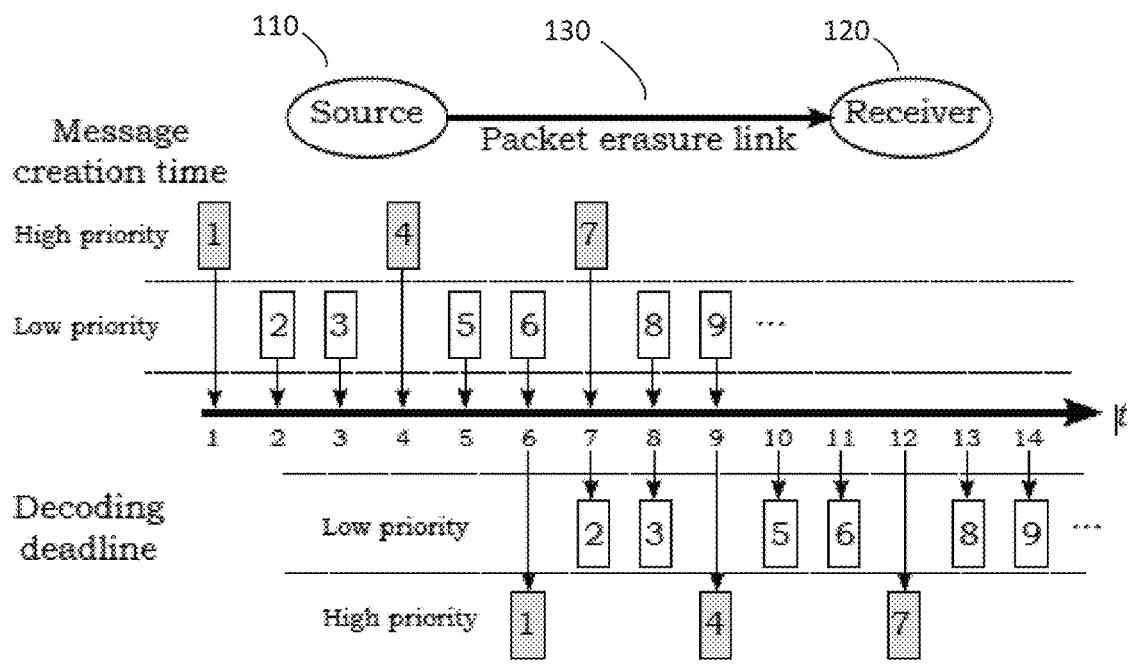
FIG. 13 shows a diagram of a prioritized real-time streaming system for (c, d)=(3, 6). The source creates one high priority message followed by c−1 low priority messages periodically. Each message must be decoded at the receiver within a delay of d time steps from its creation time. At each time step t, a single packet of normalized unit size is allowed to be transmitted over the link.

FIG. 13 shows a graphical representation of a real-time data streaming system where high and low priority messages arrive at the source module (110) according to a periodic pattern, and are transmitted over the packet erasure link (130). In turn, the receiver module (120) must decode the received messages according to their respective priorities and within the delay d. The real-time data streaming system presented in FIG. 13 is a particular case of the system presented in FIG. 1, wherein each message is associated with a high or low priority. Such prioritized encoding is motivated by systems such as MPEG-encoded video, where a Group of Pictures (GOP) consists of different types of frames which differ in importance. Unequal Error Protection (UEP), or Priority Encoding Transmission (e.g. as described in reference [1] of Annex A2) in the case of packet erasures, can be used to provide different levels of redundancy protection to messages of different importance, and has been applied to video coding by various authors, (e.g. as described in references [2]-[6] of Annex A2).

The skilled person readily knows that the various elements (110, 120, 130) depicted in FIG. 1 and FIG. 13, are symbolic of real life communication system components such as computer based workstations and/or processor based hardware (e.g. cell, tablet, etc. . . . ) running certain programs (e.g. executable code in software and/or firmware) and communicating over wired or wireless networks wherein messages are created and sent at a computer based source workstation module and received at a computer based receiver workstation module. In some embodiments messages can be audio/video/data packets of real-time streams as provided, for example, created by an audio/video codec. A data stream can therefore be a sequence of messages, with one message being created by (or arriving at) the source every c milliseconds.

The communication link, noted as the erasure link (130), can be modeled by an error probability density function (e.g. erasure model) describing probability of occurrence of an error pattern (e.g. erasure pattern) over the link such as to affect the communication bandwidth required to support a particular message rate, as measured, for example, by a maximum transmission speed or packet size transmitted per a pre-defined unit of time. Therefore, an erasure pattern can specify a set of erased (e.g. erroneous, lost) packet transmissions over the link and an erasure model describes a distribution of erasure patterns over the link.

According to various embodiments of the present disclosure, novel intra-session and intersession code constructions that allow the various messages to be encoded at the source module (110), transmitted over the erasure link (130) and be correctly decoded at the receiver module (120) within a pre-determined fixed delay (e.g. time window) with respect to the creation time of the message, and while accounting for a priority of a message if applicable, are provided. Such code constructions provides a decoding capability within the required fixed delay over links modeled by various erasure models as further described in Annex A1 and Annex A2, both of which make part of the present disclosure. In particular, such erasure models can comprise window based erasure models, bursty erasure models and independent and identically distributed (i.i.d.) erasure models.

Code construction as provided by the various embodiments of the present disclosure and as further described in Annex A1 and Annex A2 which both make part of the present disclosure, can comprise joint consideration of various parameters, comprising: message size, message priority, message creation interval, packet size, decoding delay and link erasure characteristics.

As used within the present disclosure, Annex A1 and Annex A2 which both make part of the present disclosure, the expression "asymptotically optimal" can refer to a code which achieves a maximum message size in the limit as the number of messages goes to infinity. As further used within the present disclosure, a code is referred to be "asymptotically optimal over all codes" when the code is optimal over all time-invariant and time-varying codes, as well as intra-session and inter-session codes; that is, its optimality is not restricted to a subset or family of codes.

The novel codes presented in the following sections can be categorized as symmetric intra-session codes, which are suited for the window-based, bursty and i.i.d. erasure models, diagonally interleaved (intersession) codes which are suited for the bursty erasure model, and proportional intra-session codes which can be used for prioritized messages sent over window-based and i.i.d. erasure model links. Methods for construction of these novel codes are provided in the following sections, with more detailed information in the Annex A1 for the symmetric intra-session and the diagonally interleaved codes, and in the Annex A2 for the proportional intra-session codes, both Annex A1 and Annex A1 making part of the present disclosure.

Throughout the present disclosure, for the case where the messages have equal priority, the usual definition of a time-invariant code applies in the case of c=1, where every packet is generated by applying a common encoding function to some recent interval of messages. For larger values of the message creation time interval c, the notion of time-invariance can be generalized as follows:

Definition (Time-Invariant Code). A code is time-invariant if there exist causal and deterministic encoding functions $f_1, \ldots, f_c$ and a finite encoder memory size $m_E \in \mathbb{Z}^+$ such that the packet transmitted at each time step (k−1)c+i, where $k \in \mathbb{Z}^+$, $i \in \{1, \ldots, c\}$, is given by the function $f_i$ applied to the $m_E$ most recent messages, such as:

$$X_{(k-1)c+i} = f_i(M_k, M_{k-1}, \ldots, M_{k-m_E+1})$$

wherein $X_{(k-1)c+i}$ is the packet transmitted at time step $(k-1)c+i$, wherein $(M_k, M_{k-1}, \ldots, M_{k-m_E+1})$ are the $m_E$ most recent messages (e.g. see Annex A1 for further information).

For prioritized messages (e.g. messages can have different priorities), a definition of time-invariant codes with finite encoder memory size $m_E$ can be codes in which the decoding statistics for all high-priority messages Mi for which $i \geq m_E$ are the same, and the decoding statistics for all low-priority messages Mi for which $i \geq m_E$ are the same. Such definition is used in the present disclosure as well as in Annex A2 which makes part of the present disclosure.

Construction of Symmetric Intra-Session Codes

In an intra-session code, coding is allowed within a same message but not across different messages. In such a code, a link bandwidth or data packet space at each time step (e.g. t) is allocated among the different messages. Each unit-size packet can be divided into multiple sub-packets or blocks of possibly different sizes, each encoding a different message. An appropriate code (e.g., a maximum distance separable (MDS) code or a random linear code) can subsequently be applied to this allocation so that each message is decodable whenever the total amount of received data that encodes that message, or the total size of the corresponding blocks, is at least the message size s. Reed-Solomon codes are examples of MDS code, whereas a random linear code can be constructed by computing random linear combinations of symbols in a finite filed (e.g. bytes in GF(2^8). The skilled person will require no further explanation of MDS and/or random linear codes.

The blocks that encode a given message k are confined to the packets transmitted in the corresponding coding window $W_k$ (e.g. as defined in Annex A1 and Annex A2). Such blocks cannot be created before the message creation time, and are useless after the message decoding deadline. Thus, to decode each message, the decoder needs to access only the packets received at the most recent d time steps. The decoder memory requirements for intra-session codes are therefore modest compared to an intersession code requiring older packets or previous messages for decoding.

In a time-invariant intra-session code, the encoding functions $f_1, \ldots, f_c$ determine the sizes of the blocks that encode the $m_E$ most recent messages in each interval of c packets or time steps. For each $i \in \{1, \ldots, m_E c\}$, let $x_i \geq 0$ be the size of the block that encodes message $k - q_{i,c}$ at time step $(k-1)c + r_{i,c}$. Therefore, the size of the block that encodes message k at time step $(k-1)c+i$ is $x_i$ if $i \in \{1, \ldots, m_E c\}$, and zero otherwise. Because of the unit packet size constraint (e.g. packet size of I as described in prior sections), the proposed code constructions according to the various embodiments of the present disclosure require that the sum of block sizes at each of the c time steps is at most one, as given by the expression:

$$\sum_{\substack{i \in \{1, \ldots, m_E c\}: \\ r_{i,c} = j}} x_i \leq 1 \quad \forall j \in \{1, \ldots, c\}$$

Wherein $q_{i,c}$ and $r_{i,c}$ are unique integers defined as the offset quotient and the offset remainder of the positive integers i and c, such as:

$$i = q_{i,c} + r_{i,c}, q_{i,c} \in \mathbb{Z}_0^+, r_{i,c} \in \{1, \ldots, b\}$$

wherein $\mathbb{Z}_0^+$ denotes the set of non-negative integers. Note that this definition, as used in the present disclosure which includes Annex A1 and Annex A2, departs from the usual definition of quotient and remainder in that $r_{i,c}$ can be equal to b but not zero.

According to an embodiment of the present disclosure, a family of symmetric intrasession codes, which are time-invariant intra-session codes with a symmetric allocation of packet space, is presented.

For each symmetric code of the family of symmetric intra-session codes, a spreading parameter $m \in \{c, \ldots, d'\}$ is defined, where by definition $d' = \min(d, m_E c)$ (e.g. minimum value of the pair $(d, m_E c)$). According to some embodiments, $d' = d$, since for most real-time streaming systems the decoding deadline constraint is typically stricter than the encoder memory size limit (e.g. $d \leq m_E c$).

For each symmetric code of the family of symmetric intra-session codes, let $W'_k \subseteq W_k$ be the effective coding window for message k, which can be defined as the interval of m time steps beginning at the creation time of message k, such as, $$W'_k \triangleq \{((k-1)c+1, \ldots, (k-1)c+m\}$$

For each symmetric code, let $A_t$ be the set of active messages at time step t, which are defined as the messages whose effective coding windows contain time step t, i.e., $$A_t \triangleq \{k \in \mathbb{Z} : t \in W'_k\}$$

Note that non-positive messages are included as dummy messages.

Figure 2:
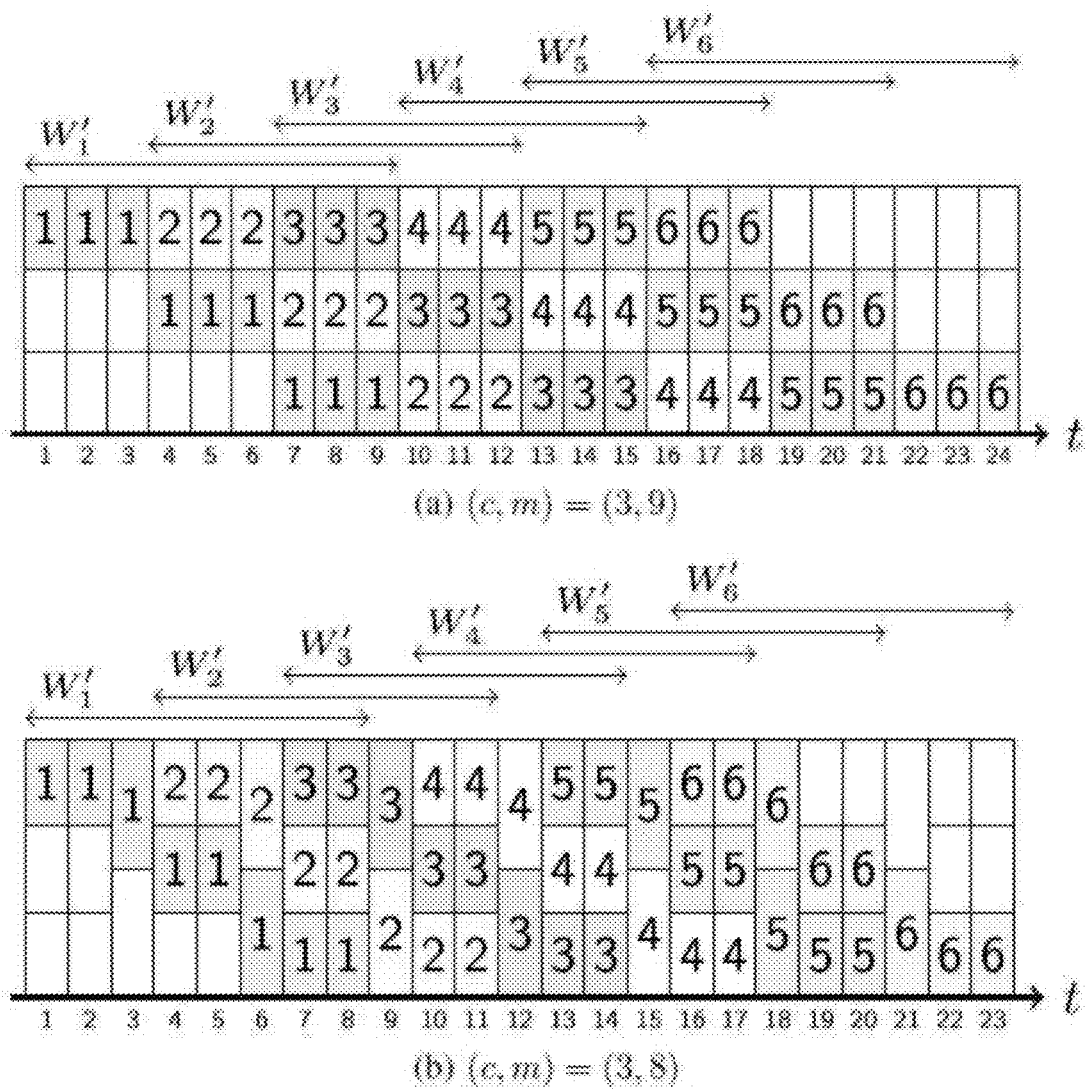
FIG. 2 shows an allocation of the unit packet space at each time step t among messages {1, . . . , 6} in the case of a symmetric intra-session code with spreading parameter m, for two cases (a) and (b), wherein for case (a), (c, m)=(3, 9) and for case (b), (c, m)=(3,8), c being a message creation time. The number on each block indicates the message encoded by the block. In (a), because m is a multiple of c, we have $q_{m,c}+1=3$ active messages at each time step. In (b), because m is not a multiple of c, we have $q_{m,c}=2$ or $q_{m,c}+1=3$ active messages at each time step.

According to an embodiment of the present disclosure, for each symmetric code of the family of symmetric intra-session codes, the unit packet space at each time step is divided evenly among the active messages at that time step. Thus, the number of blocks allocated to each message $k \in \mathbb{Z}^+$ is given by the spreading parameter m, and the size of the block that encodes each active message $k \in A_t$ at each time step $t \in \mathbb{Z}^+$ is given by $1/|A_t|$. FIG. 2 illustrates this allocation of the unit packet space at each time step, with diagram (a) of FIG. 2 for instance of $(c,m)=(3,9)$, and diagram (b) of FIG. 2 for instance of $(c,m)=(3,8)$ respectively. As seen in diagram (a) of FIG. 2, each unit packet space at each time step (1, 2, 3, ..., 6) is divided by three (e.g. three active messages at all time steps), whereas in the case of diagram (b) of FIG. 2, each third unit packet space is divided by two (e.g. two active messages) while the other packet spaces are divided by three (e.g. three active packet spaces). In the diagrams of FIG. 2, the number on each block (1, 2, 3, ..., 6) indicates the message encoded by the block. In diagram (a), because m is a multiple of c, then $q_{m,c}+1=3$ active messages at each time step exist. In (b), because m is not a multiple of c, then either $q_{m,c}=2$ or $q_{m,c}+1=3$ active messages at each time step exist.

In the case of the symmetric code, the number of active messages at each time step (e.g. $t \in \mathbb{Z}^+$), for a given choice of (c, m), can be explicitly provided, as demonstrated in Annex A1 which makes part of the present disclosure. As described in Annex A1, there are two distinct cases which dictate differing number of active messages for a time step, as defined by the offset quotient and the offset remainder (as previously defined) of integer parameter sets (t, c) and (m, c):

Case $a_1$: If $r_{t,c} \leq r_{m,c}$, then there are $q_{m,c}+1$ active messages at time step t, each of which is allocated a block of size $1/(q_{m,c}+1)$.

Case $a_2$: If $r_{t,c} > r_{m,c}$, then there are $q_{m,c}$ active messages at time step t, each of which is allocated a block of size $1/q_{m,c}$.

As noted in Annex A1, which makes part of the present disclosure, when m is a multiple of c, then for any time step t, $r_{t,c} \leq r_{m,c} = c$, which implies that there are $q_{m,c}+1$ active messages at every time step, and therefore all blocks are of size $1/(q_{m,c}+1) = c/m$. This is showcased in diagram (a) of FIG. 2, wherein the number of active messages per time step is 9/3=3.

As a consequence of the number of active messages, message k is allocated either a small block of size $1/(q_{m,c}+1)$ or a big block of size $1/q_{m,c}$ at each time step $t \in W'_k$. No blocks are allocated to message k at all other time steps $t \notin W'_k$. Writing each time step $t \in W'_k$ as $$t = (k-1)c + i = (k-1+q_{i,c})c + r_{i,c},$$

where $i \in \{1, \ldots, m\}$, one can observe that the size of the block that encodes message k at time step (k−1)c+i, which has been defined as $x_i$, depends on the value of $r_{i,c}$. As demonstrated in Annex A1, which makes part of the present disclosure, two cases are possible:

Case $b_1$: If $r_{i,c} \leq r_{m,c}$, then $x_i = 1/(q_{m,c}+1)$. Since $i \in \{1, \ldots, m\}$, this condition corresponds to the case where $q_{i,c} \in \{0, \ldots, q_{m,c}\}$ and $r_{i,c} \in \{1, \ldots, r_{m,c}\}$. Therefore, message k is allocated a small block size $1/(q_{m,c}+1)$ per time step for a total of $(q_{m,c}+1) r_{m,c}$ time steps in the effective coding window W'k.

Case $b_2$: If $r_{i,c} > r_{m,c}$, then $x_i = 1/q_{m,c}$. Since $i \in \{1, \ldots, m\}$, this condition corresponds to the case where $q_{i,c} \in \{0, \ldots, q_{m,c}-1\}$ and $r_{i,c} \in \{r_{m,c}+1, \ldots, c\}$. Therefore, message k is allocated a big block size $1/q_{m,c}$ per time step for a total of $q_{m,c}(c-r_{m,c})$ time steps in the effective coding window W'k.

Other characteristics of the proposed novel family of symmetric time-invariant intra-session codes are provided in the Annex A1 which makes part of the present disclosure.

Figure 3:
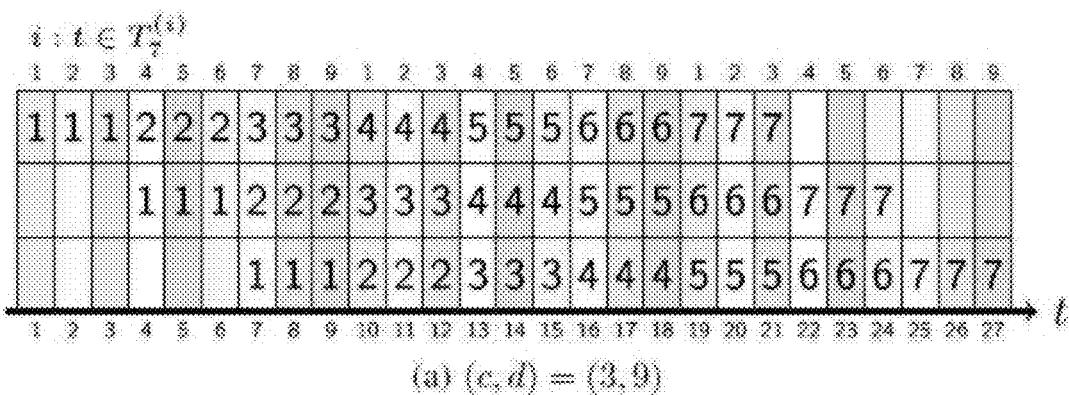
FIG. 3 shows a partitioning of the set of time steps $T_n$ into d sets $T_n^{(1)}, \ldots, T_n^{(d)}$, and the allocation of the unit packet space at each time step t among messages {1, . . . , 7}, for the case of the symmetric intra-session code with spreading parameter m=d, for a case (a) wherein (c, d)=(3, 9), and a case (b) wherein (c, d)=(3,8). The number i at the top of each time step t indicates the set $T_n^{(i)}$ to which t belongs.
Figure 3:
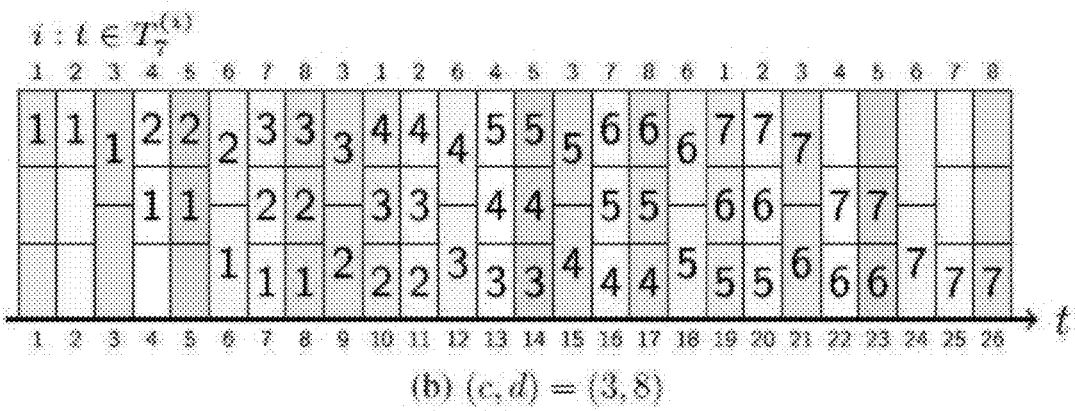
Figure 3A:
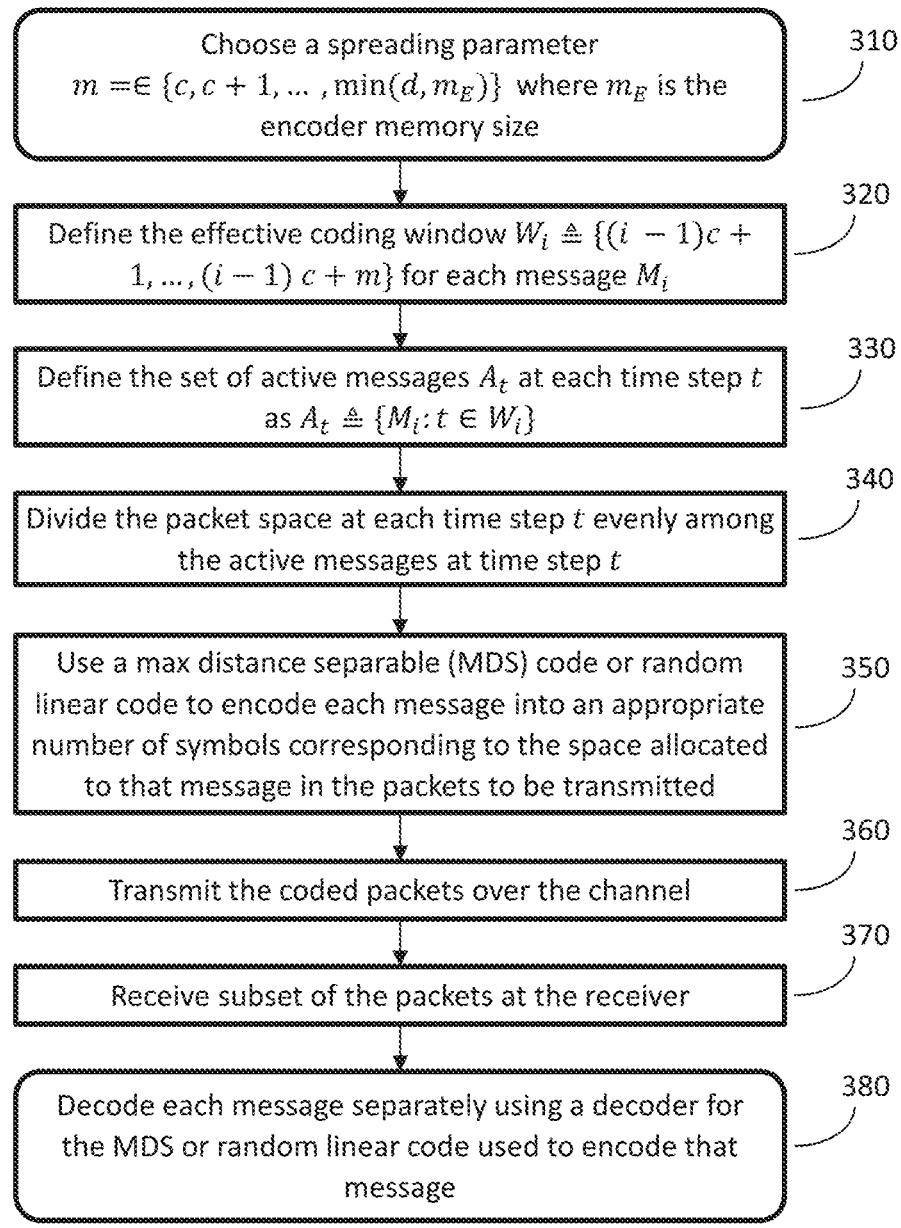
FIG. 3A shows a flowchart of a method for constructing a symmetric time-invariant intra-session code according to an embodiment of the present disclosure.

A method for construction of the symmetric time-invariant intra-session codes, as provided in the various embodiments of the present disclosure and presented in the preceding paragraphs as well as in Annex A1 which makes part of the present disclosure, can be summarized by a construction flowchart (300A) as depicted in FIG. 3A. The code as defined by the construction method presented in flowchart (300A) is designed to provide a solution to the discrete-time data streaming system presented in FIG. 1 for various packet erasure links, as described in Annex A1 which makes part of the present disclosure. As such, it is assumed that parameters (c, d) representing the message creation interval (e.g. source generates messages every c time steps) and the decoding delay respectively are provided.

Given the parameters (c, d) and as presented in the method described by flowchart (300A) of FIG. 3A, a symmetric time-invariant intra-session code which is a solution to the discrete-time data streaming system, comprising a communication channel defined by an erasure link model, presented in FIG. 1 can be constructed by:

Step 310: Choose a spreading parameter $m = \in \{c, c+1, \ldots, \min(d, m_E)\}$ where $m_E$ is the encoder memory size ($m_E$ being the number of most recent messages available to the encoder at any given time)

Step 320: Define the effective coding window $W_i \triangleq \{(i-1)c+1, \ldots, (i-1)c+m\}$ for each message $M_i$ Step 330: Define the set of active messages $A_t$ at each time step t as $A_t \triangleq \{M_i : t \in W_i\}$ Step 340: Divide the packet space at each time step t evenly among the active messages at time step t Step 350: Use a max distance separable (MDS) code or random linear code to encode each message into an appropriate number of symbols corresponding to the space allocated to that message in the packets to be transmitted Step 360: Transmit the coded packets over the channel Step 370: Receive a subset of the packets at the receiver.

Step 380: Decode each message separately using a decoder for the MDS or random linear code used to encode that message.

Construction of Diagonally Interleaved Codes

Consider a systematic block code C that encodes a given vector a of d−α information symbols, such as a=(a[1], ..., a[d−α]), as a codeword vector of d symbols (a[1], ..., a[d−α], b[1], ..., b[α]), where each symbol has a normalized size of 1/d.

For each $i \in \{1, \ldots, \alpha\}$, we define an encoding function $g_i$ so that a parity symbol b[i] of the codeword vector is given by $b[i] = g_i(a)$.

According to an embodiment of the present disclosure, for a given choice of (c, d, a), a time-invariant diagonally interleaved code for a message size of $s = (d-\alpha)/d)c$ is provided by interleaving codeword symbols produced by the component systematic block code C in a diagonal pattern and as described in the following two steps with further explanation in the Annex A1 which makes part of the present disclosure.

Figure 4:
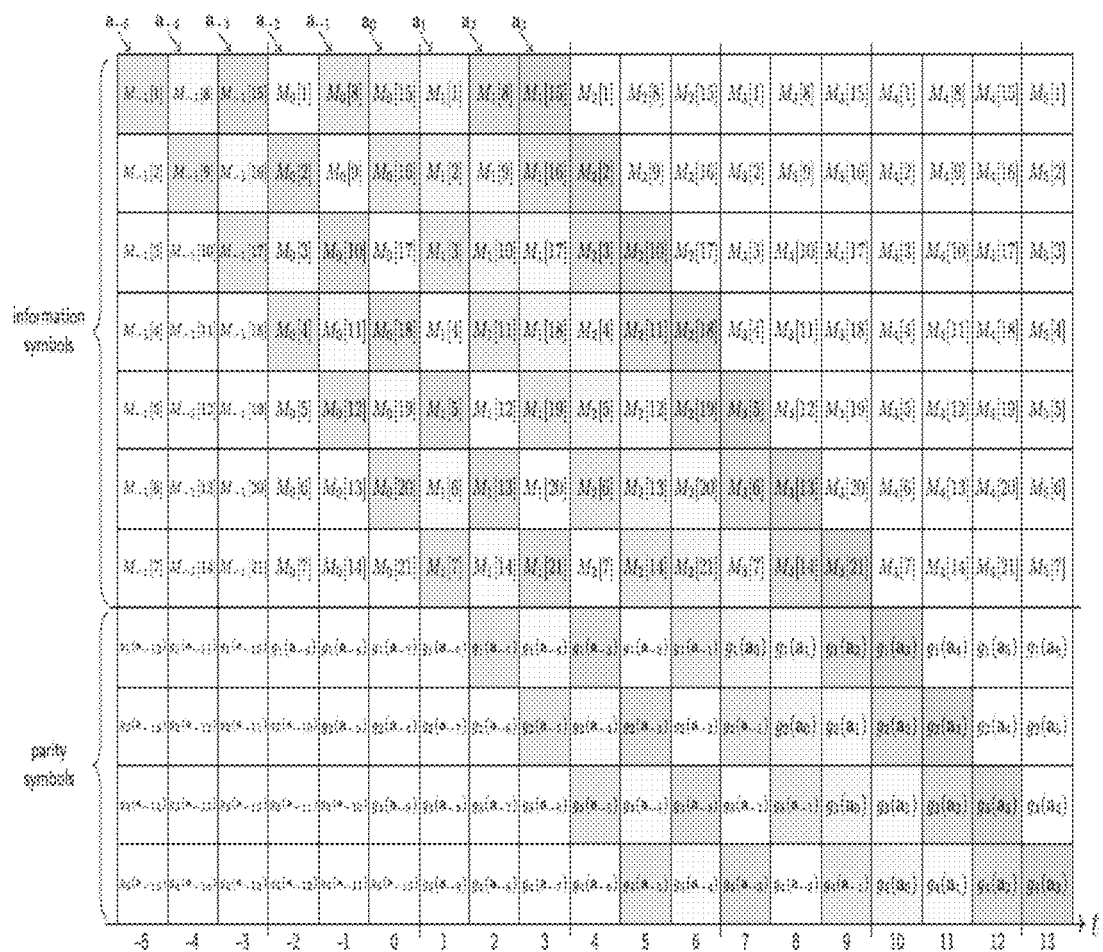
FIG. 4 shows construction of a diagonally interleaved intersession code, for (c, d, α)=(3, 11, 4). Rows {1, . . . , d−α} of the table are populated by information symbols, while row {d−α+1, . . . , d} are populated by parity symbols. The d symbols on each diagonal spanning across d consecutive time steps constitute one codeword produced by a component systematic block code C.

In a first step, and according to an embodiment of the present disclosure, to facilitate code construction, the derived code can be represented by a table of symbols, with each cell in the table assigned one symbol of size 1/d. The table presented in FIG. 4 illustrates code construction of the novel diagonally interleaved code for an instance of (c, d, a)=(3, 11, 4). Rows $\{1 \ldots, d-\alpha\}$ of the table are populated by information symbols, while rows $\{d-\alpha+1, \ldots, d\}$ are populated by parity symbols. The d symbols on each diagonal spanning across d consecutive time steps constitute one codeword produced by the component systematic block code C. Let $x_t[i]$ denote the symbol in column $t \in \mathbb{Z}$ and row $i \in \{1, \ldots, d\}$. The unit-size packet transmitted at each time step t is composed of the d symbols $x_t[1], \ldots, x_t[d]$ in column t of the table. Rows $\{1, \ldots, d-\alpha\}$ of the table are populated by information symbols, while rows $\{d-\alpha+1, \ldots, d\}$ are populated by parity symbols.

In a second step, and according to an embodiment of the present disclosure, each message k can be divided into (d−α)c sub-messages or information symbols denoted by $M_k[1], \ldots, M_k[(d-\alpha)c]$, with each symbol having a size of $s/[(d-\alpha)c] = 1/d$. The information symbols corresponding to each message k are assigned evenly to the columns representing the first c time steps in coding window $W_k$, such that $$x_t[i] = M_{q_{t,c}+1}[(r_{t,c}-1)(d-\alpha)+i]$$

for each $i \in \{1, \ldots, d-\alpha\}$. To obtain the parity symbols for column t, the component systematic block code C is applied to the information symbols on each diagonal, such that $$x_t[d-\alpha+i] = g_i((x_{t-i-(d-\alpha)+l}[l])_{l=1}^{d-\alpha})$$

for each $i \in \{1, \ldots, \alpha\}$. Thus, the d symbols on each diagonal spanning across d consecutive time steps in the derived code constitute one codeword produced by C. Note that the information symbols for nonexistent messages (i.e., non-positive messages and messages after the actual final message) are assumed to be zeros so that all codeword symbols are well defined.

Three component systematic block codes (e.g. systematic block code C) are specified by Theorems 4, 5 and 6 in Section V-B of Annex A1 (which makes part in its entirety of the present disclosure) which describes a bursty erasure model. In the mentioned section, it is shown that diagonally interleaved codes using such component systematic block codes are asymptotically optimal under specific conditions (e.g. erasure burst lengths). A general construction that unifies these three block codes is summarized by the following steps, for a given choice of (c, d, α):

1) The component systematic block code C comprises d symbols. The first d−α symbols are information symbols, while the last α symbols are parity symbols which can be non-degenerate or degenerate
2) Select the degenerate parity symbols by grouping the α parity symbols into disjoint intervals of d−α symbols (if available), counting from the end of the block code. Degenerate parity symbols being uncoded copies of the information symbols, arranged in the same order, and non-degenerate parity symbols being parity symbols calculated from the information symbols
3) Set the remaining parity symbols as the non-degenerate parity symbols. Let α' be the number of non-degenerate parity symbols, where 0≤α'<d−α
4) Arrange the information symbols into rows of α' symbols, counting from the beginning of the block code. If there are fewer than α' symbols in the last row, then repeat them as many times as necessary until the row is filled
5) Arrange the α' non-degenerate parity symbols below the last row of information symbols. Set each non-degenerate parity symbol to be the bit-wise modulo-2 sum of the information symbols above it
6) The component systematic block code C is given by the d−α information symbols, followed by the α' non-degenerate parity symbols (if any), followed by the α−α' degenerate parity symbols (if any)

Figure 4A:
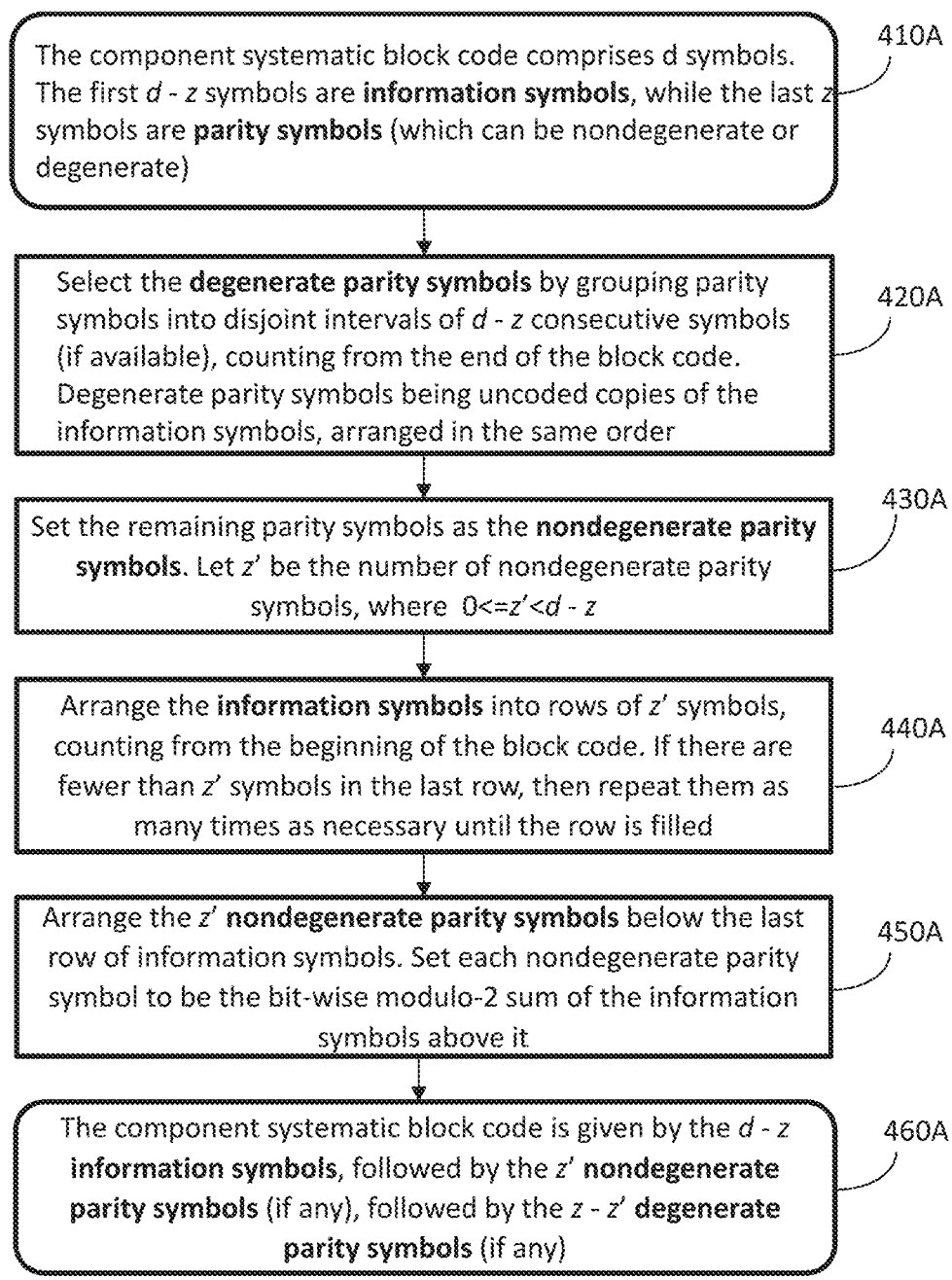
FIG. 4A shows a flowchart of a method according to an embodiment of the present disclosure for constructing a systematic block code to be used as a component block code for a diagonally interleaved intersession code.

A method for construction of the diagonally interleaved intersession codes, as provided in the various embodiments of the present disclosure and presented in the preceding paragraphs (e.g. first/second step) as well as in Annex A1 which makes part of the present disclosure, can be summarized by a construction flowchart set, comprising flowchart (400A) as depicted in FIG. 4A which describes a first step of the method within which the systematic block code C is derived, and flowchart (400B) as depicted in FIG. 4B which describes a second step of the method within which the diagonally interleaved code is constructed based on the systematic block code of the first step. The code as defined by the flowcharts (400A) and (400B) is designed to provide a solution to the discrete-time data streaming system presented in FIG. 1 for a bursty packet erasure links with particular burst erasure parameters, as described in Annex A1 which makes part of the present disclosure. As such, it is assumed that parameters (c, d, z), representing the message creation interval (e.g. source generates messages every c time steps), the decoding delay d, and the maximum erasure burst length z, are provided. It should be noted that the systematic block code derived in the following Step 1 is a particular case of construction of the systematic block code presented in above steps 1)-6), wherein the parameter a is selected to be equal to the maximum burst length z of a corresponding bursty erasure link model.

Given the parameters (c, t: z) and as presented in the method described by flowcharts (400A) and (400B) of FIGS. 4A-4B, a diagonally interleaved intersession code which is a solution to the discrete-time data streaming system, comprising a communication channel defined by a bursty erasure link model of maximum burst length z, presented in FIG. 1, can be constructed by the following two steps:

STEP 1: (Steps 410A-460A) Construction of the Component Systematic Block Code C Step 410A: The component systematic block code C comprises d symbols. The first d−z symbols are information symbols, while the last z symbols are parity symbols which can be non-degenerate or degenerate Step 420A: Select the degenerate parity symbols by grouping parity symbols into disjoint intervals of d−z symbols (if available), counting from the end of the block code. Degenerate parity symbols being uncoded copies of the information symbols, arranged in the same order Step 430A: Set the remaining parity symbols as the non-degenerate parity symbols. Let z' be the number of non-degenerate parity symbols, where 0≤z'<d−z Step 440A: Arrange the information symbols into rows of z' symbols, counting from the beginning of the block code. If there are fewer than z' symbols in the last row, then repeat them as many times as necessary until the row is filled Step 450A: Arrange the z' non-degenerate parity symbols below the last row of information symbols. Set each non-degenerate parity symbol to be the bit-wise modulo-2 sum of the information symbols above it Step 460A: The component systematic block code is given by the d−z information symbols, followed by the z' non-degenerate parity symbols (if any), followed by the z−z' degenerate parity symbols (if any)

STEP 2: (Steps 410B-450B) Construction of the Diagonally Interleaved Code

Step 410B: Consider a rectangular grid with d rows, where each column represents one encoded packet of normalized unit size. Each cell in the grid contains one symbol of normalized size 1/d. The top d−z rows of the grid contain the message (information) symbols, while the bottom z rows contain the parity symbols Step 420B: Insert the c(d−z) message symbols of message k, which is created at time step (k−1)c+1, into the cells in the top d−z rows of columns (k−1)c+1, . . . , (k−1)c+c. Zero padding or repeated symbols may be used if there are fewer than c(d−z) message symbols Step 430B: Apply the component systematic block code from Step 1 to each diagonal on the grid, to generate the parity symbols in the bottom z rows Step 440B: Transmit each column of d symbols as a packet at the corresponding time step Step 450B: At the receiver, recover the erased message symbols by taking the bit-wise modulo-2 sum of appropriate codeword symbols on each diagonal.

Construction of Proportional Intra-Session Codes

FIG. 13 shows a diagram of a discrete-time data streaming system comprising a directed unit-bandwidth packet erasure link (130) from a source (110) to a receiver (120). At each time step i∈ℤ⁺, the data source generates a message, represented by random variable $M_i$. If i≡1(mod c), the message $M_i$ is a high priority message with size $s_h$, otherwise, $M_i$ is a low priority message with size $s_l$. That is:

$$s_i = H(M_i) = \begin{cases} s_h & i \equiv 1(\text{mod } c), \\ s_l & \text{otherwise} \end{cases}$$

The random variables $\{M_i\}$ are independent. All high-priority messages are identically distributed, and all low priority messages are identically distributed. Furthermore, $M_i=0$ for $i\leq0$.

Each message $M_i$ must be decoded no later than a delay of d time steps from its creation time. For example, a message $M_i$ created at time step i, is to be decoded by time step i+d−1. In practice, delay can be a multiple of the length of a data set (such as GOP in MPEG), thus d≡0(mod c). Let $W_i$ be the coding window for message $M_i$ which can be defined as the interval of d time steps between its creation time and decoding deadline, such as:

$$W_i \triangleq \{i, \ldots, i+d-1\}$$

Since a message is available for coding only after its creation time and is not useful after its decoding deadline, for any message $M_i$ the associated coding window $W_i$ can be represented by: $W_i=\{i, \ldots, jd, jd+1, \ldots, i+d-1: j=[i/d]+1\}$. According to an embodiment of the present disclosure and as further described in Appendix A2 which makes part of the present disclosure, the priority of a message $M_i$ can be defined by specifying the number of erasures $z_i$ it is required to tolerate, for example, it can be required that $M_i$ is recovered by its deadline under any erasure pattern in which the number of erased packets in the coding window $W_i$ is less than or equal to $z_i$. For notational convenience, a corresponding fraction of received packets can be defined by:

$$\rho_i = \frac{d-z_i}{d}$$

In the particular prioritized real-time system depicted in FIG. 13, there are two kinds of messages, high priority and low priority messages. The high-priority messages have erasure tolerance $z_h$ and the low priority messages have erasure tolerance $z_l \leq z_h \leq d$. Thus, based on the aforementioned notation, we have:

$$\rho_h = \frac{d-z_h}{d},$$
$$\rho_l = \frac{d-z_l}{d},$$

where $\rho_l \geq \rho_h$. From the pattern of high and low priority messages, we have $$\rho_i = \begin{cases} \rho_h = \frac{d-z_h}{d} & i \equiv 1 (\mod c), \\ \rho_l = \frac{d-z_l}{d} & \text{otherwise} \end{cases}$$

As previously mentioned and further described in Annex A2 which makes part of the present disclosure, in an intra-session code, coding is allowed within a same message but not across different messages. In such a code, a link bandwidth or data packet space at each time step (e.g. t) is allocated among the different messages. Each unit-size packet can be divided into multiple sub-packets or blocks of possibly different sizes, each encoding a different message. An appropriate code (e.g., a maximum distance separable (MDS) code or a random linear code) can subsequently be applied to this allocation so that each message is decodable whenever the total amount of received data that encodes that message, or the total size of the corresponding blocks, is at least the message size s.

The blocks that encode a given message $M_i$ are confined to the packets transmitted in the corresponding coding window $W_i$ (e.g. as previously defined). Such blocks cannot be created before the message creation time, and are useless after the message decoding deadline. Thus, to decode each message, the decoder needs to access only the packets received at the most recent d time steps. The decoder memory requirements for intra-session codes are therefore modest compared to an intersession code requiring older packets or previous messages for decoding.

As illustrated in FIG. 15 and further explained in Appendix A2 which makes part of the present disclosure, we consider the family of proportional time-invariant intra-session codes (PTIC) whose construction is described as follows:

Let $A_i$ be the set of active messages at time step i, defined as messages whose effective coding windows contain the time step i, such as:

$$A_i \triangleq \{M_j : j \in W_i\}$$
$$= \{M_j : j \leq i \leq j + d - 1\}$$
$$= \{M_j : i - d + 1 \leq j \leq i\}$$
$$= \{M_{i-d+1}, \ldots, M_i\}$$

Messages with non-positive time indexes correspond to dummy messages. The unit packet space at each time step is divided among the active messages at that time step.

The size of the block allocated to each active message $M_j \in A_i$ at each time step $i \in \mathbb{Z}^+$ is determined by the priorities of the active messages.

Let $M_i[t]$ denote the size of block for message $M_i$ at time step t. The size of the block allocated to each active message $M_i$ is in inverse proportion to its priority, such as:

$$M_i[t] = \begin{cases} \frac{cs_h \rho_l}{d(s_h \rho_l + (c-1)s_l \rho_h)} & i \equiv 1 (\mod c) \\ \frac{cs_l \rho_h}{d(s_h \rho_l + (c-1)s_l \rho_h)} & \text{otherwise} \end{cases}$$

As demonstrated in Theorem 2 of Annex A2, which makes part of the present disclosure, the PTIC code constructed as per above steps can achieve the upper bound of the maximum achievable message size as derived in Corollary 1 of Annex A2. This is equivalent to say that such a code is asymptotically optimal.

Other characteristics of the proposed novel family of proportional time-invariant intra-session codes are provided in the Annex A2 which makes part of the present disclosure.

Figure 15A:
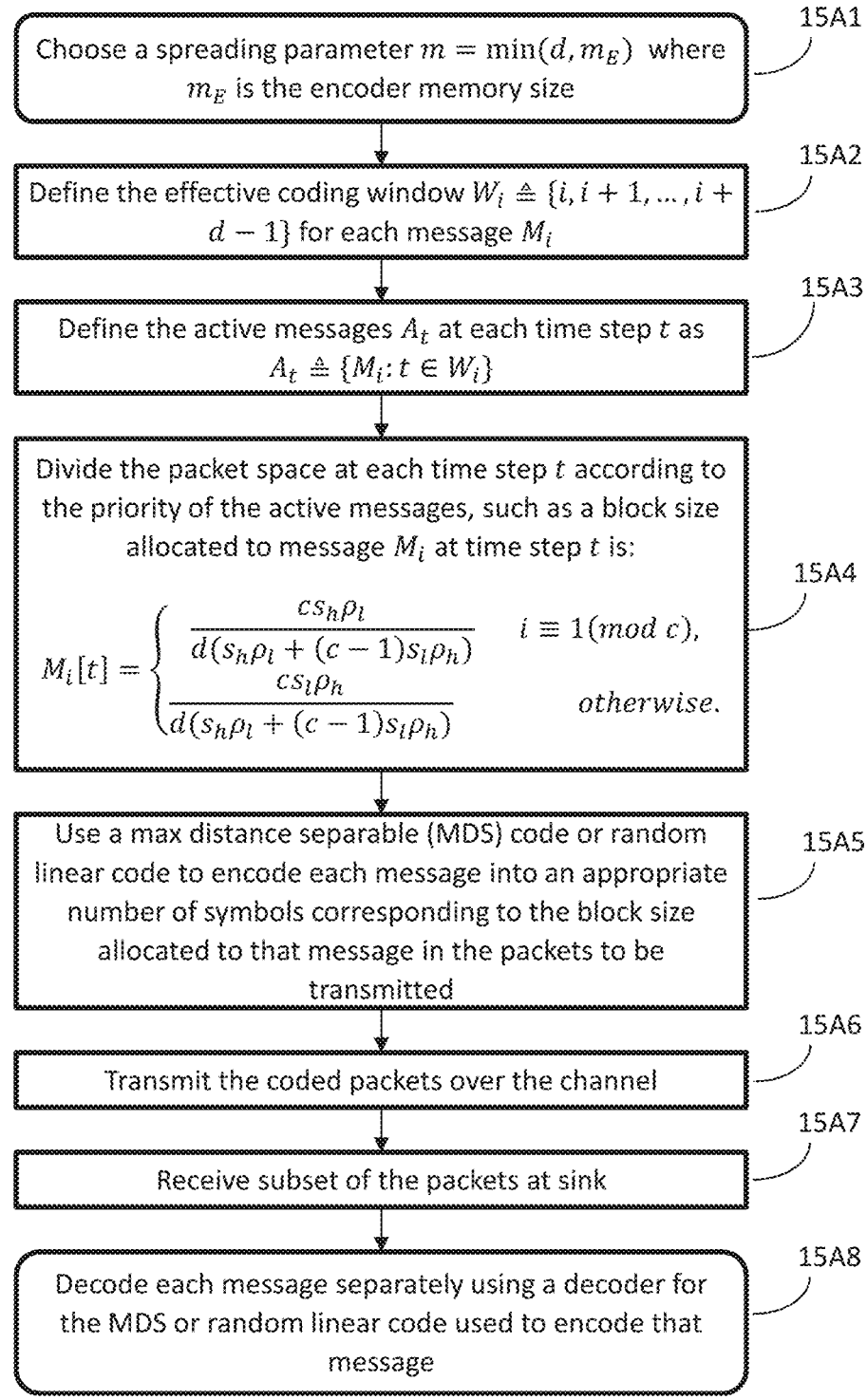
FIG. 15A shows a flowchart of a method for constructing a proportional time-invariant intra-session code according to an embodiment of the present disclosure.

A method for the construction of the proportional time-invariant intra-session codes, as provided in the various embodiments of the present disclosure and presented in the preceding paragraphs as well as in Annex A2 which makes part of the present disclosure, can be summarized by a construction flowchart (15A0) as depicted in FIG. 15A. The code as defined by the construction method described in flowchart (15A0) is designed to provide a solution to the discrete-time data streaming system whose diagram is presented in FIG. 13 for various packet erasure models (e.g. window-based and i.i.d.), as described in Annex A2 which makes part of the present disclosure. As such, it is assumed that the following parameters are provided:
i. Message period c. such as source generates a high priority message every c time steps and a low priority message at each other time step.
ii. Decoding delay d.
iii. Parameters $\rho_h$ and $\rho_l$ specifying decoding requirements for high and low priority messages respectively.
iv. Size $s_h$ for high priority message and $s_l$ for low priority message, where:

$$s_h \rho_l + (c-1) s_l \rho_h \leq c \rho_h \rho_l$$

Given the parameters defined in i)-iv) above and as presented in the construction method of flowchart (15A0) of FIG. 15A, a proportional time-invariant intra-session code which is a solution to the discrete-time data streaming system, comprising a communication channel defined by an erasure link model over which messages of high and low priority are transmitted and must be decoded within a fixed time delay, presented in FIG. 13 can be constructed by:

Step 15A1: Choose a spreading parameter m=min (d, $m_E$)=d where $m_E$ is the encoder memory size (in practice $m_E$ is larger than d)

Step 15A2: Define the effective coding window $W_i \triangleq \{i, i+1, \ldots, i+d-1\}$ for each message $M_i$ Step 15A3: Define the active messages $A_t$ at each time step t as $A_t \triangleq \{M_i : t \in W_i\}$ Step 15A4: Divide the packet space at each time step t according to the priority of the active messages, such as a block size allocated to message $M_i$ at time step t is:

$$M_i[t] = \begin{cases} \dfrac{c s_h \rho_l}{d(s_h \rho_l + (c-1) s_l \rho_h)} & i \equiv 1 \pmod{c}, \\ \dfrac{c s_l \rho_h}{d(s_h \rho_l + (c-1) s_l \rho_h)} & \text{otherwise} \end{cases}$$

Step 15A5: Use a max distance separable (MDS) code or random linear code to encode each message into an appropriate number of symbols corresponding to the block size allocated to that message in the packets to be transmitted Step 15A6: Transmit the coded packets over the channel Step 15A7: Receive subset of the packets at sink Step 15A8: Decode each message separately using a decoder for the MDS or random linear code used to encode that message.

The person skilled in the art of information theory, communication theory and/or coding theory will know how to apply the mentioned techniques and computations presented above and in Annex A1 and Annex A2 which make part of the present disclosure, including generation of the various information/parity symbols, data packets and blocks, as well as encoding/decoding based on maximum distance separable (MDS) or random linear codes (e.g. Reed Solomon codes), to the disclosed methods (e.g. flowcharts). The skilled person may also find different sequences of applying the various code construction steps represented in flowcharts (300A, 400A/B, and 15A0), whether serially, in parallel and/or combination thereof, to obtain a similar result, and implement those using various hardware, software, firmware and/or combination thereof.

As further described in the Annex A1 and Annex A2, the various novel time-invariant codes as presented in the previous sections are asymptotically optimal under various erasure models, but can be used under other erasure models as well, albeit not necessarily asymptotically optimal.

For example, for window-based erasure models containing a limited number of erasures per coding window, per sliding window, and containing erasure bursts whose maximum length is sufficiently short or long and separated by intervals of at least a specified length, the novel time-invariant intra-session code presented in prior sections, namely the symmetric intra-session code, asymptotically achieves a maximum message size (e.g. bandwidth) among all codes that allow decoding under all admissible erasure patterns. Such novel symmetric intra-session code performs well under other erasure models as well. For example, in the case of an i.i.d. erasure model in which each transmitted packet is erased independently with the same probability, as further described in Annex A1, an upper bound on the decoding probability for any time-invariant code is provided, and it is shown that the gap between this bound and the performance of the proposed family of novel time-invariant intra-session codes as presented in the various embodiments of the present disclosure is small when the message size and packet erasure probability are small. In a simulation study as further described in Annex A1 which makes part of the present disclosure, these time-invariant intra-session codes performed well against a family of random time-invariant convolutional codes under a number of scenarios.

As further described in Annex A1, which makes part of the present disclosure in its entirety, for a bursty erasure model, the novel time-invariant diagonally interleaved code derived from a specific component systematic block code and designed for particular burst erasure parameters, is asymptotically optimal over all codes. Construction of this novel code is provided in the prior sections of the present disclosure.

According to yet another embodiment of the present disclosure and as further described in Annex A2 which makes part of the present disclosure, for the case of the window-based erasure model wherein the messages have a high or low priority, the novel time-invariant intra-session code presented in the prior sections of the present disclosure (and in Annex A2 which makes part of the present disclosure)), namely the proportional time-invariant intra-session code, asymptotically achieves a maximum message size (e.g. bandwidth) among all codes that allow decoding under all admissible erasure patterns. As previously mentioned, such code can also be used under other erasure models, such as for example the i.i.d. erasure model, although not necessarily optimal.

With reference back to the real-time streaming systems presented in FIG. 1 and FIG. 13, a message creation process may comprise gathering various message data from a same or different information streams at the source module (110). Each message {1, 2, ..., 5} can be part of a same or a different data stream, audio stream, video stream or any other stream containing information which one may want to encode and transmit over an erasure prone link (130) (e.g. as described by an associated erasure model) and decode at a receiver module (120) within a fixed delay of its creation time, and according to a high/low priority if necessary. The skilled person readily knows that the time units as depicted in FIG. 1 and FIG. 13 may be associated to a sequence of received data packets at the receiver module, such as for example, a three-unit delay can be construed as a time it takes to receive three data packets at the receiver module (120). Alternatively, each received packet can have embedded time stamp information to be used by the decoding process to synchronize decoding with the source creation time. Each information stream containing the various data messages to be encoded can be based on real time data being captured by some sort of transducer (e.g. camera, microphone, seismic accelerometer, etc. . . . ) or data files being read from a memory location based on any storage medium known to the skilled person (e.g. hard disk, optical disc, magneto-optical disc, tape, cloud, RAID, RAM, ROM, etc.) using any file system known to the skilled person (DOS, FAT, NTFS, HFS, UDF, ISO 9660, etc. . . . ) or even a proprietary file format. The source (110) and receiver (120) modules communicate via the communication channel (130) which can be a wired link, a wireless link or a combination wired/wireless link. Some examples of wired links can comprise any connection using copper wires or fiber optic, such as USB, Ethernet, RS-232, ATAPI, SATA, SPDIF, HDMI, proprietary, etc. . . . . Some examples of wireless links can comprise optical links, acoustic links and RF frequency links wherein transducers (e.g. photo-detector, microphone, antenna) adapted to the links are used to translate a signal to an electrical signal suitable for further processing by the receiver module.

Furthermore, each of the source module and/or receive module of FIG. 1 and FIG. 13 may be a computer processor with the appropriate interface to the source information stream(s) (e.g. source module) and to the packet erasure link. Such processor may be implemented using any target hardware (e.g. FIG. 18, described later) with reasonable computing power and memory size, either off the shelf, such as a mainframe, a microcomputer, a desktop (PC, MAC, etc.), a laptop, a notebook, etc. . . . or a proprietary hardware designed for the specific task and which may include a microprocessor, a digital signal processor (DSP), various FPGA/CPLD, etc.

For any given hardware implementation of a source or receiver module, corresponding software/firmware may be used to generate all or portion of the encoding/decoding steps required by the specified code construction as some of the associated steps (e.g. flowcharts 300A, 400A/B, 15A0 and Annex A1/A2), such as one that are computational intensive, may be implemented using the target hardware itself or a dedicated hardware residing on an I/O port of the workstation.

Once the source workstation (e.g. module) has accessed the information streams, whether read into a local memory first or while reading the information streams on the fly, the source workstation can encode the corresponding messages as per the provided encoding schemes and as described in prior paragraphs, the encoding scheme being suited for the communication link being used to send over the encoded messages. The encoding can be implemented in a combination of hardware, firmware and software, working in unison to generate the encoded messages. Once the receiver workstation (e.g. module) has received the encoded packets, it can also first buffer the encoded packets into a local memory and then perform the decoding of each message by reading the packets from the local memory, decoding being performed as per the provided flowcharts and as described in the previous paragraphs. Alternatively, the receiver workstation may decode the messages from the received packets and then store into local memory prior to decoding each message.

The methods (e.g. code construction and associated flow charts) and systems (e.g. real-time streaming systems) described in the present disclosure may be implemented in hardware, software, firmware or combination thereof. Features described as modules (e.g. 110, 120) or components (e.g. 110, 120, 130) may be implemented together or separately using a combination of hardware, software and/or firmware. A software portion of the methods (e.g. flowcharts) of the present disclosure may comprise a computer-readable medium which comprises instructions (e.g. executable program) that, when executed, perform, at least in part, the described methods, such as construction in part or in entirety of a code according to the various embodiments of the present disclosure. The computer-readable medium may comprise, for example, a random access memory (RAM) and/or a read-only memory (ROM). The instructions may be executed by a processor (e.g., a digital signal processor (DSP), an application specific integrated circuit (ASIC), a field programmable logic array (FPGA) or a combination thereof which can be integrated within a single integrated circuit (IC).

Figure 18:
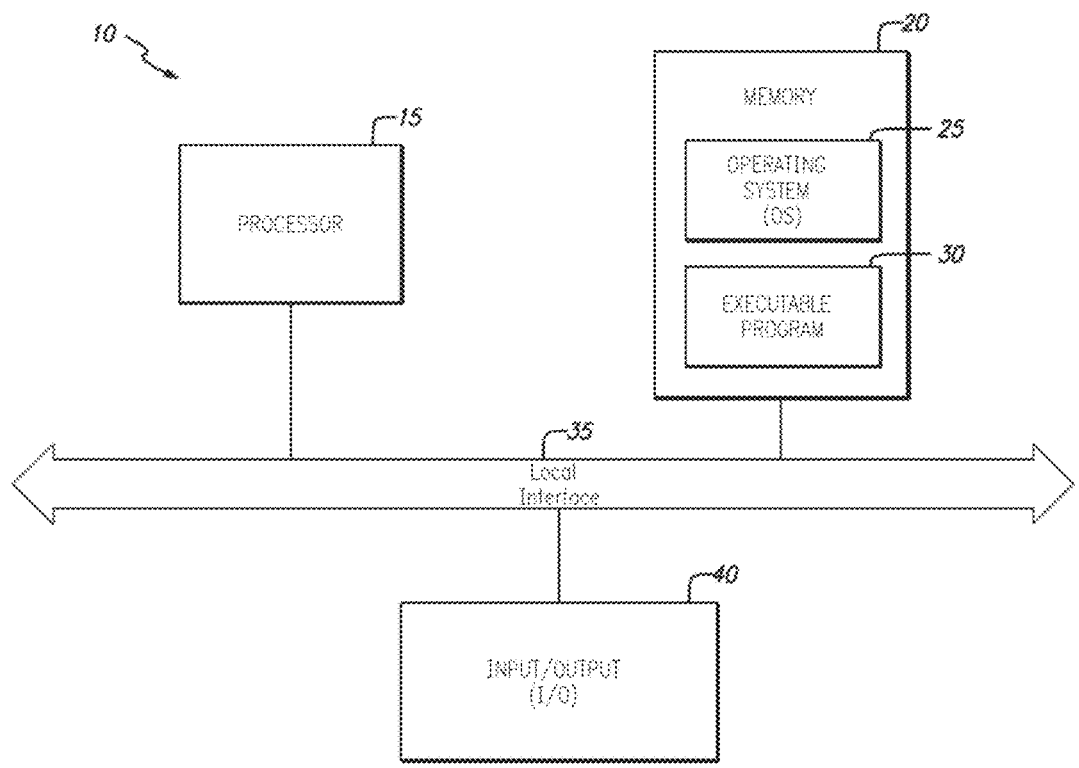
FIG. 18 shows an exemplary embodiment of a target hardware for implementation of a source module and/or a receiver module of FIG. 1 and FIG. 13.

FIG. 18 is an exemplary embodiment of a target hardware (10) (e.g. a computer system) for implementing one or more coding construction methods (e.g. a source module) and/or decoding of such encoded data (e.g. a receiver module) according to the various teachings of the present disclosure. This target hardware comprises a processor (15), a memory bank (20), a local interface bus (35) and one or more Input/Output devices (40). The processor may execute one or more instructions related to the implementation of the various provided coding construction methods (e.g. in entirety or partially) and as provided by the Operating System (25) based on some executable program stored in the memory (20). These instructions are carried to the processors (20) via the local interface (35) and as dictated by some data interface protocol specific to the local interface and the processor (15). It should be noted that the local interface (935) is a symbolic representation of several elements such as controllers, buffers (caches), drivers, repeaters and receivers that are generally directed at providing address, control, and/or data connections between multiple elements of a processor based system. In some embodiments the processor (15) may be fitted with some local memory (cache) where it can store some of the instructions to be performed for some added execution speed. Execution of the instructions by the processor may require usage of some input/output device (40), such as inputting bitstream data comprising messages to be encoded and/or decoded, inputting commands from a keyboard, outputting data to a display, or outputting encoded data packets (e.g. per provided methods) to be transmitted over a communication channel or inputting data packets from the communication channel. In some embodiments, the operating system (25) facilitates these tasks by being the central element to gathering the various data and instructions required for the execution of the program and provide these to the microprocessor. In some embodiments the operating system may not exist, and all the tasks are under direct control of the processor (15), although the basic architecture of the target hardware device (10) will remain the same as depicted in FIG. 18. In some embodiments a plurality of processors may be used in a parallel configuration for added execution speed. In such a case, the executable program may be specifically tailored to a parallel execution. Also, in some embodiments the processor (15) may execute part of a method as provided in the present disclosure, and some other part may be implemented using dedicated hardware/firmware placed at an Input/Output location accessible by the target hardware (10) via local interface (35). The target hardware (10) may include a plurality of executable program (30), wherein each may run independently or in combination with one another. These executable programs can comprise instructions, that when executed by the processor, perform at least part of a method (e.g. construction algorithm, encoding, decoding) presented in the present disclosure.

Such exemplary computer hardware as depicted by FIG. 18 can be implemented in an integrated chip (IC). According to some embodiments of the present disclosure, a code construction module implementing the various embodiments of the present disclosure, whether entirely (e.g. encode and decode) or partially (e.g. encode or decode) can be implemented partially or in its entirety within an IC. Such IC can be used as part of a system to encode/decode data messages according to the various embodiments of the present disclosure. A program stored in a memory (e.g. programmable memory) of the IC can be upgraded such as to fit an encoding and/or decoding function of the present disclosure according to a specific channel erasure link and/or other coding parameters, such as the message size, message priority, message creation interval, packet size and decoding delay, whether independently or in combination. The skilled person can think of various other possible hardware/software/firmware implementations of the systems presented in FIG. 1 and FIG. 13, whether partially or entirely, and using the provided code constructions whose flowcharts are depicted in FIGS. 3A, 4A, 4B and 15A.

The examples set forth above and in Annex A1 and Annex A2 which make part of the present disclosure, are provided to give those of ordinary skill in the art a complete disclosure and description of how to make and use the embodiments of the coding for real-time streaming under packet erasures, and are not intended to limit the scope of what the inventors regard as their disclosure. Modifications of the above-described modes for carrying out the disclosure may be used by persons of skill in the information/coding/communication theory and processing, and are intended to be within the scope of the following claims. All patents and publications mentioned in the specification may be indicative of the levels of skill of those skilled in the art to which the disclosure pertains. All references cited in this disclosure and Annex A1 and Annex A2 which make part of the present disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a," "an," and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

A number of embodiments of the disclosure have been described. Nevertheless, it will be understood that various modifications may be made without departing from the spirit and scope of the present disclosure. Accordingly, other embodiments are within the scope of the following claims.

ANNEX A1

On Coding for Real-Time Streaming under Packet Erasures

Derek Leong, Asma Qureshi, and Tracey Ho

ABSTRACT

We consider a real-time streaming system where messages created at regular time intervals at a source are encoded for transmission to a receiver over a packet erasure link; the receiver must subsequently decode each message within a given delay from its creation time. For erasure models containing a limited number of erasures per coding window, per sliding window, and containing erasure bursts whose maximum length is sufficiently short or long, we show that a time-invariant intrasession code asymptotically achieves the maximum message size among all codes that allow decoding under all admissible erasure patterns. For the bursty erasure model, we also show that diagonally interleaved codes derived from specific systematic block codes are asymptotically optimal over all codes in certain cases. We also study an i.i.d. erasure model in which each transmitted packet is erased independently with the same probability; the objective is to maximize the decoding probability for a given message size. We derive an upper bound on the decoding probability for any time-invariant code, and show that the gap between this bound and the performance of a family of time-invariant intrasession codes is small when the message size and packet erasure probability are small. In a simulation study, these codes performed well against a family of random time-invariant convolutional codes under a number of scenarios.

The material in this paper was presented in part at the ISIT 2012 [1] and ISIT 2013 [2] conferences.
This work was supported in part by the Air Force Office of Scientific Research under Grant FA9550-10-1-0166.
D. Leong was with the California Institute of Technology. He is now with the Institute for Infocomm Research, Singapore 138632, Singapore (e-mail: dleong@i2r.a-star.edu.sg).
A. Qureshi and T. Ho are with the Department of Electrical Engineering, California Institute of Technology, Pasadena, California 91125, USA (e-mail: aqureshi@caltech.edu, tho@caltech.edu).

ANNEX A1

I. INTRODUCTION

We consider a real-time streaming system where messages created at regular time intervals at a source are encoded for transmission to a receiver over a packet erasure link; the receiver must subsequently decode each message within a given delay from its creation time. Unlike previous work that aim to minimize the expected message decoding delay, or achieve a decoding failure probability that decays exponentially with delay [4, 5, 6], our real-time streaming model features hard message decoding deadlines.

Three erasure models are studied in this paper. The first is a window-based erasure model in which all erasure patterns containing a limited number of erasures in each specifically defined window are admissible. We consider two variations of this model; one based on the coding window and the other on a sliding window. The second is a bursty erasure model in which all erasure patterns containing erasure bursts of a limited length are admissible. The third is an i.i.d. erasure model in which each transmitted packet is erased independently with the same probability. For the first and second erasure models, the objective is to find a code that achieves the maximum message size, among all codes that allow all messages to be decoded by their respective decoding deadlines under all admissible erasure patterns. For the third erasure model, the objective is to find a code that achieves the maximum decoding probability for a given message size.

*Our Contribution:* We show that a time-invariant intrasession code is asymptotically optimal over all codes (time-varying and time-invariant, intersession and intrasession) as the number of messages goes to infinity, for both the coding window and sliding window variations of the window-based erasure model, and for the bursty erasure model when the maximum erasure burst length is sufficiently short or long. Intrasession coding is attractive due to its relative simplicity (it allows coding within the same message but not across different messages), but it is not known in general when intrasession coding is sufficient or when intersession coding is necessary. For the bursty erasure model, we also show that diagonally interleaved codes derived from specific systematic block codes are asymptotically optimal over all codes in certain cases.

For the i.i.d. erasure model, we derive an upper bound on the decoding probability for any time-invariant code, and show that the gap between this bound and the performance of a family of time-invariant intrasession codes is small when the message size and packet erasure probability are small. In a simulation study, these codes performed well against a family of random time-invariant convolutional codes under a number of scenarios.

*Related Work:* Martinian *et al.* [7, 8] and Badr *et al.* [9] provide constructions of streaming codes that minimize the decoding delay for certain types of bursty erasure models. Tree codes or anytime codes, for which the decoding failure probability decays exponentially with delay, are considered in [4, 5, 6].

ANNEX A1

Convolutional codes similar to those in our simulation study for the i.i.d. erasure model were also examined in prior work with the expected decoding delay as the performance metric. Tekin et al. [10] considered erasure correction coding for a non-real-time streaming system where all messages are initially present at the source.

The systems literature on real-time streaming deals mainly with the transmission of media content (i.e., video and audio) over the Internet, with the user-perceived quality of the received stream as the performance metric. In practice, the encoding of the raw media content, packetization of the coded data (possibly with interleaving) for transmission, and application of forward error correction (FEC) codes are usually performed by different components of the system separately (e.g., [11, 12]). FEC codes (e.g., exclusive-or parity [13], Reed-Solomon [14]), if used, are typically applied to blocks of packets to generate separate parity or repair packets (e.g., [15, 16]). Furthermore, the decoding delay requirement is not explicitly considered during the coding process. The patent of Rasmussen et al. [17] describes a system in which a live stream of data is divided into segments, each of which is encoded into one or more transmission blocks using an FEC code (e.g., LT [18], Reed-Solomon); these blocks are optionally subdivided and interleaved in a variety of ways before being transmitted over one or more channels. A similar streaming system is also considered in the patent of Luby et al. [19], which describes computationally efficient methods for decoding FEC-encoded blocks to achieve low latency.

We begin with a formal definition of the problem in Section II, followed by a description of our code constructions in Section III. In Sections IV, V, and VI, we examine the three erasure models in detail and state our main results. Proofs of theorems are deferred to the appendix.

II. PROBLEM DEFINITION

Consider a discrete-time data streaming system comprising a source and a receiver, with a directed unit-bandwidth packet erasure link from the source to the receiver. Independent messages of uniform size $s > 0$ are created at regular intervals of $c \in \mathbb{Z}^+$ time steps at the source. At each time step $t \in \mathbb{Z}^+$, the source transmits a single data packet of normalized unit size over the packet erasure link; either the entire packet is received instantaneously by the receiver at time step $t$, or the entire packet is erased and never received. The receiver must subsequently decode each message within a delay of $d \in \mathbb{Z}^+$ time steps from its creation time. Fig. 1 depicts this real-time streaming system for an instance of $(c, d)$.

More precisely, let random variable $M_k$ denote message $k$; the random variables $\{M_k\}$ are independent, and $H(M_k) = s$ for each $k \in \mathbb{Z}^+$. To simplify our definition of the encoding functions, we shall further assume that $M_1, M_2, \ldots$ are identically distributed, and nonpositive messages $M_0, M_{-1}, \ldots$ are zeros.

Each message $k \in \mathbb{Z}^+$ is created at time step $(k-1)c + 1$, and is to be decoded by time step $(k-1)c + d$. Let $W_k$ be the *coding window* for message $k$, which we define as the interval of $d$ time steps between its creation time and decoding deadline, i.e., $$W_k \triangleq \{(k-1)c+1, \ldots, (k-1)c+d\}.$$

We shall assume that $d > c$ so as to avoid the degenerate case of nonoverlapping coding windows for which it is sufficient to code individual messages separately.

The unit-size packet transmitted at each time step $t \in \mathbb{Z}^+$ must be a function of messages created at time step $t$ or earlier. Let random variable $X_t$ denote the packet transmitted at time step $t$; we have $H(X_t) \leq 1$ for each $t \in \mathbb{Z}^+$. For brevity, we define $X[A] \triangleq (X_t)_{t \in A}$.

Because we are dealing with hard message decoding deadlines and fixed-size messages and packets, it is reasonable to adopt a zero-error notion of decodability. Specifically, a given message $k$ is considered to be decodable from the packets received at time steps $t \in A$ if and only if $$H(M_k \mid X[A]) = 0.$$

Consider the first $n$ messages $\{1, \ldots, n\}$, and the union of their (overlapping) coding windows $T_n$ given by $$T_n \triangleq W_1 \cup \cdots \cup W_n = \{1, \ldots, (n-1)c+d\}.$$

An *erasure pattern* $E \subseteq T_n$ specifies a set of erased packet transmissions over the link; the packets transmitted at time steps $t \in E$ are erased, while those transmitted at time steps $t \in T_n \setminus E$ are received. An *erasure model* essentially describes a distribution of erasure patterns.

For a given pair of positive integers $a$ and $b$, we define the *offset quotient* $q_{a,b}$ and *offset remainder* $r_{a,b}$ to be the unique integers satisfying the following three conditions:

$$a = q_{a,b} b + r_{a,b}, \qquad q_{a,b} \in \mathbb{Z}_0^+, \qquad r_{a,b} \in \{1, \ldots, b\},$$

where $\mathbb{Z}_0^+$ denotes the set of nonnegative integers, i.e., $\mathbb{Z}^+ \cup \{0\}$. Note that this definition departs from the usual definition of quotient and remainder in that $r_{a,b}$ can be equal to $b$ but not zero.

III. CODE CONSTRUCTIONS

We analyze the performance of two types of time-invariant codes in this paper: *symmetric intrasession codes* for the window-based, bursty, and i.i.d. erasure models, and *diagonally interleaved codes* for the bursty erasure model. For ease of reference, we present their constructions and some general properties here.

The usual definition of a time-invariant code applies in the case of $c = 1$, where every packet is generated by applying a common encoding function to some recent interval of messages. For larger values of $c$, the notion of time-invariance can be generalized as follows:

ANNEX A1

Definition (Time-Invariant Code). A code is time-invariant if there exist causal and deterministic encoding functions $f_1, \ldots, f_c$ and a finite encoder memory size $m_E \in \mathbb{Z}^+$ such that the packet transmitted at each time step $(k-1)c + i$, where $k \in \mathbb{Z}^+$, $i \in \{1, \ldots, c\}$, is given by the function $f_i$ applied to the $m_E$ most recent messages, i.e., $$X_{(k-1)c+i} = f_i\big(\underbrace{M_k, M_{k-1}, \ldots, M_{k-m_E+1}}_{m_E \text{ most recent messages}}\big).$$

*A. Symmetric Intrasession Codes*

In an *intrasession* code, coding is allowed within the same message but not across different messages. To describe such a code, we first specify how the link bandwidth or data packet space at each time step is allocated among the different messages. Each unit-size packet is essentially divided into multiple subpackets or blocks of possibly different sizes, each encoding a different message. We assume that an appropriate code (e.g., a maximum distance separable (MDS) code or a random linear code) is subsequently applied to this allocation so that each message is decodable whenever the total amount of received data that encodes that message, or the total size of the corresponding blocks, is at least the message size $s$.

The blocks that encode a given message $k$ are confined to the packets transmitted in the corresponding coding window $W_k$; they cannot be created before the message creation time, and are useless after the message decoding deadline. Thus, to decode each message, the decoder needs to access only the packets received at the most recent $d$ time steps. The decoder memory requirements for intrasession codes are therefore modest compared to an intersession code requiring older packets or previous messages for decoding.

In a *time-invariant* intrasession code, the encoding functions $f_1, \ldots, f_c$ determine the sizes of the blocks that encode the $m_E$ most recent messages in each interval of $c$ packets or time steps. For each $i \in \{1, \ldots, m_E c\}$, let $x_i \geq 0$ be the size of the block that encodes message $k - q_{i,c}$ at time step $(k-1)c + r_{i,c}$. Therefore, the size of the block that encodes message $k$ at time step $(k-1)c + i$ is $x_i$ if $i \in \{1, \ldots, m_E c\}$, and zero otherwise. Because of the unit packet size constraint, we require that the sum of block sizes at each of the $c$ time steps is at most one, i.e., $$\sum_{\substack{i \in \{1, \ldots, m_E c\}: \\ r_{i,c} = j}} x_i \leq 1 \quad \forall j \in \{1, \ldots, c\}.$$

Motivated by the symmetric allocation strategy of [20, Section II], we introduce the family of *symmetric intrasession codes*, which are time-invariant intrasession codes with a symmetric allocation of packet space. For each symmetric code, we define a *spreading parameter* $m \in \{c, \ldots, d'\}$, where $d' \triangleq \min(d, m_E c)$. (We would expect that $d' = d$ for most real-time streaming systems because the decoding deadline constraint is typically stricter than the encoder memory size limit, i.e., $d \leq m_E c$.) Let $W'_k \subseteq W_k$ be the *effective*

ANNEX A1

*coding window* for message $k$, which we define as the interval of $m$ time steps beginning at its creation time, i.e., $$W'_k \triangleq \{(k-1)c+1, \ldots, (k-1)c+m\}.$$

Let $A_t$ be the set of *active messages* at time step $t$, which we define as the messages whose effective coding windows contain time step $t$, i.e., $$A_t \triangleq \{k \in \mathbb{Z} : t \in W'_k\}.$$

(Note that nonpositive messages are included as dummy messages.) For each symmetric code, the unit packet space at each time step is divided evenly among the active messages at that time step. Thus, the number of blocks allocated to each message $k \in \mathbb{Z}^+$ is given by the spreading parameter $m$, and the size of the block that encodes each active message $k \in A_t$ at each time step $t \in \mathbb{Z}^+$ is given by $\frac{1}{|A_t|}$.

Fig. 2 illustrates this allocation of the unit packet space at each time step, for two instances of $(c, m)$.

*1) Active Messages at Each Time Step:* For a given choice of $(c, m)$, the set of active messages at each time step $t \in \mathbb{Z}^+$ can be stated explicitly as follows:

$$\begin{aligned} A_t &= \{k \in \mathbb{Z} : t \in W'_k\} \\ &= \{k \in \mathbb{Z} : (k-1)c + 1 \leq t \leq (k-1)c + m\} \\ &= \left\{k \in \mathbb{Z} : \frac{t-m}{c} + 1 \leq k \leq \frac{t-1}{c} + 1\right\} \\ &= \left\{\left\lceil \frac{t-m}{c} + 1 \right\rceil, \ldots, \left\lfloor \frac{t-1}{c} + 1 \right\rfloor\right\}. \end{aligned}$$

Expressing this in terms of $q_{m,c}$, $r_{m,c}$, $q_{t,c}$, $r_{t,c}$ yields $$A_t = \left\{q_{t,c} + 1 - q_{m,c} + \left\lceil \frac{r_{t,c} - r_{m,c}}{c} \right\rceil, \ldots, q_{t,c} + 1\right\}.$$

It follows that the *number* of active messages $|A_t|$ varies over time depending on the value of $r_{t,c}$; specifically, two cases are possible:

*Case 1:* If $r_{t,c} \leq r_{m,c}$, then $$-1 < \frac{1-c}{c} \leq \frac{r_{t,c} - r_{m,c}}{c} \leq 0,$$

which implies that $\left\lceil \frac{r_{t,c} - r_{m,c}}{c} \right\rceil = 0$, and $$A_t = \{q_{t,c} + 1 - q_{m,c}, \ldots, q_{t,c} + 1\}.$$

Therefore, there are $q_{m,c} + 1$ active messages at time step $t$, each of which is allocated a block of size $\frac{1}{q_{m,c}+1}$.

*Case 2:* If $r_{t,c} > r_{m,c}$, then $$0 < \frac{r_{t,c} - r_{m,c}}{c} \leq \frac{c-1}{c} < 1,$$

ANNEX A1 which implies that $\left\lceil \frac{r_{t,c} - r_{m,c}}{c} \right\rceil = 1$, and $$A_t = \{q_{t,c} + 1 - (q_{m,c} - 1), \ldots, q_{t,c} + 1\}.$$

Therefore, there are $q_{m,c}$ active messages at time step $t$, each of which is allocated a block of size $\frac{1}{q_{m,c}}$.

Note that when $m$ is a multiple of $c$, we have $r_{t,c} \leq r_{m,c} = c$ for any $t$, which implies that there are $q_{m,c} + 1$ active messages at every time step, and all blocks are of size $\frac{1}{q_{m,c}+1} = \frac{c}{m}$.

*2) Block Sizes for Each Message:* As a consequence of the number of active messages, message $k$ is allocated either a small block of size $\frac{1}{q_{m,c}+1}$ or a big block of size $\frac{1}{q_{m,c}}$ at each time step $t \in W'_k$; no blocks are allocated to message $k$ at all other time steps $t \notin W'_k$. Writing each time step $t \in W'_k$ as $$t = (k-1)c + i = \underbrace{(k - 1 + q_{i,c})}_{q_{t,c}} c + \underbrace{r_{i,c}}_{r_{t,c}},$$

where $i \in \{1, \ldots, m\}$, we observe that the size of the block that encodes message $k$ at time step $(k-1)c + i$, which has been defined as $x_i$, depends on the value of $r_{i,c}$; specifically, two cases are possible:

*Case 1:* If $r_{i,c} \leq r_{m,c}$, then $x_i = \frac{1}{q_{m,c}+1}$. Since $i \in \{1, \ldots, m\}$, this condition corresponds to the case where $q_{i,c} \in \{0, \ldots, q_{m,c}\}$ and $r_{i,c} \in \{1, \ldots, r_{m,c}\}$. Therefore, message $k$ is allocated a small block of size $\frac{1}{q_{m,c}+1}$ per time step for a total of $(q_{m,c}+1)r_{m,c}$ time steps in the effective coding window $W'_k$.

*Case 2:* If $r_{i,c} > r_{m,c}$, then $x_i = \frac{1}{q_{m,c}}$. Since $i \in \{1, \ldots, m\}$, this condition corresponds to the case where $q_{i,c} \in \{0, \ldots, q_{m,c} - 1\}$ and $r_{i,c} \in \{r_{m,c} + 1, \ldots, c\}$. Therefore, message $k$ is allocated a big block of size $\frac{1}{q_{m,c}}$ per time step for a total of $q_{m,c}(c - r_{m,c})$ time steps in the effective coding window $W'_k$.

*3) Achievability:* We use the following lemma to determine the message sizes achievable by the symmetric code with spreading parameter $m = d$ (for which $W'_k = W_k$), for the window-based and bursty erasure models:

Lemma 1 (Achievability). *Consider the symmetric intrasession code (Section III-A) with spreading parameter $m = d$ for a given choice of $(c, d)$. If message size $s$ satisfies the inequality*

$$s \leq \sum_{j=1}^{\ell} y_j,$$

*where $\mathbf{y} = (y_1, \ldots, y_d)$ is defined as*

$$\mathbf{y} \triangleq ( \underbrace{\overbrace{\underbrace{\frac{1}{q_{d,c}+1}, \ldots, \frac{1}{q_{d,c}+1}}_{(q_{d,c}+1)r_{d,c} \text{ entries}}, \underbrace{\frac{1}{q_{d,c}}, \ldots, \frac{1}{q_{d,c}}}_{q_{d,c}(c-r_{d,c}) \text{ entries}}}^{d \text{ entries}} } ),$$

*then each message $k \in \mathbb{Z}^+$ is decodable from any $\ell$ packets transmitted in its coding window $W_k$.*

Note that the maximum message size $s$ that can be supported by this code is given by $\sum_{j=1}^{d} y_j = c$, which corresponds to the choice of $\ell = d$.

ANNEX A1

*4) Partitioning of Coding Windows:* We use the following lemma to select worst-case erasure patterns with cut-set bounds that match the message sizes achievable by the symmetric code with spreading parameter $m = d$, for the window-based and bursty erasure models:

Lemma 2 (Partitioning of Coding Windows). *Consider the symmetric intrasession code (Section III-A) with spreading parameter $m = d$ for a given choice of $(c, d)$. Consider the first $n$ messages $\{1, \ldots, n\}$, and the union of their (overlapping) coding windows $T_n$. The set of time steps $T_n$ can be partitioned into $d$ sets $T_n^{(1)}, \ldots, T_n^{(d)}$, given by*

$$T_n^{(i)} \triangleq \begin{cases} \left\{ (j(q_{d,c} + 1) + q_{i,c})c + r_{i,c} \in T_n : j \in \mathbb{Z}_0^+ \right\} \\ \quad \textit{if } r_{i,c} \leq r_{d,c}, \\ \left\{ (j\, q_{d,c} + q_{i,c})c + r_{i,c} \quad \in T_n : j \in \mathbb{Z}_0^+ \right\} \\ \quad \textit{if } r_{i,c} > r_{d,c}, \end{cases}$$

*with the following properties:*

P1) *Over the packets transmitted at time steps $T_n^{(i)}$, each message $k \in \{1, \ldots, n\}$ is allocated exactly one block; this block is contained within the coding window $W_k$, and has a size of $\frac{1}{q_{d,c}+1}$ if $r_{i,c} \leq r_{d,c}$, and $\frac{1}{q_{d,c}}$ if $r_{i,c} > r_{d,c}$.*

P2) *The total size of the packets transmitted at time steps $T_n^{(i)}$, i.e., $|T_n^{(i)}|$, has the following upper bound:*

$$|T_n^{(i)}| < \begin{cases} \dfrac{n}{q_{d,c}+1} + 2 & \textit{if } r_{i,c} \leq r_{d,c}, \\ \dfrac{n}{q_{d,c}} + 2 & \textit{if } r_{i,c} > r_{d,c}. \end{cases}$$

Fig. 3 shows how the set of time steps $T_n$ is partitioned into the $d$ sets $T_n^{(1)}, \ldots, T_n^{(d)}$, for two instances of $(c, d)$.

B. Diagonally Interleaved Codes

Consider a systematic block code $\mathcal{C}$ that encodes a given vector of $d - \alpha$ information symbols $\mathbf{a} = (a[1], \ldots, a[d-\alpha])$ as a codeword vector of $d$ symbols $(a[1], \ldots, a[d-\alpha], b[1], \ldots, b[\alpha])$, where each symbol has a normalized size of $\frac{1}{d}$. For each $i \in \{1, \ldots, \alpha\}$, we define an encoding function $g_i$ so that the parity symbol $b[i]$ is given by $b[i] = g_i(\mathbf{a})$.

For a given choice of $(c, d, \alpha)$, we can derive a time-invariant *diagonally interleaved code* for a message size of $s = \frac{d-\alpha}{d}c$ by interleaving codeword symbols produced by the component systematic block code $\mathcal{C}$ in a diagonal pattern.

ANNEX A1

First, to facilitate code construction, we represent the derived code by a table of symbols, with each cell in the table assigned one symbol of size $\frac{1}{d}$. Fig. 4 illustrates our construction for an instance of $(c, d, \alpha)$. Let $x_t[i]$ denote the symbol in column $t \in \mathbb{Z}$ and row $i \in \{1, \ldots, d\}$. The unit-size packet transmitted at each time step $t$ is composed of the $d$ symbols $x_t[1], \ldots, x_t[d]$ in column $t$ of the table. Rows $\{1, \ldots, d - \alpha\}$ of the table are populated by information symbols, while rows $\{d - \alpha + 1, \ldots, d\}$ are populated by parity symbols.

Next, we divide each message $k$ into $(d - \alpha)c$ submessages or information symbols denoted by $M_k[1], \ldots, M_k[(d - \alpha)c]$, with each symbol having a size of $\frac{s}{(d-\alpha)c} = \frac{1}{d}$. The information symbols corresponding to each message $k$ are assigned evenly to the columns representing the first $c$ time steps in coding window $W_k$, so that $$x_t[i] = M_{q_{t,c}+1}[(r_{t,c} - 1)(d - \alpha) + i]$$

for each $i \in \{1, \ldots, d - \alpha\}$. To obtain the parity symbols for column $t$, we apply the component systematic block code $\mathcal{C}$ to the information symbols on each diagonal, so that $$x_t[d - \alpha + i] = g_i\left(\left(x_{t-i-(d-\alpha)+\ell}[\ell]\right)_{\ell=1}^{d-\alpha}\right)$$

for each $i \in \{1, \ldots, \alpha\}$. Thus, the $d$ symbols on each diagonal spanning across $d$ consecutive time steps in the derived code constitute one codeword produced by $\mathcal{C}$. Note that the information symbols for nonexistent messages (i.e., nonpositive messages and messages after the actual final message) are assumed to be zeros so that all codeword symbols are well defined.

Three component systematic block codes are specified by Theorems 4, 5, and 6 in Section V-B on the bursty erasure model. We show that the diagonally interleaved codes derived from them are asymptotically optimal under specific conditions. A general construction that unifies these three block codes is summarized by the following steps, for a given choice of $(c, d, \alpha)$:

1) The component systematic block code $\mathcal{C}$ comprises $d$ symbols; the first $d - \alpha$ symbols are information symbols, while the last $\alpha$ symbols are parity symbols that can be nondegenerate or degenerate.

2) Select the *degenerate parity symbols* by grouping the $\alpha$ parity symbols into disjoint intervals of $d - \alpha$ symbols (if available), counting from the end of the block code. Degenerate parity symbols are just uncoded copies of the information symbols, arranged in the same order.

3) Set the remaining parity symbols as the *nondegenerate parity symbols*. Let $\alpha'$ be the number of nondegenerate parity symbols, where $0 \leq \alpha' < d - \alpha$.

4) Arrange the information symbols into rows of $\alpha'$ symbols, counting from the beginning of the block code. If there are fewer than $\alpha'$ symbols in the last row, then repeat them as many times as necessary

ANNEX A1 until the row is filled.

5) Arrange the $\alpha'$ nondegenerate parity symbols below the last row of information symbols. Set each nondegenerate parity symbol to be the bit-wise modulo-2 sum (i.e., exclusive-or) of the information symbols above it.

6) The component systematic block code $\mathcal{C}$ is the concatenation of the $d - \alpha$ information symbols, followed by the $\alpha'$ nondegenerate parity symbols (if any), followed by the $\alpha - \alpha'$ degenerate parity symbols (if any).

IV. WINDOW-BASED ERASURE MODEL

For the first erasure model, all erasure patterns containing a limited number of erasures in each specifically defined window are admissible. We consider two variations of this model; one based on the coding window $W_k$ in Section IV-A, and the other on a sliding window of $h$ time steps, where $h \geq d$, in Section IV-B.

A. Coding Window Erasure Model

Consider the first $n$ messages $\{1, \ldots, n\}$, and the union of their (overlapping) coding windows $T_n$. Let $\mathcal{E}_n^{\text{CW}}$ be the set of erasure patterns that have at most $z$ erased time steps in each coding window $W_k$, i.e., $$\mathcal{E}_n^{\text{CW}} \triangleq \{E \subseteq T_n : |E \cap W_k| \leq z \; \forall \, k \in \{1, \ldots, n\}\}.$$

The objective is to construct a code that allows all $n$ messages $\{1, \ldots, n\}$ to be decoded by their respective decoding deadlines under any erasure pattern $E \in \mathcal{E}_n^{\text{CW}}$. Let $s_n^{\text{CW}}$ be the maximum message size that can be achieved by such a code, for a given choice of $(n, c, d, z)$.

Figure 5:
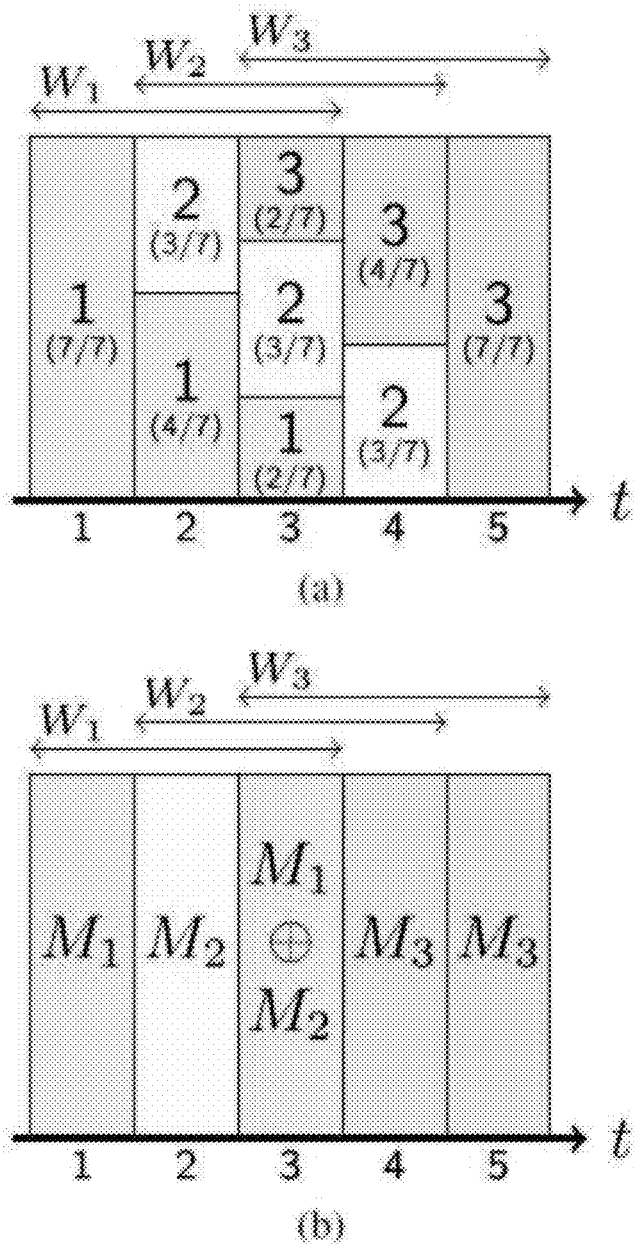
FIG. 5 shows a finite time horizon example for a window-based erasure model, with (n, c, d, z)=(3, 1, 3, 1). An optimal intra-session code, which achieves a message size of s=6/7 is shown in (a). An optimal intersession code, which achieves a message size of s=1 is shown in (b). In (a), the size of each block is indicated in parentheses. In (b), the packet at time step i=3 is given by the bit-wise modulo-2 sum (e.g. exclusive-or) of message 1 and message 2.

The following example demonstrates that over a finite time horizon (i.e., when the number of messages $n$ is finite), intrasession coding can be strictly suboptimal:

Example 1 (Finite Time Horizon). Suppose that $(n, c, d, z) = (3, 1, 3, 1)$. The maximum message size that can be achieved by an intrasession code is $s = \frac{6}{7}$; one such optimal intrasession code, which can be found by solving a linear program, is shown in Fig. 5a. The intersession code shown in Fig. 5b achieves a strictly larger message size of $s = 1$. Using a simple cut-set bound argument, we can show that this is also the maximum achievable message size, i.e., $s_n^{\text{CW}} = 1$.

However, it turns out that the symmetric intrasession code (Section III-A) with spreading parameter $m = d$ is *asymptotically* optimal over all codes; the gap between the maximum achievable message size $s_n^{\text{CW}}$ and the message size achieved by this code vanishes as the number of messages $n$ goes to infinity:

ANNEX A1

Theorem 1. *Consider the coding window erasure model for a given choice of $(c, d, z)$. The symmetric intrasession code (Section III-A) with spreading parameter $m = d$ is asymptotically optimal over all codes in the following sense: it achieves a message size of*

$$\sum_{j=1}^{d-z} y_j,$$

*which is equal to the asymptotic maximum achievable message size $\lim_{n \to \infty} s_n^{CW}$, where $\mathbf{y} = (y_1, \ldots, y_d)$ is as defined in Lemma 1.*

The achievability claim of this theorem is a consequence of Lemma 1; to prove the converse claim, we consider a cut-set bound corresponding to a specific *worst-case* erasure pattern in which exactly $z$ erasures occur in every coding window. This erasure pattern is chosen with the help of Lemma 2; specifically, the erased time steps are chosen to coincide with the bigger blocks allocated to each message in the symmetric code.

B. Sliding Window Erasure Model

Consider the first $n$ messages $\{1, \ldots, n\}$, and the union of their (overlapping) coding windows $T_n$. Let sliding window $L_t$ denote the interval of $h$ time steps beginning at time step $t$, where $h \geq d$, i.e., $$L_t \triangleq \{t, \ldots, t + h - 1\}.$$

Let $\mathcal{E}_n^{SW}$ be the set of erasure patterns that have at most $z$ erased time steps in each sliding window $L_t$, i.e., $$\mathcal{E}_n^{SW} \triangleq \big\{ E \subseteq T_n : |E \cap L_t| \leq z$$
$$\forall\, t \in \{1, \ldots, (n-1)c + d - h + 1\} \big\}.$$

The objective is to construct a code that allows all $n$ messages $\{1, \ldots, n\}$ to be decoded by their respective decoding deadlines under any erasure pattern $E \in \mathcal{E}_n^{SW}$. Let $s_n^{SW}$ be the maximum message size that can be achieved by such a code, for a given choice of $(n, c, d, h, z)$.

We note that if $E \in \mathcal{E}_n^{SW}$, then $E \in \mathcal{E}_n^{CW}$; therefore, $\mathcal{E}_n^{SW} \subseteq \mathcal{E}_n^{CW}$, which implies that $s_n^{SW} \geq s_n^{CW}$. For the special case of $(c, h) = (1, d)$, each sliding window is also a coding window, and so this sliding window erasure model reduces to the coding window erasure model of Section IV-A, i.e., $\mathcal{E}_n^{SW} = \mathcal{E}_n^{CW}$. Over a finite time horizon, intrasession coding can also be suboptimal for this erasure model; the illustrating example from Section IV-A applies here as well.

Surprisingly, the symmetric code with spreading parameter $m = d$ also turns out to be asymptotically optimal over all codes here; the omission of erasure patterns in $\mathcal{E}_n^{SW}$ compared to $\mathcal{E}_n^{CW}$ has not led to an increase in the maximum achievable message size (cf. Theorem 1):

ANNEX A1

Theorem 2. *Consider the sliding window erasure model for a given choice of $(c, d, h, z)$. The symmetric intrasession code (Section III-A) with spreading parameter $m = d$ is asymptotically optimal over all codes in the following sense: it achieves a message size of*

$$\sum_{j=1}^{d-z} y_j,$$

*which is equal to the asymptotic maximum achievable message size $\lim_{n\to\infty} s_n^{\text{SW}}$.*

Proving the converse claim of this theorem requires a different approach from that of Theorem 1. It may not be possible to find a single admissible erasure pattern that provides a cut-set bound matching the symmetric code; instead, we need to combine different erasure patterns for different messages. To pick these erasure patterns, we first choose a specific *base erasure pattern* $E'$ (which may not be admissible in general) with the help of Lemma 2. We then derive admissible erasure patterns from $E'$ by taking its intersection with each coding window, i.e., $(E' \cap W_k) \in \mathcal{E}_n^{\text{SW}}$. These derived erasure patterns are used in the inductive computation of an upper bound for the conditional entropy $$H\left(X[W_n \setminus E'] \,\middle|\, M_1^n, X_1^{(n-1)c}\right).$$

Intuitively, this conditional entropy term expresses how much space is left in the unerased data packets of the coding window for message $n$, after encoding the first $n$ messages, and conditioned on the previous time steps. The nonnegativity of the conditional entropy leads us to a bound for $s_n^{\text{SW}}$ that matches the message size achieved by the symmetric code in the limit $n \to \infty$.

V. BURSTY ERASURE MODEL

For the second erasure model, all erasure patterns containing erasure bursts of a limited length are admissible. Consider the first $n$ messages $\{1, \ldots, n\}$, and the union of their (overlapping) coding windows $T_n$. Let $\mathcal{E}_n^{\text{B}}$ be the set of erasure patterns in which each erasure burst is an interval of at most $z$ erased time steps, and consecutive erasure bursts are separated by a guard interval or gap of at least $d - z$ unerased time steps, i.e., $$\mathcal{E}_n^{\text{B}} \triangleq \Big\{ E \subseteq T_n :$$
$$(t \notin E \,\wedge\, t+1 \in E) \Rightarrow |E \cap \{t+1, \ldots, t+z+1\}| \leq z,$$
$$(t \in E \,\wedge\, t+1 \notin E) \Rightarrow |E \cap \{t+1, \ldots, t+d-z\}| = 0 \Big\}.$$

The objective is to construct a code that allows all $n$ messages $\{1, \ldots, n\}$ to be decoded by their respective decoding deadlines under any erasure pattern $E \in \mathcal{E}_n^{\text{B}}$. Let $s_n^{\text{B}}$ be the maximum message size that can be achieved by such a code, for a given choice of $(n, c, d, z)$.

ANNEX A1

This model can be seen as an instance of a more general class of bursty erasure models where the maximum erasure burst length and the minimum guard interval length can be arbitrarily specified. In a similar bursty erasure model considered by Martinian *et al.* [7, 8] and Badr *et al.* [9], the maximum erasure burst length (given by $B$) is $z$, while the minimum guard interval length (given by $T$) is $d - 1$. For the same choice of $(d, z)$, our model captures a larger set of erasure patterns and is therefore stricter (the respective cut-set bounds reflect this comparison).

In Section V-A, we show that the symmetric intrasession code with spreading parameter $m = d$, which is asymptotically optimal for the window-based erasure model of Section IV, is also asymptotically optimal here in a number of cases. In Section V-B, we show that diagonally interleaved codes derived from specific systematic block codes are asymptotically optimal in several other cases.

A. Optimality of Symmetric Intrasession Codes

Using the proof technique of Theorem 2, we can show that the symmetric intrasession code (Section III-A) with spreading parameter $m = d$ is also asymptotically optimal over all codes here when $d$ is a multiple of $c$, or when the maximum erasure burst length $z$ is sufficiently short or long:

Theorem 3. *Consider the bursty erasure model for a given choice of $(c, d, z)$ satisfying any of the following three conditions:*

1) *$d$ is a multiple of $c$;*
2) *$d$ is not a multiple of $c$, and $z \leq c - r_{d,c}$; or*
3) *$d$ is not a multiple of $c$, and $z \geq d - r_{d,c}$.*

*The symmetric intrasession code (Section III-A) with spreading parameter $m = d$ is asymptotically optimal over all codes in the following sense: it achieves a message size of*

$$\sum_{j=1}^{d-z} y_j,$$

*which is equal to the asymptotic maximum achievable message size $\lim_{n \to \infty} s_n^B$.*

When the maximum erasure burst length $z$ takes on intermediate values, intersession coding may become necessary. Asymptotically optimal codes for a variety of these cases are presented in Section V-B.

B. Optimality of Diagonally Interleaved Codes

Diagonally interleaved codes (Section III-B) that are derived from systematic block codes $\mathcal{C}$ with certain properties turn out to be asymptotically optimal in several cases. These sufficient code properties are given by the following lemma:

ANNEX A1

Lemma 3. *Consider the diagonally interleaved code (Section III-B) for a given choice of $(c, d, \alpha=z)$ satisfying $c \leq z \leq d - c$. Suppose that the $d$ symbols of the codeword vector $(a[1], \ldots, a[d-z], b[1], \ldots, b[z])$ produced by the component systematic block code $\mathcal{C}$ are transmitted sequentially across an erasure link, one symbol per time step, over the time interval $L \triangleq \{1, \ldots, d\}$. For each $j \in \{1, \ldots, d\}$, let $E_j^z \subseteq L$ be the erasure pattern that contains a single wrap-around erasure burst of exactly $z$ erased time steps (which may wrap around the last and first time steps in the interval) with the $j$th time step in the interval as the "leading" erasure, i.e.,*

$$E_j^z \triangleq \{r_{j+\ell,d} : \ell \in \{0, \ldots, z-1\}\}.$$

*Let $\mathcal{E}^z$ be the set of all such erasure patterns, i.e.,*

$$\mathcal{E}^z \triangleq \{E_1^z, \ldots, E_d^z\}.$$

*If the systematic block code $\mathcal{C}$ satisfies both of the following symbol decoding requirements, then the diagonally interleaved code derived from $\mathcal{C}$ achieves a message size of $\frac{d-z}{d}c$ for the bursty erasure model:*

D1) *For each $i \in \{1, \ldots, c\}$, the information symbol $a[i]$ is decodable by the $(d - c + i)$th time step in interval $L$ under any erasure pattern $E^z \in \mathcal{E}^z$.*

D2) *The information symbols $a[c+1], \ldots, a[d-z]$ are decodable by the last time step in interval $L$ under any erasure pattern $E^z \in \mathcal{E}^z$.*

The condition $c \leq z \leq d - c$ is actually implied by the symbol decoding requirements: the first information symbol $a[1]$ would otherwise be undecodable by its decoding deadline under erasure pattern $E_1^z$ because by that time step, no parity symbols would have been transmitted if $c > z$, and no symbols would have been received if $z > d - c$. Note that the use of a systematic MDS code as the component systematic block code $\mathcal{C}$ may not be sufficient here because of the additional decoding deadlines imposed on individual symbols.

The following theorem shows that a degenerate diagonally interleaved code that uses only intrasession coding is asymptotically optimal over all codes for the specified parameter conditions:

Theorem 4. *Consider the bursty erasure model for a given choice of $(c, d, z)$ satisfying all of the following three conditions:*

1) *$d$ is not a multiple of $c$;*
2) *$c \leq z \leq d - c$; and*
3) *$d$ is a multiple of $d - z$.*

*Let $\mathcal{C}$ be a systematic block code that encodes a given vector of $d - z$ information symbols $\mathbf{a} = (a[1], \ldots, a[d-z])$ as a codeword vector of $d$ symbols $(a[1], \ldots, a[d-z], b[1], \ldots, b[z])$, where each*

ANNEX A1

*symbol has a normalized size of $\frac{1}{d}$, and the parity symbol $b[i]$ is given by*

$$b[i] = g_i(\mathbf{a}) \triangleq a[r_{i,d-z}]$$

*for each $i \in \{1, \ldots, z\}$. The diagonally interleaved code (Section III-B) derived from $\mathcal{C}$ is asymptotically optimal over all codes in the following sense: it achieves a message size of $\frac{d-z}{d}c$, which is equal to the asymptotic maximum achievable message size $\lim_{n \to \infty} s_n^B$.*

Figure 6:
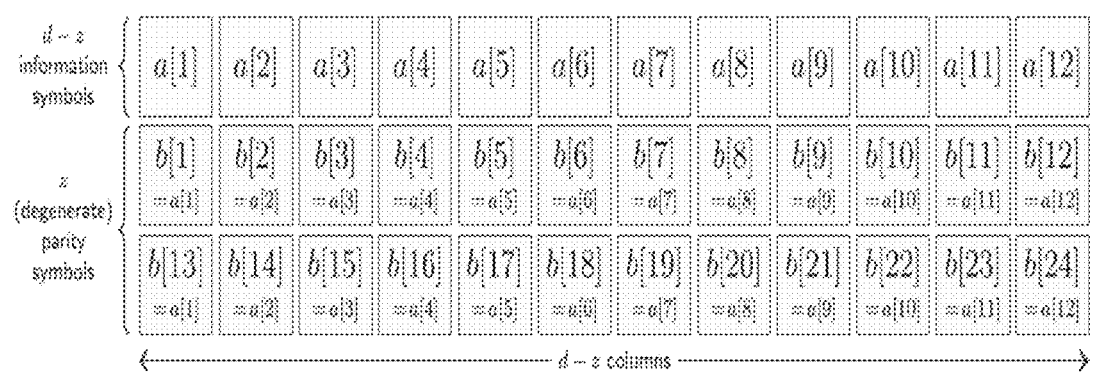

The systematic block code $\mathcal{C}$ of Theorem 4 is illustrated in Fig. 6 for an instance of $(c, d, z)$. Note that all the parity symbols in $\mathcal{C}$ are degenerate in the sense that they are just uncoded copies of information symbols.

The following two theorems describe diagonally interleaved codes that are asymptotically optimal over all codes for the specified parameter conditions:

Theorem 5. *Consider the bursty erasure model for a given choice of $(c, d, z)$ satisfying all of the following five conditions:*

1) *$d$ is not a multiple of $c$;*
2) *$c \leq z \leq d - c$;*
3) *$d$ is not a multiple of $d - z$;*
4) *$z < d - z$; and*
5) *$z$ is a multiple of $r'$, where*

$$r' \triangleq r_{d-z,z} \in \{1, \ldots, z\}.$$

*Let $\mathcal{C}$ be a systematic block code that encodes a given vector of $d - z$ information symbols $\mathbf{a} = (a[1], \ldots, a[d-z])$ as a codeword vector of $d$ symbols $(a[1], \ldots, a[d-z], b[1], \ldots, b[z])$, where each symbol has a normalized size of $\frac{1}{d}$, and the parity symbol $b[i]$ is given by*

$$b[i] = g_i(\mathbf{a}) \triangleq \left( \bigoplus_{k=1}^{\frac{d-z-r'}{z}} a[(k-1)z+i] \right) \oplus a[d-z-r'+r_{i,r'}]$$

*for each $i \in \{1, \ldots, z\}$, where $\oplus$ denotes bit-wise modulo-2 addition (i.e., exclusive-or). The diagonally interleaved code (Section III-B) derived from $\mathcal{C}$ is asymptotically optimal over all codes in the following sense: it achieves a message size of $\frac{d-z}{d}c$, which is equal to the asymptotic maximum achievable message size $\lim_{n \to \infty} s_n^B$.*

Figure 7:
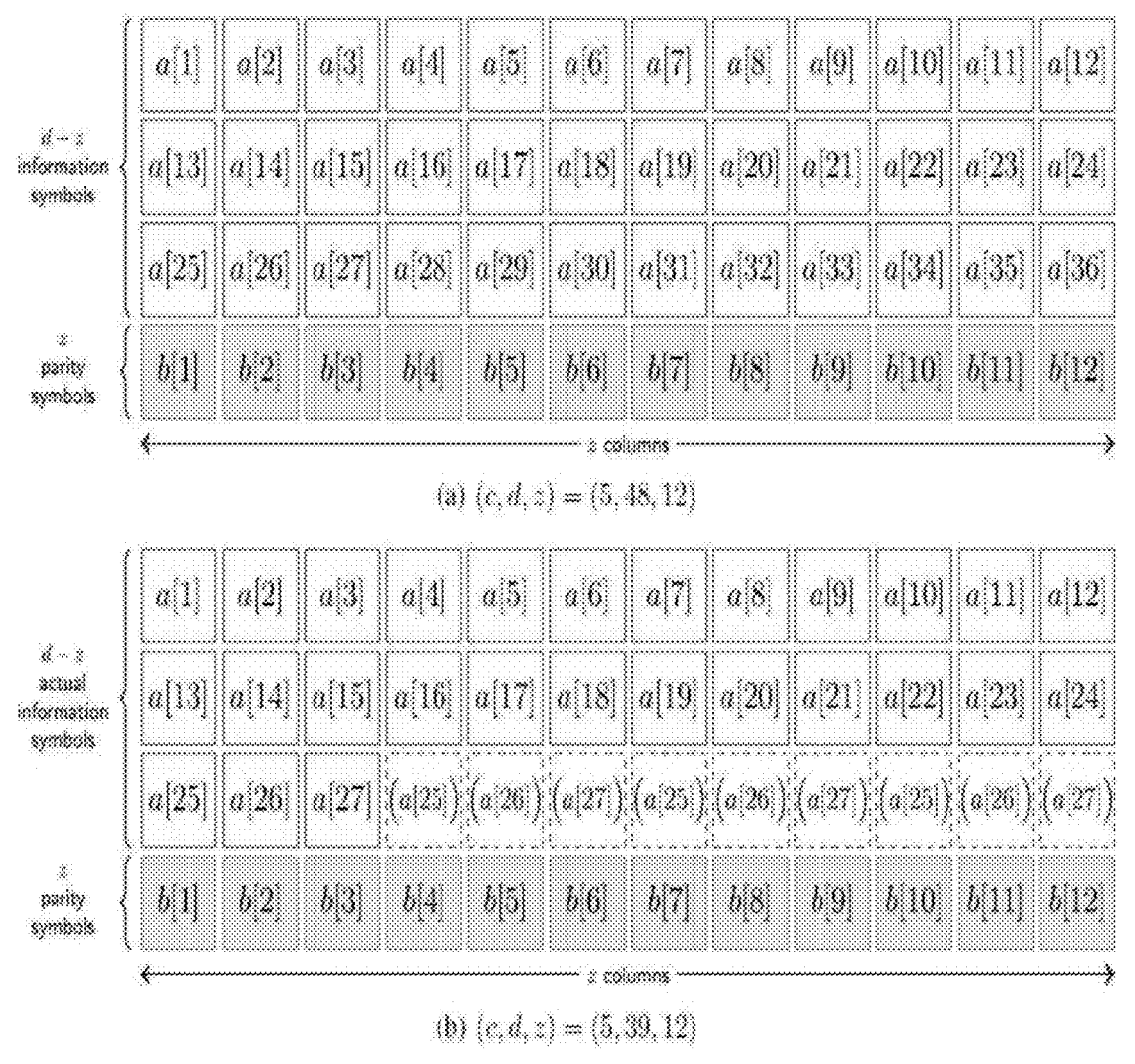

The systematic block code $\mathcal{C}$ of Theorem 5 is illustrated in Fig. 7 for two instances of $(c, d, z)$. The following example demonstrates that in this case, intrasession coding can be strictly suboptimal:

ANNEX A1

Example 2 (Suboptimality of Intrasession Coding). Suppose that $(c,d,z) = (2,5,2)$. For $n = 9$, the maximum message size that can be achieved by an intrasession code has an upper bound of $s < 1.193$; such a bound can be found by solving a linear program for a subset of erasure patterns in $\mathcal{E}_n^B$ (namely, those with alternating intervals of $z$ erased time steps and $d-z$ unerased time steps). The same upper bound also holds for $n > 9$ because any message size that can be achieved for a larger number of messages can also be achieved for a smaller number of messages (we simply apply the same code and ignore the additional messages and packets). On the other hand, the diagonally interleaved code derived from the systematic block code $\mathcal{C}$ of Theorem 5 achieves a strictly larger message size of $s = \frac{6}{5} = 1.2$.

Theorem 6. *Consider the bursty erasure model for a given choice of $(c,d,z)$ satisfying all of the following five conditions:*

1) *$d$ is not a multiple of $c$;*
2) *$c \leq z \leq d - c$;*
3) *$d$ is not a multiple of $d - z$;*
4) *$z > d - z$; and*
5) *$z'$ is a multiple of $r'$, where*

$$z' \triangleq r_{z,d-z} \in \{1, \ldots, d-z-1\},$$

$$r' \triangleq r_{d-z,z'} \in \{1, \ldots, z'\}.$$

*Let $\mathcal{C}$ be a systematic block code that encodes a given vector of $d - z$ information symbols $\mathbf{a} = (a[1], \ldots, a[d-z])$ as a codeword vector of $d$ symbols $(a[1], \ldots, a[d-z], b[1], \ldots, b[z])$, where each symbol has a normalized size of $\frac{1}{d}$, and the parity symbol $b[i]$ is given by*

$$b[i] = g_i(\mathbf{a}) \triangleq \begin{cases} \left(\bigoplus_{k=1}^{\frac{d-z-r'}{z'}} a[(k-1)z'+i]\right) \oplus a[d-z-r'+r_{i,r'}] & \text{if } i \in \{1, \ldots, z'\}, \\ a[r_{i-z',d-z}] & \text{if } i \in \{z'+1, \ldots, z\} \end{cases}$$

*for each $i \in \{1, \ldots, z\}$, where $\oplus$ denotes bit-wise modulo-2 addition (i.e., exclusive-or). The diagonally interleaved code (Section III-B) derived from $\mathcal{C}$ is asymptotically optimal over all codes in the following sense: it achieves a message size of $\frac{d-z}{d}c$, which is equal to the asymptotic maximum achievable message size $\lim_{n \to \infty} s_n^B$.*

Figure 8A:
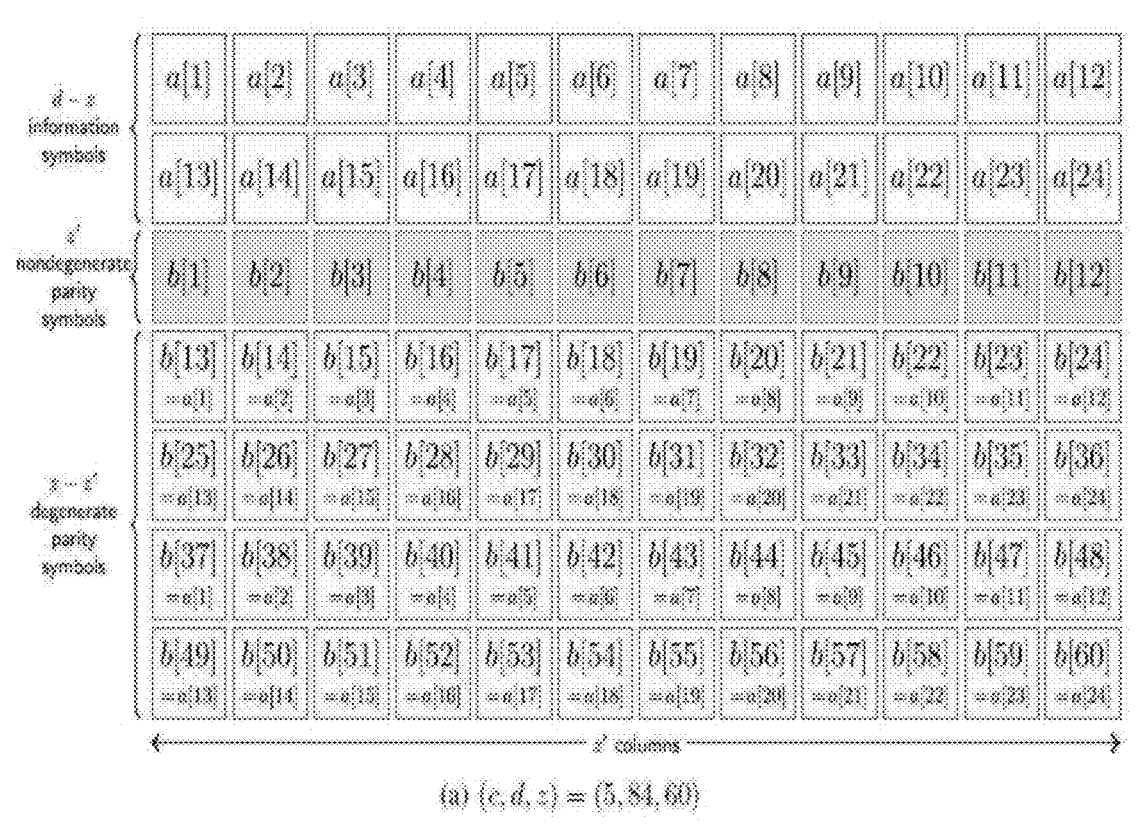
Figure 8B:
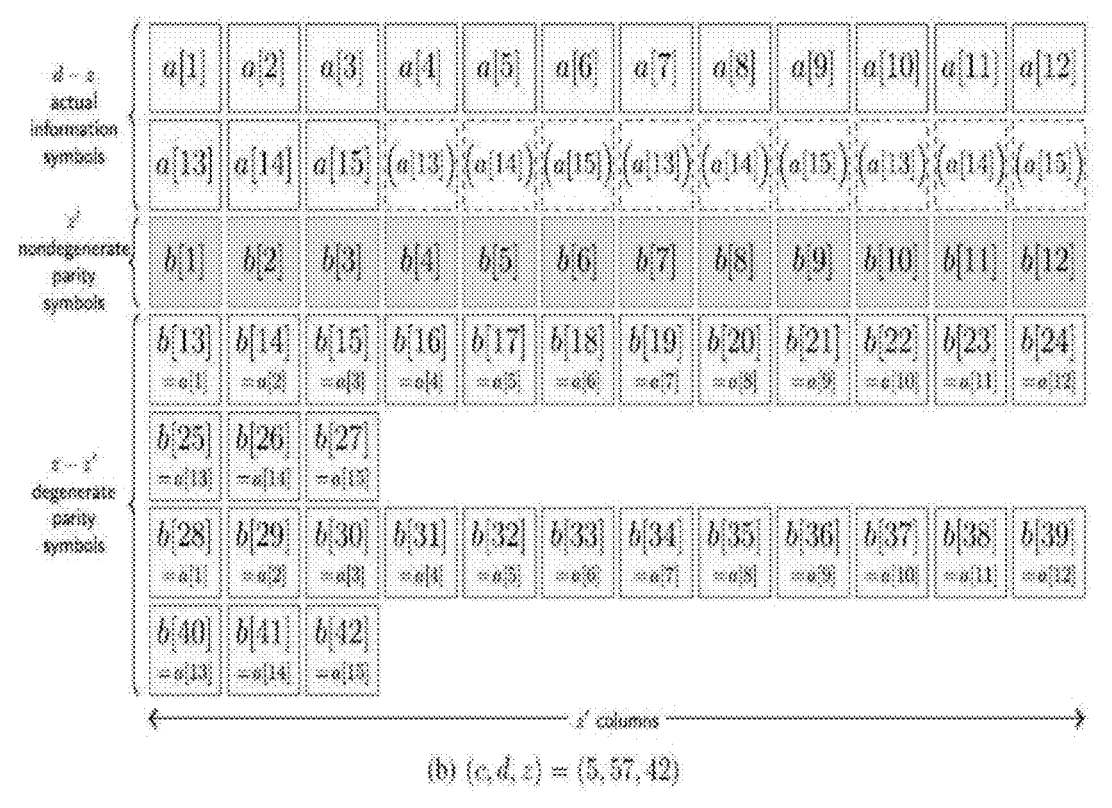

The systematic block code $\mathcal{C}$ of Theorem 6 is illustrated in Fig. 8 for two instances of $(c,d,z)$. Note that there are two types of parity symbols in $\mathcal{C}$: $b[1], \ldots, b[z']$ are nondegenerate parity symbols, while

ANNEX A1

$b[z'+1], \ldots, b[z]$ are degenerate parity symbols which are just uncoded copies of information symbols. The following example demonstrates that in this case, intrasession coding can be strictly suboptimal:

Example 3 (Suboptimality of Intrasession Coding, cf. Example 2). Suppose that $(c, d, z) = (3, 8, 5)$. For $n \geq 10$, the maximum message size that can be achieved by an intrasession code has an upper bound of $s < 1.118$. On the other hand, the diagonally interleaved code derived from the systematic block code $C$ of Theorem 6 achieves a strictly larger message size of $s = \frac{9}{8} = 1.125$.

VI. IID Erasure Model

For the third erasure model, each packet transmitted over the link is erased independently with the same probability $p_e$. For brevity, let $S_k$ denote the success event "message $k$ is decodable by its decoding deadline, i.e., time step $(k-1)c + d$", and let $\overline{S_k}$ denote the complementary failure event. We restrict our attention to time-invariant codes here in the interest of practicality.

Consider the i.i.d. erasure model for a given choice of $(c, d, p_e, s)$. We shall adopt the *decoding probability* $\mathbb{P}[S_k]$, i.e., the probability that a given message $k$ is decodable by its decoding deadline, as the primary performance metric. The decoder memory size is assumed to be unbounded so that the decoder has access to all received packets. Let the random subset $U_k \subseteq T_k$ be the unerased time steps that are no later than the decoding deadline for message $k$; the received packets that can be used by the decoder for decoding message $k$ are therefore given by $X[U_k]$. Consequently, the decoding probability $\mathbb{P}[S_k]$, where $k \in \mathbb{Z}^+$, can be expressed in terms of $U_k$ as follows:

$$\mathbb{P}[S_k] = \mathbb{P}\left[H\left(M_k \mid X[U_k]\right) = 0\right]$$
$$= \sum_{U_k \subseteq T_k} \mathbb{1}\left[H\left(M_k \mid X[U_k]\right) = 0\right] \cdot (1 - p_e)^{|U_k|} (p_e)^{|T_k| - |U_k|}. \quad (1)$$

By combining the proof techniques of Lemma 5 and [20, Lemma 1], we can derive an upper bound on the decoding probability $\mathbb{P}[S_k]$ for any time-invariant code:

Theorem 7. *Consider the i.i.d. erasure model for a given choice of $(c, d, p_e, s)$. For any time-invariant code with encoder memory size $m_E$, the probability that a given message $k \geq m_E$ is decodable by its decoding deadline is upper-bounded as follows:*

$$\mathbb{P}[S_k] \leq \sum_{z=0}^{d} \left[\min\left(\frac{(d-z)c}{ds}, 1\right) \binom{d}{z}\right] (1 - p_e)^{d-z} (p_e)^z. \quad (2)$$

Note that the decoding probability $\mathbb{P}[S_k]$ for the early messages $k < m_E$ can potentially be higher than that for the subsequent messages $k \geq m_E$ because the decoder already knows the nonpositive messages (which are assumed to be zeros).

ANNEX A1

For real-time streaming applications that are sensitive to bursts of decoding failures, it may be useful to adopt the *burstiness of undecodable messages* as a secondary performance metric. One way of measuring this burstiness is to compute the conditional probability $\mathbb{P}\left[\overline{S_{k+1}} \mid \overline{S_k}\right]$, i.e., the conditional probability that the next message is undecodable by its decoding deadline given that the current message is undecodable by its decoding deadline. The higher this conditional probability is, the more likely it is to remain "stuck" in a burst of undecodable messages.

In Section VI-A, we discuss the problem of finding an optimal time-invariant intrasession code, and evaluate the performance of symmetric intrasession codes. In Section VI-B, we conduct a simulation study to compare symmetric intrasession codes against a family of random time-invariant convolutional codes.

A. Performance of Symmetric Intrasession Codes

For any time-invariant intrasession code (Section III-A), the decoding probability $\mathbb{P}[S_k]$, where $k \in \mathbb{Z}^+$, can be written in terms of the block sizes or allocation $(x_1, \ldots, x_{m_E c})$ as $$\mathbb{P}[S_k] = \sum_{U \subseteq \{1, \ldots, d'\}} \mathbb{1}\left[\sum_{i \in U} x_i \geq s\right] \cdot (1 - p_e)^{|U|} (p_e)^{d' - |U|},$$

where $d' \triangleq \min(d, m_E c)$. Since $\mathbb{P}[S_k]$ is constant wrt $k \in \mathbb{Z}^+$, we can drop the index $k$ and consider $\mathbb{P}[S] \triangleq \mathbb{P}[S_1]$ instead.

For a given choice of $(c, d, p_e, s, m_E)$, our objective is to find a time-invariant intrasession code, as specified by the allocation $(x_1, \ldots, x_{m_E c})$, that maximizes the decoding probability $\mathbb{P}[S]$. This optimization problem can be expressed explicitly as follows:

$\Pi(c, d, p_e, s, m_E)$ :

$$\underset{x_1, \ldots, x_{m_E c}}{\text{maximize}} \sum_{U \subseteq \{1, \ldots, d'\}} \mathbb{1}\left[\sum_{i \in U} x_i \geq s\right] \cdot (1 - p_e)^{|U|} (p_e)^{d' - |U|}$$

subject to $$\sum_{\substack{i \in \{1, \ldots, m_E c\}: \\ r_{i,c} = j}} x_i \leq 1 \quad \forall j \in \{1, \ldots, c\},$$

$$x_i \geq 0 \quad \forall i \in \{1, \ldots, m_E c\},$$

where $$d' = \min(d, m_E c).$$

For the special case of $c = 1$, this problem reduces to the independent probabilistic access variation of the distributed storage allocation problem [20, Section II], with number of nodes $n = d'$, access probability $p = 1 - p_e$, and budget $T = 1/s$. As demonstrated in [20, Sections I-A and II], the optimal allocation can

ANNEX A1 have nonintuitive structure and can be difficult to find in general. Dividing the unit packet size evenly among $m$ out of the $m_E$ most recent messages, where $m \in \{1, \ldots, m_E\}$, may not necessarily produce an optimal allocation. For example, given $c = 1$, $d \geq m_E = 4$, $p_e < \frac{1}{2}$, and $\frac{1}{3} < s \leq \frac{2}{5}$, the allocation $\left(\frac{2}{5}, \frac{1}{5}, \frac{1}{5}, \frac{1}{5}\right)$, which is optimal, achieves a strictly higher decoding probability than $(1, 0, 0, 0)$, $\left(\frac{1}{2}, \frac{1}{2}, 0, 0\right)$, $\left(\frac{1}{3}, \frac{1}{3}, \frac{1}{3}, 0\right)$, and $\left(\frac{1}{4}, \frac{1}{4}, \frac{1}{4}, \frac{1}{4}\right)$.

Given the difficulty of finding the optimal time-invariant intrasession code, we shall restrict our attention to the family of symmetric intrasession codes (Section III-A).

*1) Decoding Probability:* Consider the decodability of a given message $k \in \mathbb{Z}^+$ for the symmetric code with spreading parameter $m$. Suppose that $V_S$ small blocks and $V_B$ big blocks that encode message $k$ are received by the decoder; $V_S$ and $V_B$ are independent binomial random variables with the following distributions:

$$V_S \sim \text{Binomial}\big((q_{m,c} + 1)r_{m,c}, 1 - p_e\big),$$

$$V_B \sim \text{Binomial}\big(q_{m,c}(c - r_{m,c}), 1 - p_e\big).$$

The decoding probability $\mathbb{P}[S]$ can therefore be expressed in terms of these random variables as follows:

$$\mathbb{P}[S] = \begin{cases} \mathbb{P}\left[\dfrac{1}{q_{m,c}+1} V_S \geq s\right] & \text{if } r_{m,c} = c, \\ \mathbb{P}\left[\dfrac{1}{q_{m,c}+1} V_S + \dfrac{1}{q_{m,c}} V_B \geq s\right] & \text{otherwise} \end{cases}$$

$$= \begin{cases} \mathbb{P}\left[V_S \geq \lceil s(q_{m,c}+1) \rceil\right] & \text{if } r_{m,c} = c, \\ \displaystyle\sum_{v_S} \mathbb{P}[V_S = v_S] \cdot \mathbb{P}\left[V_B \geq \left\lceil \left(s - \dfrac{v_S}{q_{m,c}+1}\right) q_{m,c} \right\rceil\right] & \text{otherwise.} \end{cases}$$

Figure 9:
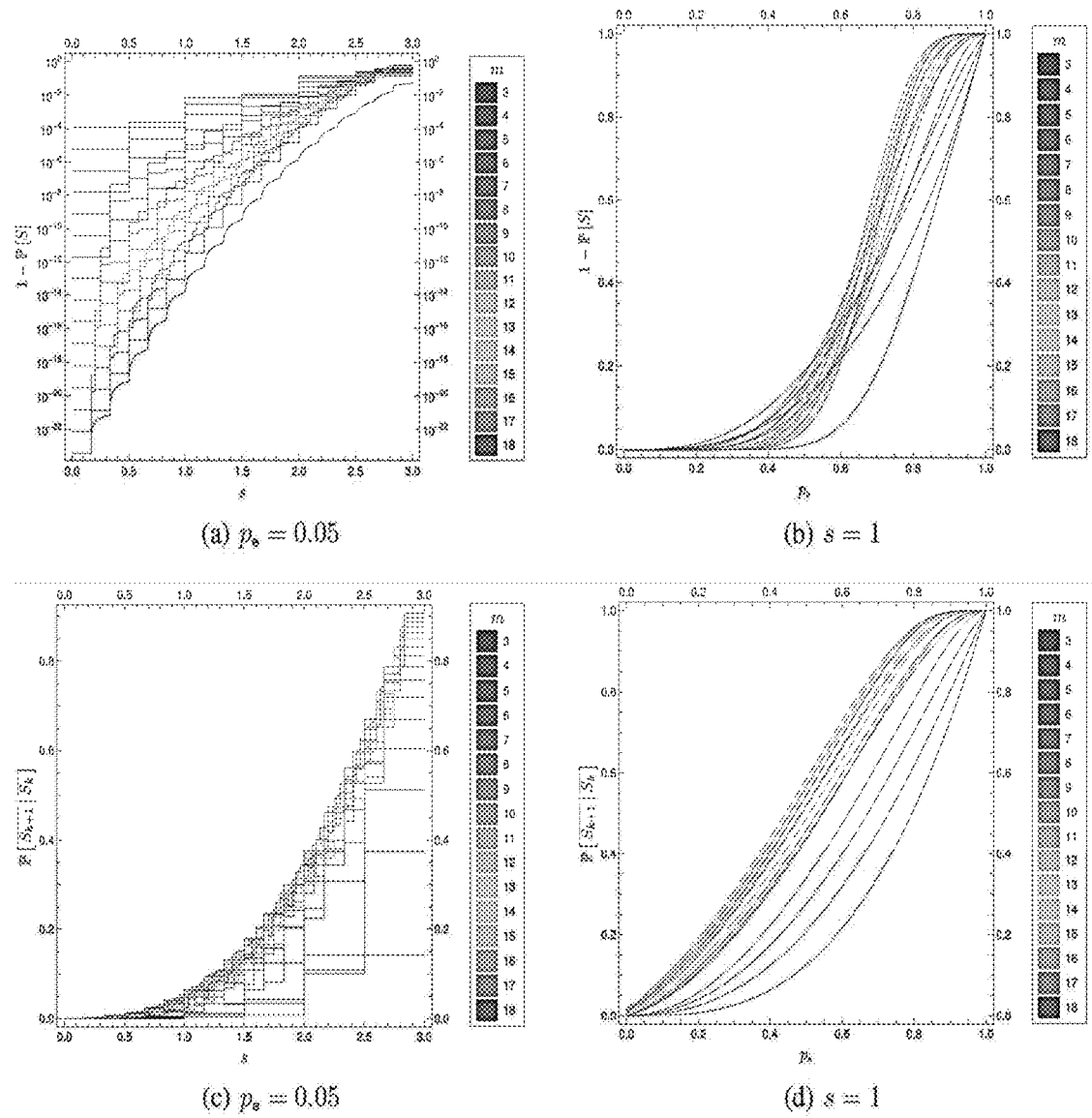
FIG. 9 shows plots of a decoding failure probability $1-\mathbb{P}[S]$ and the burstiness of undecodable messages as measured by the conditional probability $\mathbb{P}[\overline{S_{k+1}}|\overline{S_k}]$, where $k \in \mathbb{Z}^+$, against message size s and packet erasure probability $p_e$, for the family of symmetric intra-session codes, for (c, d, $m_E$)=(3, 18, 6). In cases (a) and (c), $p_e$=0.05. In cases (b) and (d), s=1. Spreading parameter m∈{c, . . . , d'}, where d'=min(d, $m_E$c)=18, gives the size of the effective coding window for each code. The bottommost solid curve in cases (a) and (b) describes a lower bound on the decoding failure probability for any time-invariant code, as given by Theorem 7 of Annex A1.

Figs. 9a and 9b show how the family of symmetric codes perform in terms of the decoding probability $\mathbb{P}[S]$, for an instance of $(c, d, m_E)$. These plots and other empirical observations suggest that maximal spreading (i.e., $m = d'$) performs well, i.e., achieves a relatively high $\mathbb{P}[S]$, when the message size $s$ and the packet erasure probability $p_e$ are small, while minimal spreading (i.e., $m = c$) performs well when $s$ and $p_e$ are large (this echoes the analytical findings of [20, Section II-C]). Furthermore, although this family of codes may not always contain an optimal time-invariant intrasession code, we can find good codes with decoding probabilities close to the upper bound of Theorem 7 among them when $s$ and $p_e$ are small.

*2) Burstiness of Undecodable Messages:* Consider the decodability of a given pair of consecutive messages $k$ and $k + 1$, where $k \in \mathbb{Z}^+$, for the symmetric code with spreading parameter $m$. The $2m$

ANNEX A1 blocks that encode the pair of messages are spread over the $m + c$ time steps in the union of the two effective coding windows, i.e., $$\{(k-1)c + 1, \ldots, kc + m\}.$$

These time steps can be partitioned into the following three intervals:

1) $\{(k-1)c + 1, \ldots, (k-1)c + c\}$, in which $c$ blocks that encode message $k$ and zero blocks that encode message $k + 1$ are transmitted;

2) $\{kc + 1, \ldots, (k-1)c + m\}$, in which $m - c$ blocks that encode message $k$ and $m - c$ blocks that encode message $k + 1$ are transmitted; and 3) $\{(k-1)c + m + 1, \ldots, kc + m\}$, in which zero blocks that encode message $k$ and $c$ blocks that encode message $k + 1$ are transmitted.

Suppose that $V_S^{(1)}$ small blocks and $V_B^{(1)}$ big blocks that encode message $k$ are received by the decoder in the first interval, $V_S^{(2)}$ small blocks and $V_B^{(2)}$ big blocks that encode message $k$ are received by the decoder in the second interval (the same numbers of blocks that encode message $k + 1$ are also received in the same interval), and $V_S^{(3)}$ small blocks and $V_B^{(3)}$ big blocks that encode message $k + 1$ are received by the decoder in the third interval; $V_S^{(1)}$, $V_B^{(1)}$, $V_S^{(2)}$, $V_B^{(2)}$, $V_S^{(3)}$, and $V_B^{(3)}$ are independent binomial random variables with the following distributions:

$$V_S^{(1)} \sim \text{Binomial}(r_{m,c}, 1 - p_e),$$

$$V_B^{(1)} \sim \text{Binomial}(c - r_{m,c}, 1 - p_e),$$

$$V_S^{(2)} \sim \text{Binomial}(q_{m,c} r_{m,c}, 1 - p_e),$$

$$V_B^{(2)} \sim \text{Binomial}((q_{m,c} - 1)(c - r_{m,c}), 1 - p_e),$$

$$V_S^{(3)} \sim \text{Binomial}(r_{m,c}, 1 - p_e),$$

$$V_B^{(3)} \sim \text{Binomial}(c - r_{m,c}, 1 - p_e).$$

The conditional probability $\mathbb{P}\left[\overline{S_{k+1}} \mid \overline{S_k}\right]$ can therefore be expressed in terms of these random variables as follows:

$$\mathbb{P}\left[\overline{S_{k+1}} \mid \overline{S_k}\right]$$

ANNEX A1

$$= \begin{cases} \mathbb{P}\left[\frac{1}{q_{m,c}+1}\left(V_S^{(2)}+V_S^{(3)}\right) < s \mid \frac{1}{q_{m,c}+1}\left(V_S^{(1)}+V_S^{(2)}\right) < s\right] \\ \qquad\qquad\qquad\qquad\qquad\qquad\qquad \text{if } r_{m,c} = c, \\ \mathbb{P}\left[\begin{array}{l}\frac{1}{q_{m,c}+1}\left(V_S^{(2)}+V_S^{(3)}\right) + \frac{1}{q_{m,c}}\left(V_B^{(2)}+V_B^{(3)}\right) < s \\ \frac{1}{q_{m,c}+1}\left(V_S^{(1)}+V_S^{(2)}\right) + \frac{1}{q_{m,c}}\left(V_B^{(1)}+V_B^{(2)}\right) < s\end{array}\right] \\ \qquad\qquad\qquad\qquad\qquad\qquad\qquad \text{otherwise.} \end{cases}$$

Figs. 9c and 9d show how the family of symmetric codes perform in terms of the burstiness of undecodable messages as measured by the conditional probability $\mathbb{P}\left[\overline{S_{k+1}} \mid \overline{S_k}\right]$, for an instance of $(c, d, m_E)$. These plots and other empirical observations suggest that over a wide range of message sizes $s$ and packet erasure probabilities $p_e$, minimal spreading (i.e., $m = c$) performs well, i.e., achieves a relatively low $\mathbb{P}\left[\overline{S_{k+1}} \mid \overline{S_k}\right]$, while maximal spreading (i.e., $m = d'$) performs poorly. This agrees with the intuition that for a pair of consecutive messages, a greater overlap in their effective coding windows would tend to increase the correlation between their decodabilities. In the case of minimal spreading (i.e., $m = c$), the decodability of a message is independent of the decodability of other messages because the effective coding windows do not overlap at all.

*3) Trade-off between Performance Metrics:* Our results show that for the family of symmetric codes, a trade-off exists between the decoding probability $\mathbb{P}[S]$ and the burstiness of undecodable messages as measured by the conditional probability $\mathbb{P}\left[\overline{S_{k+1}} \mid \overline{S_k}\right]$ when the message size $s$ and packet erasure probability $p_e$ are small (this is a regime of interest because it supports a high decoding probability). Specifically, although maximal spreading (i.e., $m = d'$) achieves a high decoding probability, it also exhibits a higher burstiness of undecodable messages. Thus, a symmetric code with a suboptimal decoding probability but lower burstiness may be preferred for an application that is sensitive to bursty undecodable messages.

*B. Simulation Study: Symmetric Intrasession Codes vs. Random Time-Invariant Convolutional Codes*

In this section, we compare the family of symmetric intrasession codes (Section III-A) against a family of *random time-invariant convolutional codes*, for the special case of unit-size messages, i.e., $s = 1$. These random convolutional codes are constructed as follows: for each code, we specify a finite field $GF(q)$ and a *mixing parameter* $r \in \{1, \ldots, m_E\}$, and set each encoding function $f_i$, $i \in \{1, \ldots, c\}$, to a random linear combination of the most recent $r$ messages (taken symbol-wise), i.e., $$f_i(M_k, M_{k-1}, \ldots, M_{k-m_E+1}) \triangleq \sum_{j=1}^{r} \omega_j^{(i)} M_{k-j+1},$$

ANNEX A1 where each coefficient $\omega_j^{(i)}$, $i \in \{1, \ldots, c\}$, $j \in \{1, \ldots, r\}$, is independently selected uniformly at random from the set $\{0, 1, \ldots, q-1\}$. To determine the decodability of each message in our simulation, the decoder attempts to solve for the unknown message at the corresponding decoding deadline by applying Gauss-Jordan elimination to the matrix of coefficients collected from all unerased packets received up to that time step.

Prior work analyzed similar convolutional codes over GF(2) for $(c, m_E) = (2, 3)$ and $(2, 4)$, adopting the expected message decoding delay as the performance metric; combinatorial code properties were defined and used by the author to find good codes with low latency. Similar linear time-invariant binary codes were also examined by Sukhavasi [6] for the binary erasure channel operating at the bit level; the author presented a random construction that is anytime reliable (i.e., the message decoding failure probability decays exponentially with delay) with high probability.

*1) Simulation Setup:* Setting $(c, d, s, m_E) = (2, 5, 1, 8)$, we evaluated the performance of the two families of codes

- symmetric intrasession codes, with spreading parameter $m \in \{c, \ldots, d'\} = \{2, 3, 4, 5\}$; and
- random time-invariant convolutional codes, over finite fields of size $q \in \{2, 16, 256\}$ and with mixing parameter $r \in \{2, 4, 8\}$, under three erasure scenarios

- low-erasure scenario, with $p_e = 0.1$;
- medium-erasure scenario, with $p_e = 0.3$; and
- high-erasure scenario, with $p_e = 0.5$.

We considered two time horizons

- long time horizon, with the receiver attempting to decode 10 000 consecutive messages; and
- short time horizon, with the receiver attempting to decode 20 consecutive messages, and two joining times for the receiver

- at the beginning of the stream, with message 1 as the first message to be decoded; and
- midway through the stream, with a high-numbered message as the first message to be decoded.

A total of 100 and 500 random convolutional codes were generated for the long and short time horizons, respectively, for each choice of $(q, r)$. A total of 100 and 500 random erasure patterns of the appropriate length were generated for the long and short time horizons, respectively, for each erasure scenario. We computed the following two performance metrics for each simulation run:

- decoding probability, given by the fraction $$\frac{\text{number of messages that are decodable by their decoding deadlines}}{\text{total number of messages } n}; \text{ and}$$

ANNEX A1

- burstiness of undecodable messages as measured by the conditional probability that the next message is undecodable by its decoding deadline given that the current message is undecodable by its decoding deadline, given by the fraction $$\frac{\text{number of message pairs } (k, k+1), \text{ where } k \in \{1, \ldots, n-1\}, \text{ for which}}{\text{number of message pairs } (k, k+1), \text{ where } k \in \{1, \ldots, n-1\}, \text{ for which}}.$$

(numerator: both messages $k$ and $k+1$ are undecodable by their decoding deadlines; denominator: message $k$ is undecodable by its decoding deadline)

Figure 10:
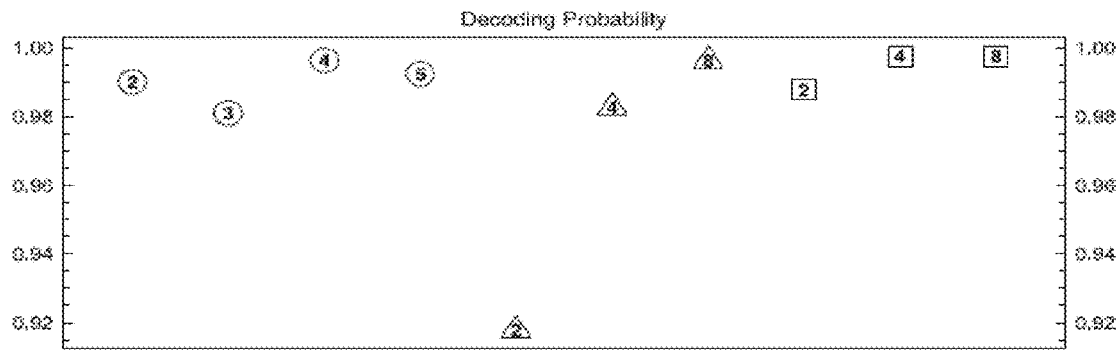
FIG. 10 shows simulation results for a low-erasure scenario ($p_e$=0.1), with (c, d, s, $m_E$)=(2, 5, 1, 8). Each data point indicates a mean value taken over all randomly generated codes and erasure patterns.
Figure 10:
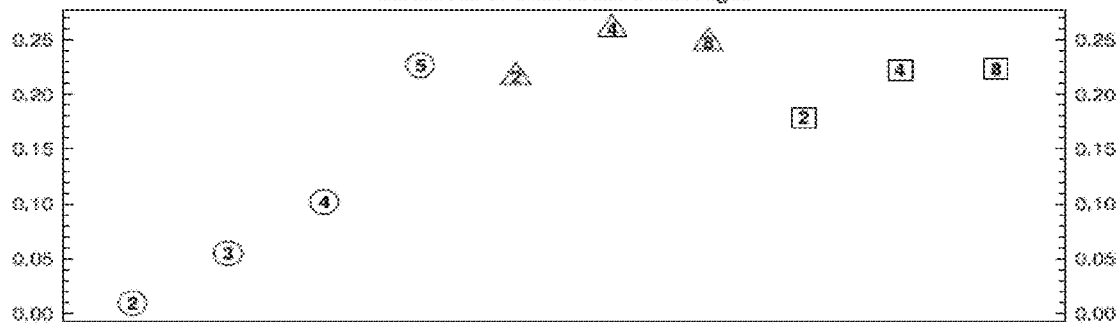
Figure 10:
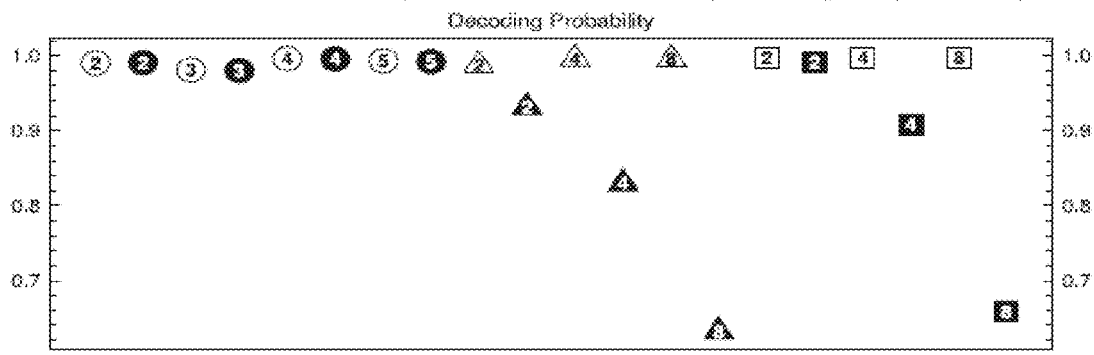
Figure 11:
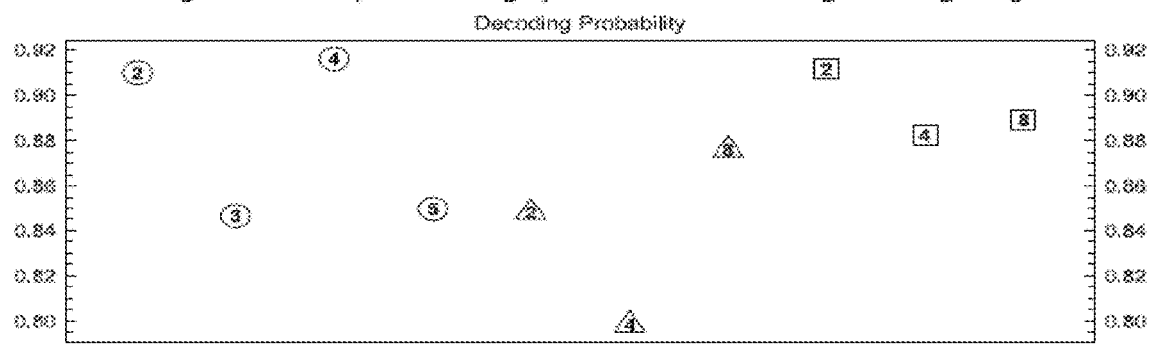
FIG. 11 shows simulation results for a medium-erasure scenario ($p_e$=0.3), with (c, d, s, $m_E$)=(2, 5, 1, 8). Each data point indicates a mean value taken over all randomly generated codes and erasure patterns.
Figure 11:
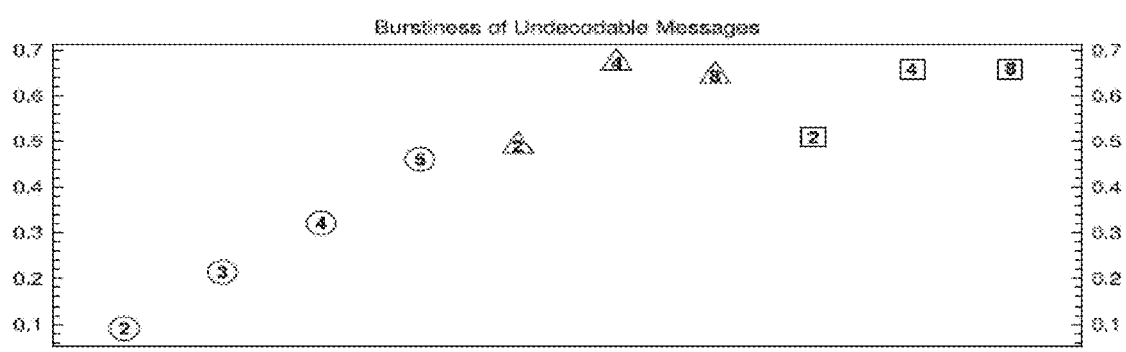
Figure 11:
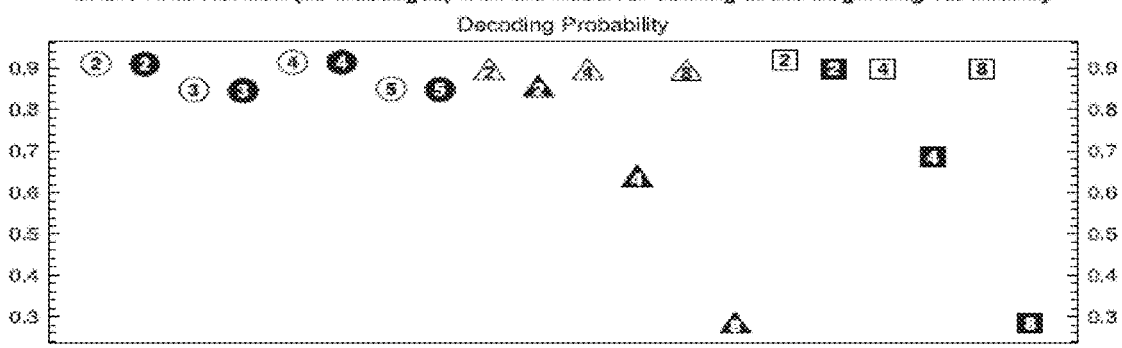
Figure 12:
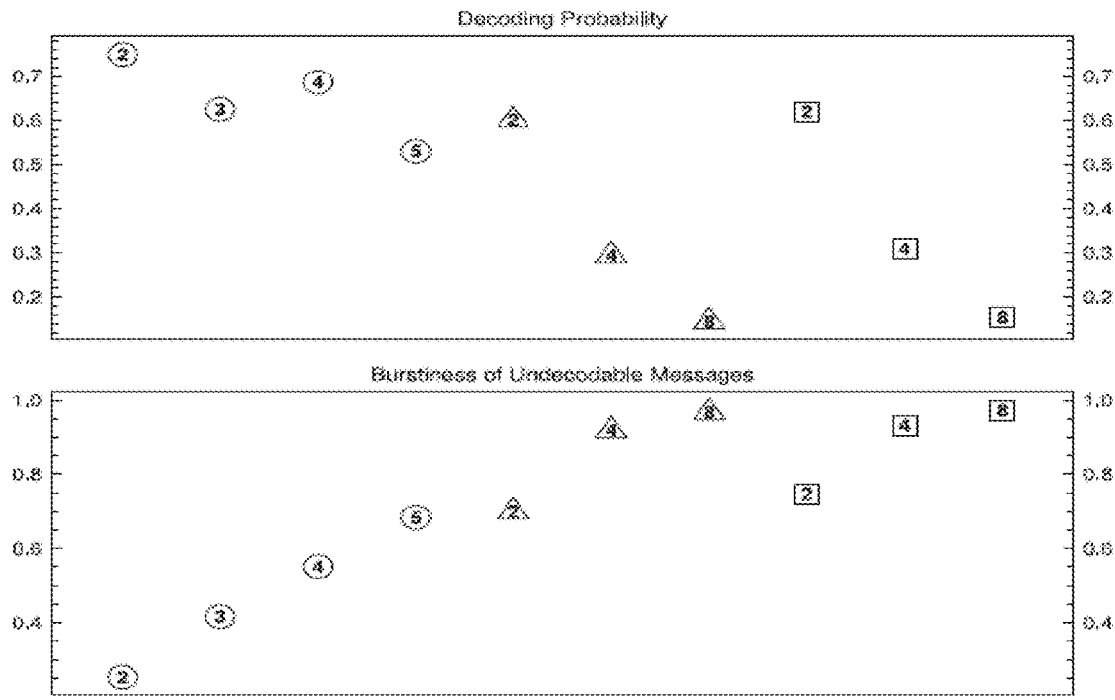
FIG. 12 shows simulation results for a high-erasure scenario ($p_e$=0.5), with (c, d, s, $M_E$)=(2, 5, 1, 8). Each data point indicates a mean value taken over all randomly generated codes and erasure patterns.
Figure 12:
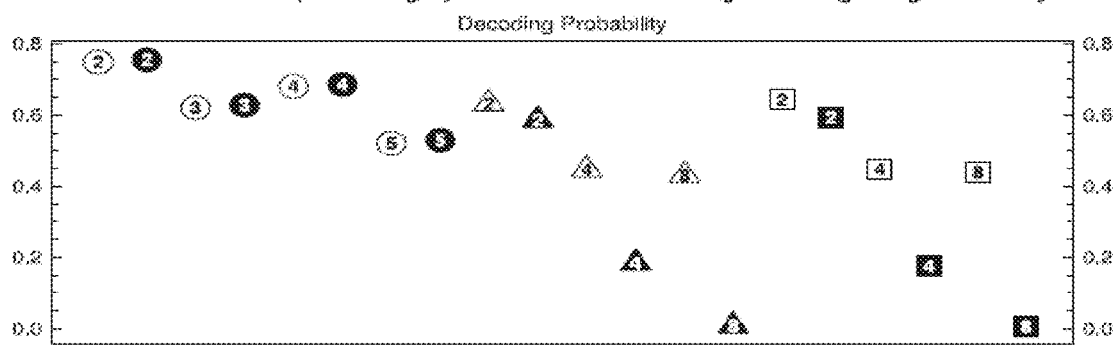

*2) Simulation Results and Discussion:* Figs. 10, 11, and 12 summarize the simulation results obtained under each of the three erasure scenarios. Results for the random convolutional codes over $GF(2)$ have been omitted from the plots because of their poor performance.

*Optimal Symmetric Codes.* We observe a phase transition in the optimal symmetric code in terms of the decoding probability: near-maximal spreading (i.e., $m = 4$) performed best for both the low-erasure and medium-erasure scenarios, whereas minimal spreading (i.e., $m = 2$) performed best for the high-erasure scenario. Also, for all three erasure scenarios, the smaller the amount of spreading (as measured by $m$), the better the performance in terms of the burstiness of undecodable messages. These findings are consistent with the analytical observations of Section VI-A.

*Effect of Finite Field Size $q$ on Random Convolutional Codes.* For the long time horizon, we observe that increasing the finite field size $q$ improved the decoding probability, especially when the packet erasure probability $p_e$ and mixing parameter $r$ are small. A larger finite field size increases the likelihood that a received packet is innovative (i.e., it is not a linear combination of previously received packets); however, this advantage is diluted if too few packets are received in the first place, or if each packet already combines many messages (in both cases, each received packet is already likely to be innovative).

*Effect of Mixing Parameter $r$ on Random Convolutional Codes.* For the long time horizon, we observe that increasing the mixing parameter $r$ produced a mixed effect on the decoding probability: it was improved for the low-erasure scenario, but was worsened for the high-erasure scenario; for the medium-erasure scenario, the decoding probability was initially worsened but subsequently improved. Mixing more messages in each packet makes the packet useful for the decoding of more messages, but more packets are also required to decode a given message. The former positive effect is dominant for the low-erasure scenario, while the latter negative effect is dominant for the high-erasure scenario.

*Effect of Receiver Joining Time.* For the short time horizon, we observe that the receiver joining time had a negligible effect on the performance of symmetric codes. The robustness of symmetric codes can be explained by the fact that the decodability of each message depends only on the packets received within a very recent and short effective coding window of $m$ time steps. The performance of the random

ANNEX A1 convolutional codes, on the other hand, was sensitive to the receiver joining time. In particular, the receiver joining the stream midway achieved a significantly worse decoding probability than the receiver joining the stream at the beginning; furthermore, the gap in their performance increased with the mixing parameter $r$. These effects can be explained by the *a priori* knowledge of previous messages transmitted before joining the stream, which can be beneficial in decoding subsequent messages: a receiver joining at the beginning would have perfect knowledge of the previous (nonpositive) messages (which are assumed to be zeros), while a receiver joining midway would not have the benefit of this knowledge; furthermore, the larger the value of $r$, the more difficult decoding is for the latter receiver because each packet is a combination of more unknown messages.

*Symmetric Codes vs. Random Convolutional Codes.* For the long time horizon, the highest decoding probability was achieved by a symmetric code in two out of the three erasure scenarios; for the low-erasure scenario, the optimal symmetric code performed only slightly worse than the optimal random convolutional code. Also, for each of the three erasure scenarios, the symmetric code with the highest decoding probability achieved a significantly better burstiness of undecodable messages than all the random convolutional codes. For the short time horizon with the receiver joining at the beginning vs. midway, symmetric codes also performed more robustly than the random convolutional codes.

In summary, while the family of symmetric codes may be suboptimal in certain cases, we can find, for a wide range of scenarios, symmetric codes that perform well in terms of both the decoding probability and the burstiness of undecodable messages.

The strengths and weaknesses of the two families of codes suggest that it may be beneficial to consider a hybrid code construction. One approach is to allocate the packet space between a symmetric code and a random convolutional code, and adjust the allocation depending on the operating regime. Another approach is to divide each message into smaller submessage blocks, and have each packet comprise multiple coded blocks that are random linear combinations of carefully chosen submessage blocks.

VII. CONCLUSION AND FUTURE WORK

We considered a real-time streaming problem for a packet erasure link, where each message must be decoded within a given delay from its creation time.

We showed that the symmetric intrasession code with spreading parameter $m = d$ is asymptotically optimal over all codes for both the coding window and sliding window variations of the window-based erasure model, and for the bursty erasure model when the maximum erasure burst length is sufficiently short or long. We also showed that diagonally interleaved codes derived from specific systematic block codes are asymptotically optimal over all codes for the bursty erasure model in several other cases.

ANNEX A1

For the i.i.d. erasure model, we derived an upper bound on the decoding probability for any time-invariant code. We also analyzed the performance of symmetric intrasession codes, and observed a phase transition in their relative performance in terms of the decoding probability: maximal spreading performs well when the message size $s$ and packet erasure probability $p_e$ are small, while minimal spreading performs well when $s$ and $p_e$ are large. In terms of the burstiness of undecodable messages, minimal spreading performs consistently well over a wide range of scenarios. Thus, a trade-off between the two performance metrics exists for this family of codes when $s$ and $p_e$ are small; this is also the regime in which maximal spreading achieves a decoding probability close to the derived upper bound. In a simulation study, these symmetric codes performed well against a family of random time-invariant convolutional codes under a number of scenarios.

The work in this paper can be extended in several directions. While optimal real-time streaming codes have been constructed for both variations of the window-based erasure model, such codes have yet to be found for the bursty erasure model in a number of cases, e.g., when $c - r_{d,c} < z < c$, or $d - c < z < d - r_{d,c}$, or when only the first four conditions of Theorems 5 and 6 are satisfied. The i.i.d. erasure model also offers many interesting problems for future work. In an effort to find the optimal code, it may be useful to consider hybrid code constructions that capture the strengths of both the symmetric intrasession codes and the random time-invariant convolutional codes that were examined in the simulation study.

APPENDIX
PROOFS OF THEOREMS

A. Proof of Lemma 1

Observe that $y$ is simply a vector containing the block sizes for each message, i.e., $\{x_i\}_{i=1}^d$, sorted in ascending order. Since $$\sum_{i \in U} x_i \geq \sum_{j=1}^{|U|} y_j \quad \forall\, U \subseteq \{1, \ldots, d\},$$

it follows that over any $\ell$ packets transmitted in the coding window $W_k$, the total size of the blocks allocated to message $k$ is at least $\sum_{j=1}^{\ell} y_j$. Therefore, assuming that an appropriate code is applied to the allocation, message $k$ is always decodable from any $\ell$ packets transmitted in $W_k$ as long as the message size $s$ does not exceed $\sum_{j=1}^{\ell} y_j$. ∎

B. Proof of Lemma 2

The stated partition can be constructed by assigning each time step $t \in T_n$ to the set $T_n^{(q_{i,c}c + r_{i,c})}$, where $$r_{i,c} = r_{t,c},$$

ANNEX A1

$$q_{i,c} = \begin{cases} q_{t,c} - \left\lfloor \frac{q_{t,c}}{q_{d,c}+1} \right\rfloor (q_{d,c} + 1) & \text{if } r_{t,c} \leq r_{d,c}, \\ q_{t,c} - \left\lfloor \frac{q_{t,c}}{q_{d,c}} \right\rfloor q_{d,c} & \text{if } r_{t,c} > r_{d,c}. \end{cases}$$

Note that index $q_{i,c} c + r_{i,c} \in \{1, \ldots, d\}$ since $q_{i,c} \in \{0, \ldots, q_{d,c}\}$ when $r_{i,c} \in \{1, \ldots, r_{d,c}\}$, and $q_{i,c} \in \{0, \ldots, q_{d,c} - 1\}$ when $r_{i,c} \in \{r_{d,c} + 1, \ldots, c\}$. To prove the required code properties, we consider two separate cases:

*Case 1:* Consider the set $T_n^{(i)}$ for a choice of $i$ satisfying $r_{i,c} \leq r_{d,c}$. Since each time step $t \in T_n^{(i)}$ can be expressed as $$t = \underbrace{(j(q_{d,c} + 1) + q_{i,c})}_{q_{t,c}} c + \underbrace{r_{i,c}}_{r_{t,c}} \triangleq t_j, \quad \text{where } j \in \mathbb{Z}_0^+,$$

it follows from the code construction that the set of active messages at each time step contains $q_{d,c} + 1$ messages, and is given by $$A_{t_j} = \left\{ \underbrace{j(q_{d,c}+1) + q_{i,c}}_{q_{t,c}} + 1 - q_{d,c}, \ldots, \underbrace{j(q_{d,c}+1) + q_{i,c}}_{q_{t,c}} + 1 \right\}.$$

The smallest time step in $T_n^{(i)}$ corresponds to the choice of $j = 0$, which produces $t_0 = q_{i,c} c + r_{i,c} = i$ and the set of active messages $$A_{t_0} = \{q_{i,c} + 1 - q_{d,c}, \ldots, q_{i,c} + 1\}.$$

Note that $A_{t_0}$ contains message 1 since $q_{i,c} \in \{0, \ldots, q_{d,c}\}$, which implies that $$q_{i,c} + 1 - q_{d,c} \leq 1 \leq q_{i,c} + 1.$$

At the other extreme, let the largest time step in $T_n^{(i)}$ correspond to the choice of $j = j'$; we therefore have $$t_{j'} \leq (n-1)c + d < t_{j'+1}, \tag{3}$$

and the final set of active messages $$A_{t_{j'}} = \{j'(q_{d,c} + 1) + q_{i,c} + 1 - q_{d,c}, \ldots, j'(q_{d,c} + 1) + q_{i,c} + 1\}.$$

From the first inequality of (3), we obtain $$\left(j'(q_{d,c} + 1) + q_{i,c}\right)c + r_{i,c} \leq (n - 1 + q_{d,c})c + r_{d,c}$$

$$\implies n \geq \left\lceil \frac{\left(j'(q_{d,c} + 1) + q_{i,c} + 1 - q_{d,c}\right)c + r_{i,c} - r_{d,c}}{c} \right\rceil$$

$$= j'(q_{d,c} + 1) + q_{i,c} + 1 - q_{d,c} + \left\lceil \frac{r_{i,c} - r_{d,c}}{c} \right\rceil$$

ANNEX A1

$$= j'(q_{d,c} + 1) + q_{i,c} + 1 - q_{d,c}, \qquad (4)$$

where the final step follows from the fact that $1 \leq r_{i,c} \leq r_{d,c} \leq c$, which implies that $$-1 < \frac{1-c}{c} \leq \frac{r_{i,c} - r_{d,c}}{c} \leq 0 \implies \left\lfloor \frac{r_{i,c} - r_{d,c}}{c} \right\rfloor = 0.$$

From the second inequality of (3), we obtain $$(n - 1 + q_{d,c})c + r_{d,c} \leq \big((j'+1)(q_{d,c}+1) + q_{i,c}\big)c + r_{i,c} - 1$$

$$\implies n \leq \left\lfloor \frac{((j'+1)(q_{d,c}+1) + q_{i,c} + 1 - q_{d,c})c + r_{i,c} - r_{d,c} - 1}{c} \right\rfloor$$

$$= (j'+1)(q_{d,c}+1) + q_{i,c} + 1 - q_{d,c} + \left\lfloor \frac{r_{i,c} - r_{d,c} - 1}{c} \right\rfloor$$

$$= j'(q_{d,c} + 1) + q_{i,c} + 1, \qquad (5)$$

where the final step follows from the fact that $1 \leq r_{i,c} \leq r_{d,c} \leq c$, which implies that $$-1 = \frac{1 - c - 1}{c} \leq \frac{r_{i,c} - r_{d,c} - 1}{c} \leq -\frac{1}{c} < 0$$

$$\implies \left\lfloor \frac{r_{i,c} - r_{d,c} - 1}{c} \right\rfloor = -1.$$

By combining inequalities (4) and (5), we arrive at $$j'(q_{d,c} + 1) + q_{i,c} + 1 - q_{d,c} \leq n \leq j'(q_{d,c} + 1) + q_{i,c} + 1,$$

which enables us to infer that $A_{t_{j'}}$ contains message $n$.

For any pair of consecutive time steps $t_j, t_{j+1} \in T_n^{(i)}$, where $$t_j = \big(j(q_{d,c} + 1) + q_{i,c}\big)c + r_{i,c},$$

$$t_{j+1} = \big((j + 1)(q_{d,c} + 1) + q_{i,c}\big)c + r_{i,c},$$

we observe that the smallest message in $A_{t_{j+1}}$ is exactly one larger than the largest message in $A_{t_j}$, i.e., $$(j + 1)(q_{d,c} + 1) + q_{i,c} + 1 - q_{d,c}$$

$$= j(q_{d,c} + 1) + q_{i,c} + 1 - q_{d,c} + q_{d,c} + 1$$

$$= \big(j(q_{d,c} + 1) + q_{i,c} + 1\big) + 1.$$

Thus, there are no overlapping or omitted messages among the sets of active messages corresponding to $T_n^{(i)}$. Property P1 therefore follows.

*Case 2:* Consider the set $T_n^{(i)}$ for a choice of $i$ satisfying $r_{i,c} > r_{d,c}$. Since each time step $t \in T_n^{(i)}$ can be expressed as $$t = \underbrace{(j\, q_{d,c} + q_{i,c})}_{q_{i,c}} c + \underbrace{r_{i,c}}_{r_{i,c}} \triangleq t_j, \quad \text{where } j \in \mathbb{Z}_0^+,$$

ANNEX A1 it follows from the code construction that the set of active messages at each time step contains $q_{d,c}$ messages, and is given by $$A_{t_j} = \{ \underbrace{j\, q_{d,c} + q_{i,c}}_{q_{t,c}} +1 - (q_{d,c} - 1), \ldots, \underbrace{j\, q_{d,c} + q_{i,c}}_{q_{t,c}} +1 \}.$$

The smallest time step in $T_n^{(i)}$ corresponds to the choice of $j = 0$, which produces $t_0 = q_{i,c}\, c + r_{i,c} = i$ and the set of active messages $$A_{t_0} = \{ q_{i,c} + 1 - (q_{d,c} - 1), \ldots, q_{i,c} + 1 \}.$$

Note that $A_{t_0}$ contains message 1 since $q_{i,c} \in \{0, \ldots, q_{d,c} - 1\}$, and therefore $$q_{i,c} + 1 - (q_{d,c} - 1) \le 1 \le q_{i,c} + 1.$$

At the other extreme, let the largest time step in $T_n^{(i)}$ correspond to the choice of $j = j'$; we therefore have $$t_{j'} \le (n - 1)c + d < t_{j'+1}, \tag{6}$$

and the final set of active messages $$A_{t_{j'}} = \{ j'\, q_{d,c} + q_{i,c} + 1 - (q_{d,c} - 1), \ldots, j'\, q_{d,c} + q_{i,c} + 1 \}.$$

From the first inequality of (6), we obtain $$(j'\, q_{d,c} + q_{i,c})c + r_{i,c} \le (n - 1 + q_{d,c})c + r_{d,c}$$
$$\implies n \ge \left\lceil \frac{(j'\, q_{d,c} + q_{i,c} + 1 - q_{d,c})c + r_{i,c} - r_{d,c}}{c} \right\rceil$$
$$= j'\, q_{d,c} + q_{i,c} + 1 - q_{d,c} + \left\lceil \frac{r_{i,c} - r_{d,c}}{c} \right\rceil$$
$$= j'\, q_{d,c} + q_{i,c} + 1 - (q_{d,c} - 1), \tag{7}$$

where the final step follows from the fact that $1 \le r_{d,c} < r_{i,c} \le c$, which implies that $$0 < \frac{r_{i,c} - r_{d,c}}{c} \le \frac{c - 1}{c} < 1 \implies \left\lceil \frac{r_{i,c} - r_{d,c}}{c} \right\rceil = 1.$$

From the second inequality of (6), we obtain $$(n - 1 + q_{d,c})c + r_{d,c} \le ((j' + 1)q_{d,c} + q_{i,c})c + r_{i,c} - 1$$
$$\implies n \le \left\lfloor \frac{((j'+1)q_{d,c} + q_{i,c} + 1 - q_{d,c})c + r_{i,c} - r_{d,c} - 1}{c} \right\rfloor$$
$$= (j' + 1)q_{d,c} + q_{i,c} + 1 - q_{d,c} + \left\lfloor \frac{r_{i,c} - r_{d,c} - 1}{c} \right\rfloor$$

ANNEX A1

$$= j' q_{d,c} + q_{i,c} + 1, \tag{8}$$

where the final step follows from the fact that $1 \leq r_{d,c} < r_{i,c} \leq c$, which implies that $$0 = \frac{1-1}{c} \leq \frac{r_{i,c} - r_{d,c} - 1}{c} \leq \frac{c-1-1}{c} < 1$$

$$\implies \left\lfloor \frac{r_{i,c} - r_{d,c} - 1}{c} \right\rfloor = 0.$$

By combining inequalities (7) and (8), we arrive at $$j' q_{d,c} + q_{i,c} + 1 - (q_{d,c} - 1) \leq n \leq j' q_{d,c} + q_{i,c} + 1,$$

which enables us to infer that $A_{t_{j'}}$ contains message $n$.

For any pair of consecutive time steps $t_j, t_{j+1} \in T_n^{(i)}$, where $$t_j = (j\, q_{d,c} + q_{i,c})c + r_{i,c},$$
$$t_{j+1} = ((j+1)\, q_{d,c} + q_{i,c})c + r_{i,c},$$

we observe that the smallest message in $A_{t_{j+1}}$ is exactly one larger than the largest message in $A_{t_j}$, i.e., $$(j+1)q_{d,c} + q_{i,c} + 1 - (q_{d,c} - 1)$$
$$= j\, q_{d,c} + q_{i,c} + 1 - (q_{d,c} - 1) + q_{d,c}$$
$$= (j\, q_{d,c} + q_{i,c} + 1) + 1.$$

Thus, there are no overlapping or omitted messages among the sets of active messages corresponding to $T_n^{(i)}$. Property P1 therefore follows.

For both Case 1 and Case 2, the total size of the packets transmitted at time steps $T_n^{(i)}$, i.e., $|T_n^{(i)}|$, can be computed by taking the total size of the blocks allocated to the $n$ messages, and adding the unused packet space at the smallest time step (which is allocated to nonpositive dummy messages) and at the largest time step (which is allocated to messages larger than $n$); this produces the required upper bound of Property P2. ∎

C. Proof of Theorem 1

Consider the symmetric code with spreading parameter $m = d$. Observe that under each erasure pattern $E \in \mathcal{E}_n^{\text{cw}}$, at least $d - z$ unerased packets are received in each coding window $W_k$, because there are at most $z$ erased time steps in each coding window $W_k$. According to Lemma 1, if message size $s$ satisfies the inequality $$s \leq \sum_{j=1}^{d-z} y_j,$$

ANNEX A1 then each message $k \in \{1, \ldots, n\}$ is decodable from any $d - z$ packets transmitted in its coding window $W_k$. Therefore, it follows that the code achieves a message size of $\sum_{j=1}^{d-z} y_j$, by allowing all $n$ messages $\{1, \ldots, n\}$ to be decoded by their respective decoding deadlines under any erasure pattern $E \in \mathcal{E}_n^{\text{cw}}$.

To demonstrate the asymptotic optimality of the code, we will show that this message size matches the maximum achievable message size $s_n^{\text{cw}}$ in the limit, i.e., $$\lim_{n \to \infty} s_n^{\text{cw}} = \sum_{j=1}^{d-z} y_j. \tag{9}$$

To obtain an upper bound for $s_n^{\text{cw}}$, we consider the cut-set bound corresponding to a specific erasure pattern $E'$ from $\mathcal{E}_n^{\text{cw}}$. Let $\{1, \ldots, d\}$ be partitioned into two sets $V^{(1)}$ and $V^{(2)}$, where $$V^{(1)} \triangleq \{i \in \{1, \ldots, d\} : r_{i,c} \leq r_{d,c}\},$$

$$V^{(2)} \triangleq \{i \in \{1, \ldots, d\} : r_{i,c} > r_{d,c}\}.$$

Let $\mathbf{v} = (v_1, \ldots, v_d)$ be defined as $\mathbf{v} \triangleq (\mathbf{v}^{(1)} \mid \mathbf{v}^{(2)})$, where $\mathbf{v}^{(1)}$ is the vector containing the $(q_{d,c} + 1)r_{d,c}$ elements of $V^{(1)}$ sorted in ascending order, and $\mathbf{v}^{(2)}$ is the vector containing the $q_{d,c}(c - r_{d,c})$ elements of $V^{(2)}$ sorted in ascending order. Define the erasure pattern $E' \subseteq T_n$ as follows:

$$E' \triangleq \bigcup_{j=d-z+1}^{d} T_n^{(v_j)},$$

where $T_n^{(i)}$ is as defined in Lemma 2. The erased time steps in $E'$ have been chosen to coincide with the bigger blocks allocated to each message in the symmetric code. To show that $E'$ is an admissible erasure pattern, we introduce the following lemma:

Lemma 4. *If $A \subseteq \{1, \ldots, d\}$, then*

$$\left| \left( \bigcup_{i \in A} T_n^{(i)} \right) \cap W_k \right| = |A| \quad \forall k \in \{1, \ldots, n\}, \tag{10}$$

*where $T_n^{(i)}$ is as defined in Lemma 2.*

*Proof of Lemma 4:* For each $k \in \{1, \ldots, n\}$, the symmetric code with spreading parameter $m = d$ allocates a block to message $k$ at each time step in its coding window $W_k$. Thus, it follows from Property P1 of Lemma 2 that for each $i \in \{1, \ldots, d\}$, we have $$|T_n^{(i)} \cap W_k| = 1 \quad \forall k \in \{1, \ldots, n\}.$$

Equation (10) therefore follows from the fact that $T_n^{(1)}, \ldots, T_n^{(d)}$ are disjoint sets. ∎

Applying Lemma 4 with $A = \{v_j\}_{j=d-z+1}^{d}$ produces $$|E' \cap W_k| = z \quad \forall k \in \{1, \ldots, n\},$$

ANNEX A1 and thus $E'$ is an admissible erasure pattern, i.e., $E' \in \mathcal{E}_n^{\text{CW}}$.

Now, consider a code that achieves the maximum message size $s_n^{\text{CW}}$. Such a code must allow all $n$ messages $\{1, \ldots, n\}$ to be decoded under the specific erasure pattern $E'$. We therefore have the following cut-set bound for $s_n^{\text{CW}}$:

$$n\, s_n^{\text{CW}} \leq |T_n \backslash E'| \iff s_n^{\text{CW}} \leq \frac{1}{n}|T_n \backslash E'| = \frac{1}{n}\sum_{j=1}^{d-z}|T_n^{(v_j)}|.$$

Applying the upper bounds in Property P2 of Lemma 2, and writing the resulting expression in terms of $y_j$ produces $$s_n^{\text{CW}} \leq \frac{1}{n}\sum_{j=1}^{d-z}|T_n^{(v_j)}| \leq \frac{1}{n}\sum_{j=1}^{d-z}(n\, y_j + 2).$$

Since a message size of $\sum_{j=1}^{d-z} y_j$ is known to be achievable (by the symmetric code), we have the following upper and lower bounds for $s_n^{\text{CW}}$:

$$\sum_{j=1}^{d-z} y_j \leq s_n^{\text{CW}} \leq \frac{1}{n}\sum_{j=1}^{d-z}(n\, y_j + 2).$$

These turn out to be matching bounds in the limit as $n \to \infty$:

$$\sum_{j=1}^{d-z} y_j \leq \lim_{n\to\infty} s_n^{\text{CW}} \leq \lim_{n\to\infty} \frac{1}{n}\sum_{j=1}^{d-z}(n\, y_j + 2) = \sum_{j=1}^{d-z} y_j.$$

We therefore have (9) as required. ∎

*D. Proof of Theorem 2*

Consider the symmetric code with spreading parameter $m = d$. Observe that under each erasure pattern $E \in \mathcal{E}_n^{\text{SW}}$, at least $d - z$ unerased packets are received in each coding window $W_k$, because there are at most $z$ erased time steps in each sliding window $L_l$ (which is an interval of at least $d$ time steps), which implies that there are at most $z$ erased time steps in each coding window $W_k$ (which is an interval of exactly $d$ time steps). According to Lemma 1, if message size $s$ satisfies the inequality $$s \leq \sum_{j=1}^{d-z} y_j,$$

then each message $k \in \{1, \ldots, n\}$ is decodable from any $d - z$ packets transmitted in its coding window $W_k$. Therefore, it follows that the code achieves a message size of $\sum_{j=1}^{d-z} y_j$, by allowing all $n$ messages $\{1, \ldots, n\}$ to be decoded by their respective decoding deadlines under any erasure pattern $E \in \mathcal{E}_n^{\text{SW}}$.

ANNEX A1

To demonstrate the asymptotic optimality of the code, we will show that this message size matches the maximum achievable message size $s_n^{SW}$ in the limit, i.e., $$\lim_{n \to \infty} s_n^{SW} = \sum_{j=1}^{d-z} y_j. \qquad (11)$$

Consider a specific *base erasure pattern* $E' \subseteq T_n$ given by $$E' \triangleq \bigcup_{j=d-z+1}^{d} T_n^{(v_j)},$$

where $T_n^{(i)}$ is as defined in Lemma 2, and $\mathbf{v} = (v_1, \ldots, v_d)$ is as defined in the proof of Theorem 1. The erased time steps in $E'$ have been chosen to coincide with the bigger blocks allocated to each message in the symmetric code. From $E'$, we derive the erasure patterns $E_1', \ldots, E_n'$ given by $$E_k' \triangleq E' \cap W_k = \bigcup_{j=d-z+1}^{d} \left( T_n^{(v_j)} \cap W_k \right).$$

Applying Lemma 4 with $A = \{v_j\}_{j=d-z+1}^{d}$ produces $$|E_k'| = |E' \cap W_k| = z \quad \forall k \in \{1, \ldots, n\},$$

which implies that $$|E_k' \cap L_t| \leq z \quad \forall t \in \{1, \ldots, (n-1)c + d - h + 1\}$$

for each $k \in \{1, \ldots, n\}$. Thus, $E_k'$ is an admissible erasure pattern, i.e., $E_k' \in \mathcal{E}_n^{SW}$, for each $k \in \{1, \ldots, n\}$.

To obtain an upper bound for $s_n^{SW}$, we introduce the following lemma:

Lemma 5. *Suppose that a code achieves a message size of $s$ under a given set of erasure patterns $\mathcal{E}$ for a given choice of $(n, c, d)$. If $E \subseteq T_n$ is such that $E \cap W_k$ is an admissible erasure pattern, i.e., $(E \cap W_k) \in \mathcal{E}$, for each $k \in \{1, \ldots, n\}$, then for each $k \in \{1, \ldots, n\}$,*

$$H\left( X[W_k \backslash E] \,\Big|\, M_1^k, X_1^{(k-1)c} \right) \leq |T_k \backslash E| - k s. \qquad (12)$$

*Proof of Lemma 5:* First, we show that for any $k \in \{1, \ldots, n\}$, $$H\left( X[W_k \backslash E] \,\Big|\, M_1^k, X_1^{(k-1)c} \right)$$
$$= H\left( X[W_k \backslash E] \,\Big|\, M_1^{k-1}, X_1^{(k-1)c} \right) - s. \qquad (13)$$

To do this, we consider the conditional mutual information $$I\left( X[W_k \backslash E]; M_k \,\Big|\, M_1^{k-1}, X_1^{(k-1)c} \right)$$
$$= H\left( X[W_k \backslash E] \,\Big|\, M_1^{k-1}, X_1^{(k-1)c} \right)$$
$$- H\left( X[W_k \backslash E] \,\Big|\, M_1^k, X_1^{(k-1)c} \right)$$

ANNEX A1

$$= H\left(M_k \mid M_1^{k-1}, X_1^{(k-1)c}\right)$$
$$- H\left(M_k \mid M_1^{k-1}, X[\{1, \ldots, (k-1)c\} \cup (W_k \backslash E)]\right).$$

Rearranging terms produces $$H\left(X[W_k \backslash E] \mid M_1^k, X_1^{(k-1)c}\right)$$
$$= H\left(X[W_k \backslash E] \mid M_1^{k-1}, X_1^{(k-1)c}\right)$$
$$- H\left(M_k \mid M_1^{k-1}, X_1^{(k-1)c}\right)$$
$$+ H\left(M_k \mid M_1^{k-1}, X[\{1, \ldots, (k-1)c\} \cup (W_k \backslash E)]\right). \tag{14}$$

Since messages are independent and message $k$ is created at time step $(k-1)c + 1$, we have $$H\left(M_k \mid M_1^{k-1}, X_1^{(k-1)c}\right) = H\left(M_k\right) = s. \tag{15}$$

Furthermore, since $E \cap W_k$ is an admissible erasure pattern, message $k$ must be decodable from the packets transmitted at time steps $T_k \backslash (E \cap W_k) = (T_k \backslash W_k) \cup (W_k \backslash E) = \{1, \ldots, (k-1)c\} \cup (W_k \backslash E)$, and so $$H\left(M_k \mid M_1^{k-1}, X[\{1, \ldots, (k-1)c\} \cup (W_k \backslash E)]\right) = 0. \tag{16}$$

Substituting (15) and (16) into (14) yields (13), as required.

We now proceed to prove by induction that inequality (12) holds for any $k \in \{1, \ldots, n\}$.

(Base case) Consider the case of $k = 1$. According to (13), we have $$H\left(X[W_1 \backslash E] \mid M_1\right) = H\left(X[W_1 \backslash E]\right) - s$$
$$\leq |W_1 \backslash E| - s = |T_1 \backslash E| - s,$$

as required, where the inequality follows from the fact that $H(X_t) \leq 1$ for any $t$ because of the unit packet size.

(Inductive step) Suppose that (12) holds for some $k \in \{1, \ldots, n-1\}$. According to (13), we have $$H\left(X[W_{k+1} \backslash E] \mid M_1^{k+1}, X_1^{kc}\right)$$
$$= H\left(X[W_{k+1} \backslash E] \mid M_1^k, X_1^{kc}\right) - s$$
$$\stackrel{(a)}{\leq} H\left(X[(W_k \backslash E) \cup (W_{k+1} \backslash E)] \mid M_1^k, X_1^{kc}\right) - s$$
$$\stackrel{(b)}{\leq} H\left(X[(W_k \backslash E) \cup (W_{k+1} \backslash E)] \mid M_1^k, X_1^{(k-1)c}\right) - s$$
$$\stackrel{(c)}{\leq} H\left(X[W_k \backslash E] \mid M_1^k, X_1^{(k-1)c}\right)$$
$$+ H\left(X[(W_{k+1} \backslash E) \backslash (W_k \backslash E)]\right) - s$$

ANNEX A1

$$\stackrel{(d)}{\leq} |T_k \backslash E| - k\,s + |(W_{k+1}\backslash E)\backslash(W_k\backslash E)| - s$$

$$\stackrel{(e)}{=} |T_{k+1}\backslash E| - (k+1)s,$$

as required, where (a) follows from the addition of random variables $X[W_k\backslash E]$ in the entropy term;

(b) follows from the removal of conditioned random variables $X^{kc}_{(k-1)c+1}$ in the entropy term;

(c) follows from the chain rule for joint entropy, and the removal of conditioned random variables $X[W_k\backslash E]$, $M_1^k$, and $X_1^{(k-1)c}$ in the second entropy term;

(d) follows from the inductive hypothesis, and the fact that $H(X_t) \leq 1$ for any $t$ because of the unit packet size;

(e) follows from the fact that $$|T_k\backslash E| + |(W_{k+1}\backslash E)\backslash(W_k\backslash E)|$$
$$= |T_k\backslash E| + |(W_{k+1}\backslash W_k)\backslash E|$$
$$= |T_k\backslash E| + |(T_{k+1}\backslash T_k)\backslash E| = |T_{k+1}\backslash E|.$$

∎

Applying Lemma 5 with $\mathcal{E} = \mathcal{E}_n^{SW}$ and $E = E'$ to an optimal code that achieves a message size of $s_n^{SW}$ produces $$H\left(X[W_k\backslash E'] \,\Big|\, M_1^k, X_1^{(k-1)c}\right) \leq |T_k\backslash E'| - k\, s_n^{SW}$$

for any $k \in \{1, \ldots, n\}$. Since the conditional entropy term is nonnegative, it follows that for the choice of $k = n$, we have $$|T_n\backslash E'| - n\, s_n^{SW} \geq 0 \iff s_n^{SW} \leq \frac{1}{n}|T_n\backslash E'| = \frac{1}{n}\sum_{j=1}^{d-z}|T_n^{(v_j)}|.$$

The rest of the proof leading to the attainment of (11) is the same as that of Theorem 1, with $s_n^{CW}$ replaced by $s_n^{SW}$.

∎

*E. Proof of Theorem 3*

Consider the symmetric code with spreading parameter $m = d$. Observe that under each erasure pattern $E \in \mathcal{E}_n^B$, at least $d - z$ unerased packets are received in each coding window $W_k$, because there are at most $z$ erased time steps in each coding window $W_k$: if $W_k$ intersects with zero erasure bursts, then it contains zero erased time steps; if $W_k$ intersects with exactly one erasure burst, then it contains at most $z$ erased time steps (i.e., the maximum length of an erasure burst); if $W_k$ intersects with two or more erasure bursts, then it contains a gap of at least $d - z$ unerased time steps between consecutive erasure

ANNEX A1 bursts, and therefore contains at most $z$ erased time steps. According to Lemma 1, if message size $s$ satisfies the inequality $$s \leq \sum_{j=1}^{d-z} y_j,$$

then each message $k \in \{1, \ldots, n\}$ is decodable from any $d - z$ packets transmitted in its coding window $W_k$. Therefore, it follows that the code achieves a message size of $\sum_{j=1}^{d-z} y_j$, by allowing all $n$ messages $\{1, \ldots, n\}$ to be decoded by their respective decoding deadlines under any erasure pattern $E \in \mathcal{E}_n^B$.

To demonstrate the asymptotic optimality of the code, we will show that this message size matches the maximum achievable message size $s_n^B$ in the limit, i.e., $$\lim_{n \to \infty} s_n^B = \sum_{j=1}^{d-z} y_j, \tag{17}$$

for the following three cases:

*Case 1:* Suppose that $d$ is a multiple of $c$. In this case, the message size achieved by the symmetric code simplifies to $$\sum_{j=1}^{d-z} y_j = \frac{d-z}{q_{d,c}+1} = \frac{d-z}{d}c.$$

To obtain an upper bound for $s_n^B$, we consider the cut-set bound corresponding to a specific periodic erasure pattern $E' \subseteq T_n$ given by $$E' \triangleq \{j\,d + i \in T_n : j \in \mathbb{Z}_0^+, i \in \{1, \ldots, z\}\}.$$

Since $E'$ comprises alternating intervals of $z$ erased time steps and $d - z$ unerased time steps, it is an admissible erasure pattern, i.e., $E' \in \mathcal{E}_n^B$.

Now, consider a code that achieves the maximum message size $s_n^B$. Such a code must allow all $n$ messages $\{1, \ldots, n\}$ to be decoded under the specific erasure pattern $E'$. We therefore have the following cut-set bound for $s_n^B$:

$$n\, s_n^B \leq |T_n \setminus E'| \leq \left(\frac{(n-1)c+d}{d}+1\right)(d-z)$$

$$\implies s_n^B \leq \frac{1}{n}\frac{(n-1)c+2d}{d}(d-z) = \frac{d-z}{d}\left(c+\frac{2d-c}{n}\right).$$

Since a message size of $\frac{d-z}{d}c$ is known to be achievable (by the symmetric code), we have the following upper and lower bounds for $s_n^B$:

$$\frac{d-z}{d}c \leq s_n^B \leq \frac{d-z}{d}\left(c+\frac{2d-c}{n}\right).$$

ANNEX A1

These turn out to be matching bounds in the limit as $n \to \infty$:

$$\frac{d-z}{d}c \le \lim_{n \to \infty} s_n^B \le \lim_{n \to \infty} \frac{d-z}{d}\left(c + \frac{2d-c}{n}\right) = \frac{d-z}{d}c.$$

We therefore have (17) as required.

*Case 2:* Suppose that $d$ is not a multiple of $c$, and $z \le c - r_{d,c}$. In this case, the message size achieved by the symmetric code simplifies to $$\sum_{j=1}^{d-z} y_j = c - \sum_{j=d-z+1}^{d} y_j = c - \frac{z}{q_{d,c}}.$$

Consider a specific *base erasure pattern* $E' \subseteq T_n$ given by $$E' \triangleq \bigcup_{j=d-z+1}^{d} T_n^{(v_j)},$$

where $T_n^{(i)}$ is as defined in Lemma 2, and $\mathbf{v} = (v_1, \ldots, v_d)$ is as defined in the proof of Theorem 1. The erased time steps in $E'$ have been chosen to coincide with the bigger blocks allocated to each message in the symmetric code. In this case, $E'$ simplifies to $$E' = \bigcup_{r_{i,c}=c-z+1}^{c} T_n^{((q_{d,c}-1)c+r_{i,c})}$$

$$= \Big\{ ((j+1)q_{d,c} - 1)c + r_{i,c} \in T_n :$$
$$\qquad j \in \mathbb{Z}_0^+, r_{i,c} \in \{c-z+1, \ldots, c\} \Big\},$$

which follows from the definition of $T_n^{(i)}$ and the fact that $r_{i,c} > r_{d,c}$ when $r_{i,c} \in \{c-z+1, \ldots, c\}$. Observe that $E'$ comprises alternating intervals of $z$ erased time steps and $q_{d,c}\, c - z$ unerased time steps, with each interval of erased time steps corresponding to a specific choice of $j \in \mathbb{Z}_0^+$. Since each erased time step $t \in E'$ can be expressed as $$t = \underbrace{((j+1)q_{d,c} - 1)}_{q_{t,c}} c + \underbrace{r_{i,c}}_{r_{t,c}},$$

it follows that the set of active messages at time step $t$ is given by $$A_t = \Big\{ \underbrace{(j+1)q_{d,c}}_{q_{t,c}+1} - (q_{d,c}-1), \ldots, \underbrace{(j+1)q_{d,c}}_{q_{t,c}+1} \Big\}.$$

Therefore, the set of active messages $A_t$ is the same at every time step $t$ in a given interval of $z$ erased time steps (corresponding to a specific $j$).

From $E'$, we derive the erasure patterns $E'_1, \ldots, E'_n$ given by $$E'_k \triangleq E' \cap W_k = \bigcup_{j=d-z+1}^{d} \left( T_n^{(v_j)} \cap W_k \right).$$

ANNEX A1

Applying Lemma 4 with $A = \{v_j\}_{j=d-z+1}^{d}$ produces $$|E'_k| = |E' \cap W_k| = z \quad \forall k \in \{1, \ldots, n\}.$$

Let $t' \in E'_k$ be one of the $z$ erased time steps in $W_k$ under erasure pattern $E'_k$. As previously established, $t'$ belongs to an interval of $z$ erased time steps in $E'$ that have the same set of active messages $A_{t'}$ (which contains message $k$). It follows that this interval of $z$ erased time steps is also in $E'_k$, and must therefore constitute $E'_k$ itself. Thus, $E'_k$ is an admissible erasure pattern, i.e., $E'_k \in \mathcal{E}^B_n$, for each $k \in \{1, \ldots, n\}$, because it comprises a single erasure burst of $z$ time steps.

Applying Lemma 5 with $\mathcal{E} = \mathcal{E}^B_n$ and $E = E'$ to an optimal code that achieves a message size of $s^B_n$ produces $$H\left(X[W_k \backslash E'] \,\middle|\, M_1^k, X_1^{(k-1)c}\right) \leq |T_k \backslash E'| - k\, s^B_n$$

for any $k \in \{1, \ldots, n\}$. Since the conditional entropy term is nonnegative, it follows that for the choice of $k = n$, we have $$|T_n \backslash E'| - n\, s^B_n \geq 0 \iff s^B_n \leq \frac{1}{n}|T_n \backslash E'| = \frac{1}{n}\sum_{j=1}^{d-z}|T_n^{(v_j)}|.$$

The rest of the proof leading to the attainment of (17) is the same as that of Theorem 1, with $s^{CW}_n$ replaced by $s^B_n$.

*Case 3:* Suppose that $d$ is not a multiple of $c$, and $z \geq d - r_{d,c} = q_{d,c}\, c$. In this case, the message size achieved by the symmetric code simplifies to $$\sum_{j=1}^{d-z} y_j = \frac{d-z}{q_{d,c}+1}.$$

Consider a specific *base erasure pattern* $E' \subseteq T_n$ given by $$E' \triangleq \bigcup_{j=d-z+1}^{d} T_n^{(v_j)},$$

where $T_n^{(i)}$ is as defined in Lemma 2, and $\mathbf{v} = (v_1, \ldots, v_d)$ is as defined in the proof of Theorem 1. The erased time steps in $E'$ have been chosen to coincide with the bigger blocks allocated to each message in the symmetric code. In this case, $E'$ simplifies to $$E' = T_n \,\bigg\backslash\, \left(\bigcup_{r_{i,c}=1}^{d-z} T_n^{(r_{i,c})}\right)$$

$$= T_n \,\bigg\backslash\, \Big\{(j(q_{d,c}+1))c + r_{i,c} \in T_n : \\ j \in \mathbb{Z}_0^+, r_{i,c} \in \{1, \ldots, d-z\}\Big\},$$

ANNEX A1 which follows from the definition of $T_n^{(i)}$ and the fact that $r_{i,c} \leq r_{d,c}$ when $r_{i,c} \in \{1, \ldots, d-z\}$. Observe that $E'$ comprises alternating intervals of $d-z$ unerased time steps and $(q_{d,c}+1)c - (d-z) = c - r_{d,c} + z$ erased time steps, with each interval of unerased time steps corresponding to a specific choice of $j \in \mathbb{Z}_0^+$. Since each unerased time step $t \in T_n \setminus E'$ can be expressed as $$t = \underbrace{(j(q_{d,c}+1))}_{q_{t,c}} c + \underbrace{r_{i,c}}_{r_{t,c}},$$

it follows that the set of active messages at time step $t$ is given by $$A_t = \left\{ \underbrace{j(q_{d,c}+1)}_{q_{t,c}} + 1 - q_{d,c}, \ldots, \underbrace{j(q_{d,c}+1)}_{q_{t,c}} + 1 \right\}.$$

Therefore, the set of active messages $A_t$ is the same at every time step $t$ in a given interval of $d-z$ unerased time steps (corresponding to a specific $j$).

From $E'$, we derive the erasure patterns $E'_1, \ldots, E'_n$ given by $$E'_k \triangleq E' \cap W_k = \bigcup_{j=d-z+1}^{d} \left( T_n^{(v_j)} \cap W_k \right).$$

Applying Lemma 4 with $A = \{v_j\}_{j=d-z+1}^{d}$ produces $$|E'_k| = |E' \cap W_k| = z \quad \forall k \in \{1, \ldots, n\}.$$

Let $t' \in W_k \setminus E'_k$ be one of the $d-z$ unerased time steps in $W_k$ under erasure pattern $E'_k$. As previously established, $t'$ belongs to an interval of $d-z$ unerased time steps in $T_n \setminus E'$ that have the same set of active messages $A_{t'}$ (which contains message $k$). It follows that this interval of $d-z$ unerased time steps is also in $W_k \setminus E'_k$, and must therefore constitute $W_k \setminus E'_k$ itself. Thus, $E'_k$ is an admissible erasure pattern, i.e., $E'_k \in \mathcal{E}_n^B$, for each $k \in \{1, \ldots, n\}$, because it comprises either a single erasure burst of $z$ time steps, or two erasure bursts with a combined length of $z$ time steps separated by a gap of $d-z$ unerased time steps.

Applying Lemma 5 with $\mathcal{E} = \mathcal{E}_n^B$ and $E = E'$ to an optimal code that achieves a message size of $s_n^B$ produces $$H\left( X[W_k \setminus E'] \mid M_1^k, X_1^{(k-1)c} \right) \leq |T_k \setminus E'| - k\, s_n^B$$

for any $k \in \{1, \ldots, n\}$. Since the conditional entropy term is nonnegative, it follows that for the choice of $k = n$, we have $$|T_n \setminus E'| - n\, s_n^B \geq 0 \iff s_n^B \leq \frac{1}{n} |T_n \setminus E'| = \frac{1}{n} \sum_{j=1}^{d-z} |T_n^{(v_j)}|.$$

The rest of the proof leading to the attainment of (17) is the same as that of Theorem 1, with $s_n^{CW}$ replaced by $s_n^B$. ∎

ANNEX A1

*F. Proof of Lemma 3*

Suppose that the component systematic block code $\mathcal{C}$ satisfies the symbol decoding requirements given by D1 and D2. We will show that the diagonally interleaved code derived from $\mathcal{C}$ achieves a message size of $\frac{d-z}{d}c$ for the bursty erasure model, by allowing each information symbol $M_k[i]$ to be decoded by its respective message decoding deadline under any erasure pattern $E \in \mathcal{E}_n^B$.

Let $\mathcal{M}_k$ be the set of information symbols corresponding to message $k$, i.e., $$\mathcal{M}_k \triangleq \{M_k[i] : i \in \{1, \ldots, (d-z)c\}\}$$
$$= \{x_t[i] : t \in \{(k-1)c+1, \ldots, kc\}, i \in \{1, \ldots, d-z\}\}.$$

Let $\mathcal{M}$ be the set of information symbols corresponding to all $n$ messages $\{1, \ldots, n\}$, i.e., $\mathcal{M} \triangleq \bigcup_{k=1}^{n} \mathcal{M}_k$. Recall that each diagonal of $d$ symbols in the derived code is a codeword produced by $\mathcal{C}$. Let $L(x_t[i])$ denote the interval of $d$ consecutive time steps across which the codeword containing symbol $x_t[i]$ spans, i.e., $$L(x_t[i]) \triangleq \{t-i+1, \ldots, t-i+d\}.$$

Each information symbol in $\mathcal{M}$ can be mapped to such an interval; the earliest such interval corresponds to $M_1[d-z] = x_1[d-z]$ and is given by $$L(x_1[d-z]) = \{2-(d-z), \ldots, 1+d-(d-z)\},$$

while the latest such interval corresponds to $M_n[(d-z)(c-1)+1] = x_{nc}[1]$ and is given by $$L(x_{nc}[1]) = \{nc, \ldots, nc+d-1\}.$$

Consider the set of information symbols $\mathcal{M}_k$ corresponding to a given message $k \in \{1, \ldots, n\}$. We will show that each information symbol in $\mathcal{M}_k$ is decodable by time step $(k-1)c+d$, which is the decoding deadline for message $k$, under any erasure pattern $E \in \mathcal{E}_n^B$. We do this by considering the codewords that contain one or more information symbols from $\mathcal{M}_k$. There are a total of $d-z+c-1$ such codewords, corresponding to the intervals $$L(x_{(k-1)c+1}[d-z]), \ldots,$$
$$L(x_{(k-1)c+1}[1]),$$
$$\ldots, L(x_{(k-1)c+c}[1]).$$

We consider two cases separately, depending on whether the entire codeword interval occurs by the message decoding deadline:

ANNEX A1

*Case 1:* Consider the codeword corresponding to the interval $L(x_{(k-1)c+1}[i])$, where $i \in \{1, \ldots, d-z\}$. For brevity, we define $$L_i \triangleq L(x_{(k-1)c+1}[i])$$
$$= \{(k-1)c+1-i+1, \ldots, (k-1)c+1-i+d\}.$$

Observe that the entire interval $L_i$ occurs by the message decoding deadline since $(k-1)c+1-i+d \leq (k-1)c+d$. Let $\mathcal{E}_i^z$ be the set of erasure patterns from $\mathcal{E}^z$ that have been time-shifted to align with $L_i$, i.e., $$\mathcal{E}_i^z \triangleq \{\{(k-1)c+1-i+t : t \in E^z\} : E^z \in \mathcal{E}^z\}.$$

Under each erasure pattern $E \in \mathcal{E}_n^B$, the interval $L_i$ intersects with either 1) zero erasure bursts, in which case $L_i$ contains zero erased time steps; or
2) exactly one erasure burst, in which case $L_i$ contains at most $z$ erased time steps (i.e., the maximum length of an erasure burst), all in one contiguous subinterval; or
3) two or more erasure bursts, in which case $L_i$ contains a gap of at least $d-z$ unerased time steps between consecutive erasure bursts.

In each of these three cases, there exists some erasure pattern $E^z \in \mathcal{E}_i^z$ that is a superset of the erased time steps in $L_i$, i.e., $(E \cap L_i) \subseteq E^z$. Since the symbol decoding deadlines of D1 and D2 are satisfied under erasure pattern $E^z$, they must also be satisfied under erasure pattern $E \cap L_i$. It follows that all information symbols in the codeword are decodable by the last time step in interval $L_i$, and therefore by the message decoding deadline. Note that nonpositive time steps are always unerased under the erasure patterns in $\mathcal{E}_n^B$; their corresponding codeword symbols are therefore always known (recall that information symbols corresponding to nonpositive messages are assumed to be zeros).

*Case 2:* Consider the codeword corresponding to the interval $L(x_{(k-1)c+i}[1])$, where $i \in \{2, \ldots, c\}$. For brevity, we define $$L_i \triangleq L(x_{(k-1)c+i}[1])$$
$$= \{(k-1)c+i-1+1, \ldots, (k-1)c+i-1+d\}.$$

Observe that one or more time steps at the end of the interval $L_i$ occur after the message decoding deadline since $(k-1)c+i-1+d > (k-1)c+d$. The first $\min(c+1-i, d-z)$ information symbols in the codeword correspond to message $k$; subsequent information symbols in the codeword (if any) correspond to later messages. Let $\mathcal{E}_i^z$ be the set of erasure patterns from $\mathcal{E}^z$ that have been time-shifted to align with $L_i$, i.e., $$\mathcal{E}_i^z \triangleq \{\{(k-1)c+i-1+t : t \in E^z\} : E^z \in \mathcal{E}^z\}.$$

ANNEX A1

As in Case 1, under each erasure pattern $E \in \mathcal{E}_n^{\mathrm{B}}$, there exists some erasure pattern $E^z \in \mathcal{E}_i^z$ that is a superset of the erased time steps in $L_i$, i.e., $(E \cap L_i) \subseteq E^z$. Since the symbol decoding deadlines of D1 and D2 are satisfied under erasure pattern $E^z$, they must also be satisfied under erasure pattern $E \cap L_i$. In particular, since $$\min(c + 1 - i, d - z) \leq c + 1 - i < c,$$

it follows from D1 that the first $\min(c + 1 - i, d - z)$ information symbols in the codeword, which correspond to message $k$, are decodable by the $(d - c + \min(c + 1 - i, d - z))$th time step in interval $L_i$, which is time step $$(k - 1)c + i - 1 + d - c + \min(c + 1 - i, d - z)$$
$$\leq (k - 1)c + i - 1 + d - c + c + 1 - i$$
$$= (k - 1)c + d,$$

and therefore by the message decoding deadline. Note that although time steps after $(n - 1)c + d$ (which is the final time step in $T_n$) are always unerased under the erasure patterns in $\mathcal{E}_n^{\mathrm{B}}$, their corresponding codeword symbols are never used for decoding because all the information symbols in $\mathcal{M}$ have to be decoded by the final message decoding deadline, which is time step $(n - 1)c + d$. ∎

G. Proof of Theorem 4

We will apply Lemma 3 to show that the diagonally interleaved code derived from the stated systematic block code $\mathcal{C}$ achieves a message size of $\frac{d-z}{d}c$ for the specified bursty erasure model. To demonstrate the asymptotic optimality of the code, we will show that this message size matches the maximum achievable message size $s_n^{\mathrm{B}}$ in the limit, i.e., $$\lim_{n \to \infty} s_n^{\mathrm{B}} = \frac{d - z}{d}c. \tag{18}$$

To facilitate our description of the decoding procedure for $\mathcal{C}$, we arrange the $d$ symbols of the codeword vector produced by $\mathcal{C}$ sequentially across $d - z$ columns, with all the information symbols on the first row, as shown in Fig. 6. Note that each column $i \in \{1, \ldots, d - z\}$ of the table contains exactly $\frac{z}{d-z} \geq 1$ parity symbols. For each $i \in \{1, \ldots, d - z\}$, all the (degenerate) parity symbols below the information symbol $a[i]$ in column $i$ of the table have a value of $a[i]$.

Suppose that the $d$ symbols of the codeword vector are transmitted sequentially across an erasure link, one symbol per time step, over the time interval $L \triangleq \{1, \ldots, d\}$. Under each erasure pattern $E^z \in \mathcal{E}^z$ (as defined in Lemma 3), exactly one symbol in each column of the table is unerased. Because the degenerate parity symbols take on the values of information symbols in a periodic manner, all the information

ANNEX A1 symbols $a[1], \ldots, a[d-z]$ can be recovered using the $d-z$ unerased symbols. In particular, for each $i \in \{1, \ldots, d-z\}$, the information symbol $a[i]$ can be recovered by time step $d - (d-z) + i$. Since $d - z \geq c$, it follows that the symbol decoding requirements given by D1 and D2 in Lemma 3 are satisfied by $\mathcal{C}$. Therefore, according to Lemma 3, the derived code achieves a message size of $\frac{d-z}{d}c$.

To obtain an upper bound for $s_n^{\text{B}}$, we consider the cut-set bound corresponding to a specific periodic erasure pattern $E' \subseteq T_n$ given by $$E' \triangleq \{jd + i \in T_n : j \in \mathbb{Z}_0^+, i \in \{1, \ldots, z\}\}.$$

Since $E'$ comprises alternating intervals of $z$ erased time steps and $d-z$ unerased time steps, it is an admissible erasure pattern, i.e., $E' \in \mathcal{E}_n^{\text{B}}$. Now, consider a code that achieves the maximum message size $s_n^{\text{B}}$. Such a code must allow all $n$ messages $\{1, \ldots, n\}$ to be decoded under the specific erasure pattern $E'$. We therefore have the following cut-set bound for $s_n^{\text{B}}$:

$$n s_n^{\text{B}} \leq |T_n \setminus E'| \leq \left(\frac{(n-1)c + d}{d} + 1\right)(d-z)$$

$$\implies s_n^{\text{B}} \leq \frac{1}{n}\frac{(n-1)c + 2d}{d}(d-z) = \frac{d-z}{d}\left(c + \frac{2d-c}{n}\right).$$

Since a message size of $\frac{d-z}{d}c$ is known to be achievable (by the derived code), we have the following upper and lower bounds for $s_n^{\text{B}}$:

$$\frac{d-z}{d}c \leq s_n^{\text{B}} \leq \frac{d-z}{d}\left(c + \frac{2d-c}{n}\right).$$

These turn out to be matching bounds in the limit as $n \to \infty$:

$$\frac{d-z}{d}c \leq \lim_{n \to \infty} s_n^{\text{B}} \leq \lim_{n \to \infty} \frac{d-z}{d}\left(c + \frac{2d-c}{n}\right) = \frac{d-z}{d}c.$$

We therefore have (18) as required. ∎

H. Proof of Theorem 5

Our proof technique expands that of Theorem 4. First, we arrange the $d$ symbols of the codeword vector produced by the stated systematic block code $\mathcal{C}$ sequentially across $z$ columns, with $r'$ information symbols on the second last row, and all the parity symbols on a separate last row, as shown in Fig. 7. For the case of $r' < z$, we repeat the $r'$ information symbols on the second last row, i.e., $a[d-z-r'+1], \ldots, a[d-z]$, across the row; these repeated *virtual* information symbols are parenthesized to distinguish them from the original *actual* information symbols of the codeword vector. Note that each column $i \in \{1, \ldots, z\}$ of the table contains exactly $\frac{d-z-r'}{z} + 1 \geq 2$ actual and virtual information symbols. For each $i \in \{1, \ldots, z\}$, the value of the parity symbol $b[i]$ is given by the bit-wise modulo-2 sum (i.e., exclusive-or) of the actual and virtual information symbols above it in column $i$ of the table.

ANNEX A1

Suppose that the $d$ symbols of the codeword vector are transmitted sequentially across an erasure link, one symbol per time step, over the time interval $L \triangleq \{1, \ldots, d\}$. To show that the symbol decoding requirements given by D1 and D2 in Lemma 3 are satisfied by $\mathcal{C}$, we consider the following four exhaustive cases separately:

*Case 1:* Consider the case of $r' = z$, for which there are no virtual information symbols. Under each erasure pattern $E^z \in \mathcal{E}^z$ (as defined in Lemma 3), exactly one symbol in each column of the table is erased. For each $i \in \{1, \ldots, z\}$, if the parity symbol $b[i]$ is erased, then all the information symbols in column $i$, which include $a[i]$, are unerased. On the other hand, if $b[i]$ is unerased, then 1) exactly one information symbol in column $i$ is erased; and 2) this information symbol can be recovered by time step $d - z + i$ using the unerased parity symbol $b[i]$ and the unerased information symbols in the column.

*Case 2.1:* Consider the case of $r' < z$, with the erasure pattern $E_j^z$, where $$j \in \{1, \ldots, d - 2z\} \cup \{d - z + 1, \ldots, d\}.$$

Recall that index $j$ gives the time step of the "leading" erasure in the burst, which is of length $z$. Under erasure pattern $E_j^z$, the information symbol $a[d-z]$ and the parity symbol $b[1]$ are not simultaneously erased.

For each $i \in \{1, \ldots, r'\}$, if the parity symbol $b[i]$ is erased, then all the information symbols in column $i$ of the table, which include $a[i]$, are unerased. On the other hand, if $b[i]$ is unerased, then 1) exactly one information symbol in the column is erased; and 2) this information symbol can be recovered by time step $d - z + i$ using the unerased parity symbol $b[i]$ and the unerased information symbols in the column. It follows that all the information symbols on the second last row, i.e., $a[d-z-r'+1], \ldots, a[d-z]$, can be recovered by time step $d - z + r'$.

For each $i \in \{r'+1, \ldots, z\}$, if the parity symbol $b[i]$ is erased, then all the actual information symbols in column $i$ of the table, which include $a[i]$, are unerased. On the other hand, if $b[i]$ is unerased, then 1) exactly one actual information symbol in the column is erased; and 2) this information symbol can be recovered by time step $d - z + i$ using the unerased parity symbol $b[i]$, the unerased actual information symbols in the column, and the recovered virtual information symbol $a[d-z-r'+r_{i,r'}]$.

*Case 2.2:* Consider the case of $r' < z$, with the erasure pattern $E_j^z$, where $$j \in \{d - 2z + 1, \ldots, d - z - r'\}.$$

Under erasure pattern $E_j^z$, 1) the information symbols $a[1], \ldots, a[d-2z]$, which include $a[1], \ldots, a[r']$, are unerased; 2) the information symbols on the second last row, i.e., $a[d-z-r'+1], \ldots, a[d-z]$, are erased; and 3) the parity symbols $b[z-r'+1], \ldots, b[z]$ are unerased.

ANNEX A1

For each $i \in \{1, \ldots, z - r'\}$, if the information symbol $a[d-2z+i]$ is erased, then 1) the parity symbols $b[i], \ldots, b[z]$ are unerased; 2) the information symbol $a[d-z-r'+r_{i,r'}]$ can therefore be recovered by time step $d - z + i$ using the unerased parity symbol $b[i]$ and the unerased and recovered information symbols in the column; and 3) the information symbol $a[d-2z+i]$ can subsequently be recovered by time step $d - z + r' + i$ using the unerased parity symbol $b[r'+i]$, the unerased actual information symbols in the column, and the recovered virtual information symbol $a[d-z-r'+r_{i,r'}]$. It follows that for each $i \in \{1, \ldots, z\}$, the information symbols $a[1], \ldots, a[d-2z-r'+i]$, which include $a[i]$, can be recovered by time step $d - z + i$.

For each $i \in \{1, \ldots, r'\}$, the information symbol $a[d-z-r'+i]$ can be recovered by time step $d - r' + i$ using the unerased parity symbol $b[z-r'+i]$ and the unerased and recovered information symbols in the column.

*Case 2.3:* Consider the case of $r' < z$, with the erasure pattern $E_j^z$, where $$j \in \{d - z - r' + 1, \ldots, d - z\}.$$

Under erasure pattern $E_j^z$, the information symbols $a[1], \ldots, a[d-z-r']$, which include $a[1], \ldots, a[z]$, are unerased.

For each $i \in \{1, \ldots, r'\}$, if the information symbol $a[d-z-r'+i]$ is erased, then 1) the parity symbols $b[z-r'+i], \ldots, b[z]$ are unerased; and 2) the information symbol $a[d-z-r'+i]$ can therefore be recovered by time step $d - r' + i$ using the unerased parity symbol $b[z-r'+i]$ and the unerased information symbols in the column.

Hence, under any erasure pattern $E^z \in \mathcal{E}^z$, all the information symbols $a[1], \ldots, a[d-z]$ are decodable by the last time step in interval $L$; in particular, the information symbol $a[i]$ is decodable by the $(d - z + i)$th time step in interval $L$, for each $i \in \{1, \ldots, z\}$. Since $z \geq c$, it follows that the symbol decoding requirements given by D1 and D2 in Lemma 3 are satisfied by $\mathcal{C}$. Therefore, according to Lemma 3, the derived code achieves a message size of $\frac{d-z}{d}c$.

The rest of the proof leading to the attainment of (18) is the same as that of Theorem 4. ∎

*I. Proof of Theorem 6*

Our proof technique expands that of Theorem 5. First, we arrange the $d$ symbols of the codeword vector produced by the stated systematic block code $\mathcal{C}$ sequentially across $z'$ columns, with $r'$ information symbols on the $\left(\frac{d-z-r'}{z'} + 1\right)$th row, and all the nondegenerate parity symbols $b[1], \ldots, b[z']$ on a separate row, followed by the degenerate parity symbols, as shown in Fig. 8. For the case of $r' < z'$, we repeat the $r'$ information symbols on the $\left(\frac{d-z-r'}{z'} + 1\right)$th row, i.e., $a[d-z-r'+1], \ldots, a[d-z]$, across the row; these repeated *virtual* information symbols are parenthesized to distinguish them from the original *actual*

ANNEX A1 information symbols of the codeword vector. Note that each column $i \in \{1, \ldots, z'\}$ of the table contains exactly $\frac{d-z-r'}{z'} + 1 \geq 2$ actual and virtual information symbols. For each $i \in \{1, \ldots, z'\}$, the value of the nondegenerate parity symbol $b[i]$ is given by the bit-wise modulo-2 sum (i.e., exclusive-or) of the actual and virtual information symbols above it in column $i$ of the table.

Suppose that the $d$ symbols of the codeword vector are transmitted sequentially across an erasure link, one symbol per time step, over the time interval $L \triangleq \{1, \ldots, d\}$. To show that the symbol decoding requirements given by D1 and D2 in Lemma 3 are satisfied by $\mathcal{C}$, we consider the following six exhaustive cases separately:

*Case 1:* Consider the case of $r' = z'$, for which there are no virtual information symbols. Under each erasure pattern $E^z \in \mathcal{E}^z$ (as defined in Lemma 3), exactly $\frac{d-z}{z'}$ symbols in each column of the table are unerased. Since the $d - z$ unerased symbols in the codeword vector are consecutive (possibly wrapping around symbols $b[z]$ and $a[1]$), it follows that the $\frac{d-z}{z'}$ unerased symbols in each column of the table are on consecutive rows (possibly wrapping around the last and first rows).

For each $i \in \{1, \ldots, z'\}$, let $S_i$ be the set of indices corresponding to the erased information symbols in column $i$ of the table. If the nondegenerate parity symbol $b[i]$ is erased, then because the degenerate parity symbols take on the values of information symbols in a periodic manner, each information symbol $a[k]$, where $k \in S_i$, can be recovered by time step $d - (d - z) + k$ using a matching unerased degenerate parity symbol with a value of $a[k]$. On the other hand, if $b[i]$ is unerased, then 1) let $\sigma_i \triangleq \max\{k : k \in S_i\}$; 2) each information symbol $a[k]$, where $k \in S_i \setminus \{\sigma_i\}$, can be recovered by time step $d - z + z' + k$ using the unerased degenerate parity symbol $b[z'+k]$, which has a value of $a[k]$; and 3) the remaining information symbol $a[\sigma_i]$ can be recovered by time step $d - z + \sigma_i$ using the unerased nondegenerate parity symbol $b[i]$ and the unerased and recovered information symbols in the column.

*Case 2.1:* Consider the case of $r' < z'$, with the erasure pattern $E_j^z$, where $$j \in \{1, \ldots, d - z\} \cup \{d - z + z' + d - z + 1, \ldots, d\}.$$

Under erasure pattern $E_j^z$, all the nondegenerate parity symbols $b[1], \ldots, b[z']$ are erased. Each of the $d - z$ unerased symbols is therefore either an information symbol or a degenerate parity symbol (which is a copy of an information symbol). Because the degenerate parity symbols take on the values of information symbols in a periodic manner, all the information symbols $a[1], \ldots, a[d-z]$ can be recovered using the unerased symbols. In particular, for each $i \in \{1, \ldots, d - z\}$, the information symbol $a[i]$ can be recovered by time step $d - (d - z) + i$.

*Case 2.2:* Consider the case of $r' < z'$, with the erasure pattern $E_j^z$, where $$j \in \{d - z + 1, \ldots, d - z + d - z - r'\}.$$

ANNEX A1

Under erasure pattern $E_j^z$, all the information symbols on the $\left(\frac{d-z-r'}{z'}+1\right)$th row, i.e., $a[d-z-r'+1],\ldots,a[d-z]$, are unerased.

For each $i \in \{1,\ldots,z'\}$, let $S_i$ be the set of indices corresponding to the erased information symbols in column $i$ of the table. If $|S_i|=0$, then all information symbols in the column are unerased. If $|S_i| \geq 1$, then 1) let $\sigma_i \triangleq \max\{k : k \in S_i\}$; 2) each information symbol $a[k]$, where $k \in S_i\setminus\{\sigma_i\}$, can be recovered by time step $d-z+z'+k$ using the unerased degenerate parity symbol $b[z'+k]$, which has a value of $a[k]$; and 3) the remaining information symbol $a[\sigma_i]$ can be recovered by time step $d-z+\sigma_i$ using the unerased nondegenerate parity symbol $b[i]$ and the unerased and recovered information symbols in the column.

*Case 2.3:* Consider the case of $r' < z'$, with the erasure pattern $E_j^z$, where $$j \in \{d-z+d-z-r'+1,\ldots,d-z+d-z\}.$$

Under erasure pattern $E_j^z$, 1) the information symbols $a[1],\ldots,a[d-z-r']$ are erased; 2) all the nondegenerate parity symbols $b[1],\ldots,b[z']$ are unerased; and 3) the degenerate parity symbols $b[z'+1],\ldots,b[d-z-r']$ are unerased.

For each $i \in \{1,\ldots,d-z-r'-z'\}$, the information symbol $a[i]$ can be recovered by time step $d-z+z'+i$ using the unerased degenerate parity symbol $b[z'+i]$, which has a value of $a[i]$.

For each $i \in \{1,\ldots,r'\}$, if the degenerate parity symbol $b[d-z-r'+i]$, which has a value of $a[d-z-r'-z'+i]$, is unerased, then 1) the information symbol $a[d-z-r'-z'+i]$ can be recovered by time step $d-z+d-z-r'+i$ using it; and 2) the information symbol $a[d-z-r'+i]$ can subsequently be recovered by time step $d-z+d-z-r'+i$ using the unerased nondegenerate parity symbol $b[i]$ and the recovered information symbols in the column. On the other hand, if $b[d-z-r'+i]$ is erased, then 1) the information symbols $a[d-z-r'+i],\ldots,a[d-z]$ are unerased; and 2) the information symbol $a[d-z-r'-z'+i]$ can therefore be recovered by time step $d-z+d-z-r'-z'+i$ using the unerased nondegenerate parity symbol $b[i]$ and the unerased and recovered information symbols in the column. It follows that all the information symbols on the $\left(\frac{d-z-r'}{z'}+1\right)$th row, i.e., $a[d-z-r'+1],\ldots,a[d-z]$, can be recovered by time step $d-z+d-z$.

For each $i \in \{1,\ldots,z'-r'\}$, the information symbol $a[d-z-z'+i]$ can be recovered by time step $d-z+d-z$ using the unerased nondegenerate parity symbol $b[r'+i]$ and the recovered information symbols in the column.

*Case 2.4:* Consider the case of $r' < z'$, with the erasure pattern $E_j^z$, where $$j \in \{d-z+d-z+1,\ldots,d-z+d-z+z'-r'\}.$$

Under erasure pattern $E_j^z$, 1) all the information symbols $a[1],\ldots,a[d-z]$ are erased; 2) the nondegenerate

ANNEX A1 parity symbols $b[z'-r'+1], \ldots, b[z']$ are unerased; and 3) the degenerate parity symbols $b[z'+1], \ldots, b[d-z]$ are unerased.

For each $i \in \{1, \ldots, d-z-z'\}$, the information symbol $a[i]$ can be recovered by time step $d-z+z'+i$ using the unerased degenerate parity symbol $b[z'+i]$, which has a value of $a[i]$.

For each $i \in \{1, \ldots, z'-r'\}$, if the degenerate parity symbol $b[d-z+i]$, which has a value of $a[d-z-z'+i]$, is unerased, then the information symbol $a[d-z-z'+i]$ can be recovered by time step $d-z+d-z+i$ using it. On the other hand, if $b[d-z+i]$ is erased, then 1) the nondegenerate parity symbols $b[i], \ldots, b[z']$ are unerased; 2) the information symbol $a[d-z-r'+r_{i,r'}]$ can therefore be recovered by time step $d-z+d-z-r'+i$ using the unerased nondegenerate parity symbol $b[i]$ and the recovered information symbols in the column; and 3) the information symbol $a[d-z-z'+i]$ can subsequently be recovered by time step $d-z+d-z-r'+i$ using the unerased parity symbol $b[r'+i]$ and the recovered information symbols in the column.

For each $i \in \{1, \ldots, r'\}$, the information symbol $a[d-z-r'+i]$ can be recovered by time step $d-z+z'+d-z-2r'+i$ using the unerased nondegenerate parity symbol $b[z'-r'+i]$ and the recovered information symbols in the column.

*Case 2.5:* Consider the case of $r' < z'$, with the erasure pattern $E_j^z$, where $$j \in \{d-z+z'+d-z-r'+1, \ldots, d-z+z'+d-z\}.$$

Under erasure pattern $E_j^z$, 1) all the information symbols $a[1], \ldots, a[d-z]$ are erased; and 2) the degenerate parity symbols $b[z'+1], \ldots, b[z'+d-z-r']$ are unerased.

For each $i \in \{1, \ldots, d-z-r'\}$, the information symbol $a[i]$ can be recovered by time step $d-z+z'+i$ using the unerased degenerate parity symbol $b[z'+i]$, which has a value of $a[i]$.

For each $i \in \{1, \ldots, r'\}$, if the degenerate parity symbol $b[z'+d-z-r'+i]$, which has a value of $a[d-z-r'+i]$, is unerased, then the information symbol $a[d-z-r'+i]$ can be recovered by time step $d-z+z'+d-z-r'+i$ using it. On the other hand, if $b[z'+d-z-r'+i]$ is erased, then 1) the nondegenerate parity symbols $b[z'-r'+i], \ldots, b[z']$ are unerased; and 2) the information symbol $a[d-z-r'+i]$ can therefore be recovered by time step $d-z+z'+d-z-2r'+i$ using the unerased nondegenerate parity symbol $b[z'-r'+i]$ and the recovered information symbols in the column.

Hence, under any erasure pattern $E^z \in \mathcal{E}^z$, the information symbol $a[i]$ is decodable by the $(d-(d-z)+i)$th time step in interval $L$, for each $i \in \{1, \ldots, d-z\}$. Since $d-z \geq c$, it follows that the symbol decoding requirements given by D1 and D2 in Lemma 3 are satisfied by $\mathcal{C}$. Therefore, according to Lemma 3, the derived code achieves a message size of $\frac{d-z}{d}c$.

The rest of the proof leading to the attainment of (18) is the same as that of Theorem 4. ∎

ANNEX A1

*J. Proof of Theorem 7*

By partitioning the set of unerased time steps $U_k \subseteq T_k$ into two sets $U_k^{(1)} \subseteq T_k \setminus W_k$ (i.e., unerased time steps before the coding window $W_k$) and $U_k^{(2)} \subseteq W_k$ (i.e., unerased time steps in the coding window $W_k$), we can rewrite (1) as follows:

$$\mathbb{P}[S_k] = \sum_{U_k^{(1)} \subseteq T_k \setminus W_k} \sum_{z=0}^{d} \sum_{\substack{U_k^{(2)} \subseteq W_k: \\ |U_k^{(2)}| = d-z}} \mathbb{1}\left[H\left(M_k \mid X[U_k^{(1)}], X[U_k^{(2)}]\right) = 0\right] \cdot (1-p_e)^{|U_k^{(1)}|+d-z} (p_e)^{|T_k|-d-|U_k^{(1)}|+z}. \quad (19)$$

Observe that the conditional entropy term appearing in (19) can be lower-bounded as follows:

$$H\left(M_k \mid X[U_k^{(1)}], X[U_k^{(2)}]\right)$$
$$\overset{(a)}{\geq} H\left(M_k \mid M_1^{k-1}, X[T_k \setminus W_k], X[U_k^{(2)}]\right)$$
$$\overset{(b)}{=} H\left(M_k \mid M_1^{k-1}, X[U_k^{(2)}]\right)$$
$$\overset{(c)}{=} H\left(M_k \mid M_{k-m_E+1}^{k-1}, X[U_k^{(2)}]\right), \quad (20)$$

where (a) follows from the addition of conditioned random variables $M_1^{k-1}$, $X[(T_k \setminus W_k) \setminus U_k^{(1)}]$;

(b) follows from the fact that packets $X[T_k \setminus W_k]$ are functions of messages $M_1^{k-1}$;

(c) follows from the fact that messages are independent, and packets $X[U_k^{(2)}]$ are independent of messages $M_1^{k-m_E}$ (we can show this explicitly by considering the conditional mutual information $$I\left(M_k; M_1^{k-m_E} \mid M_{k-m_E+1}^{k-1}, X[U_k^{(2)}]\right)$$
$$= H\left(M_k \mid M_{k-m_E+1}^{k-1}, X[U_k^{(2)}]\right)$$
$$\quad - H\left(M_k \mid M_1^{k-1}, X[U_k^{(2)}]\right)$$
$$= H\left(M_1^{k-m_E} \mid M_{k-m_E+1}^{k-1}, X[U_k^{(2)}]\right)$$
$$\quad - H\left(M_1^{k-m_E} \mid M_{k-m_E+1}^{k}, X[U_k^{(2)}]\right),$$

where both conditional entropy terms on the third line are equal to $H\left(M_1^{k-m_E}\right)$, which implies that both conditional entropy terms on the second line are equal).

As a consequence of (20), we have $$\mathbb{1}\left[H\left(M_k \mid X[U_k^{(1)}], X[U_k^{(2)}]\right) = 0\right]$$
$$\leq \mathbb{1}\left[H\left(M_k \mid M_{k-m_E+1}^{k-1}, X[U_k^{(2)}]\right) = 0\right],$$

ANNEX A1 and therefore (19) can be upper-bounded as follows:

$$\mathbb{P}[S_k] \leq \sum_{U_k^{(1)} \subseteq T_k \setminus W_k} \sum_{z=0}^{d} \sum_{\substack{U_k^{(2)} \subseteq W_k: \\ |U_k^{(2)}|=d-z}} \mathbb{1}\left[H(M_k \mid M_{k-m_\mathsf{E}+1}^{k-1}, X[U_k^{(2)}])=0\right] \cdot (1-p_\mathsf{e})^{|U_k^{(1)}|+d-z} (p_\mathsf{e})^{|T_k|-d-|U_k^{(1)}|+z}$$

$$\stackrel{(a)}{=} \sum_{z=0}^{d} \sum_{\substack{U_k^{(2)} \subseteq W_k: \\ |U_k^{(2)}|=d-z}} \mathbb{1}\left[H(M_k \mid M_{k-m_\mathsf{E}+1}^{k-1}, X[U_k^{(2)}])=0\right] \cdot (1-p_\mathsf{e})^{d-z}(p_\mathsf{e})^z$$

$$= \sum_{z=0}^{d} \alpha_k(z) \cdot (1-p_\mathsf{e})^{d-z}(p_\mathsf{e})^z, \qquad (21)$$

where $$\alpha_k(z) \triangleq \sum_{\substack{U_k^{(2)} \subseteq W_k: \\ |U_k^{(2)}|=d-z}} \mathbb{1}\left[H(M_k \mid M_{k-m_\mathsf{E}+1}^{k-1}, X[U_k^{(2)}])=0\right],$$

and (a) follows from a reordering of the sums, and the removal of the factor $$\sum_{U_k^{(1)} \subseteq T_k \setminus W_k} (1-p_\mathsf{e})^{|U_k^{(1)}|} (p_\mathsf{e})^{|T_k|-d-|U_k^{(1)}|} = 1.$$

Consider a fixed choice of subset $U \subseteq \{1, \ldots, d\}$. Suppose that $U_k^{(2)} \subseteq W_k$ is the appropriately time-shifted version of $U$, i.e., $$U_k^{(2)} = \{(k-1)c + i : i \in U\}.$$

According to the definition of time-invariant codes, the packets $X[U_k^{(2)}]$ can consequently be written in terms of $U$ as $$X[U_k^{(2)}] = \left(f_{r_i,c}(M_{k+q_{i,c}}, \ldots, M_{k+q_{i,c}-m_\mathsf{E}+1})\right)_{i \in U}.$$

The conditional entropy term in the definition of $\alpha_k(z)$ can therefore be written in terms of the message random variables as $$H(M_k \mid M_{k-m_\mathsf{E}+1}^{k-1}, X[U_k^{(2)}]) = H\left(M_k \mid M_{k-m_\mathsf{E}+1}^{k-1}, \left(f_{r_i,c}(M_{k+q_{i,c}}, \ldots, M_{k+q_{i,c}-m_\mathsf{E}+1})\right)_{i \in U}\right).$$

Since the joint probability distribution of the random variables in this expression is the same for any $k \geq m_\mathsf{E}$, it follows that this conditional entropy term is constant wrt $k \geq m_\mathsf{E}$. Defining $\alpha(z) \triangleq \alpha_{m_\mathsf{E}}(z)$, we therefore have $$\alpha(z) = \alpha_{m_\mathsf{E}}(z) = \alpha_{m_\mathsf{E}+1}(z) = \alpha_{m_\mathsf{E}+2}(z) = \cdots \qquad (22)$$

ANNEX A1 for any $z \in \{0, \ldots, d\}$. To obtain the required upper bound (2), we will show that for any $z \in \{0, \ldots, d\}$, $$\alpha(z) \leq \left\lfloor \min\left(\frac{(d-z)c}{ds}, 1\right) \binom{d}{z} \right\rfloor. \tag{23}$$

Suppose that $z \in \{0, \ldots, d\}$. Consider the first $m_E + n - 1$ messages $\{1, \ldots, m_E + n - 1\}$, and the union of their (overlapping) coding windows $T_{m_E+n-1}$, where $n \in \mathbb{Z}^+$. Let $\tilde{\mathcal{E}}_z$ be the collection of all $\binom{d}{z}$ possible subsets $\tilde{E} \subseteq \{1, \ldots, d\}$ of size $z$, i.e., $$\tilde{\mathcal{E}}_z \triangleq \{\tilde{E} \subseteq \{1, \ldots, d\} : |\tilde{E}| = z\}.$$

From each $\tilde{E} \in \tilde{\mathcal{E}}_z$, we derive a periodic erasure pattern $E \subseteq T_{m_E+n-1}$ by concatenating copies of $\tilde{E}$; let $\mathcal{E}_z$ be the set of these $\binom{d}{z}$ erasure patterns, i.e., $$\mathcal{E}_z \triangleq \left\{ \{(j-1)d + i \in T_{m_E+n-1} : j \in \mathbb{Z}^+, i \in \tilde{E}\} : \tilde{E} \in \tilde{\mathcal{E}}_z \right\}.$$

Note that because of the periodicity of each erasure pattern $E \in \mathcal{E}_z$, there are exactly $z$ erased time steps and therefore exactly $d - z$ unerased time steps in each coding window $W_k$, i.e., $$|W_k \setminus E| = d - z \quad \forall k \in \{1, \ldots, m_E + n - 1\}, E \in \mathcal{E}_z. \tag{24}$$

Furthermore, for a fixed choice of $k \in \{1, \ldots, m_E + n - 1\}$, the set of $d - z$ unerased time steps in the coding window for message $k$, i.e., $W_k \setminus E$, is distinct under each erasure pattern $E \in \mathcal{E}_z$; in other words, $$(E_1, E_2 \in \mathcal{E}_z) \wedge (W_k \setminus E_1 = W_k \setminus E_2) \implies E_1 = E_2$$
$$\forall k \in \{1, \ldots, m_E + n - 1\}. \tag{25}$$

Suppose that $k \in \{1, \ldots, m_E + n - 1\}$ and $E \in \mathcal{E}_z$. From the definition of conditional mutual information, we have $$I(M_k; X[W_k \setminus E] \mid M_1^{k-1})$$
$$= H(M_k \mid M_1^{k-1}) - H(M_k \mid M_1^{k-1}, X[W_k \setminus E])$$
$$= H(X[W_k \setminus E] \mid M_1^{k-1}) - H(X[W_k \setminus E] \mid M_1^k).$$

Rearranging terms produces $$H(X[W_k \setminus E] \mid M_1^k) = H(X[W_k \setminus E] \mid M_1^{k-1})$$
$$- H(M_k \mid M_1^{k-1}) + H(M_k \mid M_1^{k-1}, X[W_k \setminus E]). \tag{26}$$

Since messages are independent, we have $$H(M_k \mid M_1^{k-1}) = H(M_k) = s. \tag{27}$$

ANNEX A1

Now, if $$H(M_k \mid M_1^{k-1}, X[W_k \backslash E]) = 0, \qquad (28)$$

then, by substituting (27) and (28) into (26), we obtain $$H(X[W_k \backslash E] \mid M_1^k) = H(X[W_k \backslash E] \mid M_1^{k-1}) - s. \qquad (29)$$

On the other hand, if condition (28) is not satisfied, then we have the inequality $$H(X[W_k \backslash E] \mid M_1^k) \leq H(X[W_k \backslash E] \mid M_1^{k-1}), \qquad (30)$$

which is always true.

Suppose that $k \in \{1, \ldots, m_E + n - 1\}$. According to the definition of $\alpha_k(z)$, there are $\alpha_k(z)$ subsets $U_k^{(2)} \subseteq W_k$ of size $d - z$ for which $$H(M_k \mid M_{k-m_E+1}^{k-1}, X[U_k^{(2)}]) = 0.$$

Equivalently, it follows from properties (24) and (25) of the set of erasure patterns $\mathcal{E}_z$ that there are $\alpha_k(z)$ erasure patterns $E \in \mathcal{E}_z$ for which $$H(M_k \mid M_{k-m_E+1}^{k-1}, X[W_k \backslash E]) = 0.$$

Now, since $$H(M_k \mid M_1^{k-1}, X[W_k \backslash E]) \leq H(M_k \mid M_{k-m_E+1}^{k-1}, X[W_k \backslash E]),$$

there are therefore at least $\alpha_k(z)$ erasure patterns $E \in \mathcal{E}_z$ for which condition (28) is satisfied. Summing over all erasure patterns and applying (29) and (30) the appropriate number of times produces the following inequality:

$$\sum_{E \in \mathcal{E}_z} H(X[W_k \backslash E] \mid M_1^k) \leq \left( \sum_{E \in \mathcal{E}_z} H(X[W_k \backslash E] \mid M_1^{k-1}) \right) - s \cdot \alpha_k(z). \qquad (31)$$

We now proceed to prove by induction that the following inequality holds for any $k \in \{m_E, \ldots, m_E + n - 1\}$:

$$\sum_{E \in \mathcal{E}_z} H(X[W_k \backslash E] \mid M_1^k) \leq \left( \sum_{E \in \mathcal{E}_z} |T_k \backslash E| \right) - (k - m_E + 1) s \cdot \alpha(z). \qquad (32)$$

(Base case) Consider the case of $k = m_E$. According to (31), we have $$\sum_{E \in \mathcal{E}_z} H(X[W_{m_E} \backslash E] \mid M_1^{m_E})$$

ANNEX A1

$$\leq \left( \sum_{E \in \mathcal{E}_z} H\left(X[W_{m_E} \backslash E] \mid M_1^{m_E-1}\right) \right) - s \cdot \alpha_{m_E}(z)$$

$$\stackrel{(a)}{\leq} \left( \sum_{E \in \mathcal{E}_z} H\left(X[W_{m_E} \backslash E]\right) \right) - s \cdot \alpha(z)$$

$$\stackrel{(b)}{\leq} \left( \sum_{E \in \mathcal{E}_z} |W_{m_E} \backslash E| \right) - s \cdot \alpha(z)$$

$$\stackrel{(c)}{\leq} \left( \sum_{E \in \mathcal{E}_z} |T_{m_E} \backslash E| \right) - s \cdot \alpha(z),$$

as required, where (a) follows from the removal of conditioned random variables $M_1^{m_E-1}$ in the entropy term, and the application of (22);

(b) follows from the fact that $H(X_t) \leq 1$ for any $t$ because of the unit packet size;

(c) follows from the fact that $W_{m_E} \subseteq T_{m_E}$.

(Inductive step) Suppose that (32) holds for some $k \in \{m_E, \ldots, m_E + n - 2\}$. According to (31), we have $$\sum_{E \in \mathcal{E}_z} H\left(X[W_{k+1} \backslash E] \mid M_1^{k+1}\right)$$

$$\leq \left( \sum_{E \in \mathcal{E}_z} H\left(X[W_{k+1} \backslash E] \mid M_1^{k}\right) \right) - s \cdot \alpha_{k+1}(z)$$

$$\stackrel{(a)}{\leq} \left( \sum_{E \in \mathcal{E}_z} H\left(X[(W_k \backslash E) \cup (W_{k+1} \backslash E)] \mid M_1^{k}\right) \right) - s \cdot \alpha(z)$$

$$\stackrel{(b)}{\leq} \left( \sum_{E \in \mathcal{E}_z} H\left(X[W_k \backslash E] \mid M_1^{k}\right) \right)$$
$$+ \left( \sum_{E \in \mathcal{E}_z} H\left(X\left[(W_{k+1} \backslash E) \backslash (W_k \backslash E)\right]\right) \right) - s \cdot \alpha(z)$$

$$\stackrel{(c)}{\leq} \left( \sum_{E \in \mathcal{E}_z} |T_k \backslash E| \right) - (k - m_E + 1)s \cdot \alpha(z)$$
$$+ \left( \sum_{E \in \mathcal{E}_z} |(W_{k+1} \backslash E) \backslash (W_k \backslash E)| \right) - s \cdot \alpha(z)$$

$$\stackrel{(d)}{=} \left( \sum_{E \in \mathcal{E}_z} |T_{k+1} \backslash E| \right) - (k - m_E + 2)s \cdot \alpha(z),$$

as required, where (a) follows from the addition of random variables $X[W_k \backslash E]$ in the entropy term, and the application of (22);

(b) follows from the chain rule for joint entropy, and the removal of conditioned random variables $X[W_k \backslash E]$, $M_1^k$ in the second entropy term;

ANNEX A1

(c) follows from the inductive hypothesis, and the fact that $H(X_t) \leq 1$ for any $t$ because of the unit packet size;

(d) follows from the fact that $$|T_k \backslash E| + |(W_{k+1} \backslash E) \backslash (W_k \backslash E)|$$
$$= |T_k \backslash E| + |(T_{k+1} \backslash T_k) \backslash E| = |T_{k+1} \backslash E|.$$

Now, since the conditional entropy term in (32) is nonnegative, it follows that for the choice of $k = m_\mathsf{E} + n - 1$, we have $$0 \leq \left( \sum_{E \in \mathcal{E}_z} |T_{m_\mathsf{E}+n-1} \backslash E| \right) - n \, s \cdot \alpha(z),$$

which implies $$\alpha(z) \leq \frac{1}{n\,s} \sum_{E \in \mathcal{E}_z} |T_{m_\mathsf{E}+n-1} \backslash E|$$
$$\leq \frac{1}{n\,s} \binom{d}{z} \left( \frac{(m_\mathsf{E} + n - 2)c + d}{d} + 1 \right) (d - z)$$
$$= \frac{d-z}{d\,s} \binom{d}{z} \left( c + \frac{m_\mathsf{E} c - 2c + 2d}{n} \right).$$

Furthermore, since $\alpha(z)$ is independent of $n$, this upper bound must also hold in the limit $n \to \infty$, i.e., $$\alpha(z) \leq \frac{(d-z)c}{d\,s} \binom{d}{z}.$$

Finally, taking into account the fact that $\alpha(z)$ is an integer that is at most $\binom{d}{z}$, we arrive at (23). Applying (22) and (23) to (21) produces the required upper bound (2) on $\mathbb{P}[S_k]$ for $k \geq m_\mathsf{E}$. ∎

ACKNOWLEDGMENT

The authors would like to thank Yury Polyanskiy for sharing his work with them. They also thank Ashish Khisti for the interesting discussions.

ANNEX A2

On Prioritized Coding for Real-Time Streaming under Packet Erasures

Yunkai Wei[1] and Tracey Ho[2]

Abstract

We consider a real-time streaming system where high and low priority messages arrive at the source according to a periodic pattern, are transmitted over a packet erasure channel, and need to be decoded at the sink within a fixed delay. For a window-based erasure model, we show an upper bound on message sizes that can be asymptotically achieved with a proportional time-invariant intra-session code. For i.i.d. random erasures, we provide an upper bound on message sizes given probabilities of decoding the high and low priority messages respectively, and compare with the performance of our proportional coding scheme.

I. INTRODUCTION

We consider a prioritized real-time streaming system with decoding deadlines. In this system, a source creates high and low priority messages according to a periodic pattern, and encodes them for transmission to a receiver over a packet erasure link. The receiver must subsequently decode each message within a given delay from its creation time. The problem is illustrated in Fig.13 and will be described in detail in Section II.

Prioritized encoding is motivated by systems such as MPEG-encoded video, where a Group of Pictures (GOP) consists of different types of frames which differ in importance. Unequal Error Protection (UEP), or Priority Encoding Transmission [1] in the case of packet erasures, can be used to provide different levels of redundancy protection to messages of different importance, and has been applied to video coding by various authors, e.g. [2, 3, 4, 5, 6].

*This work was supported in part by the Air Force Office of Scientific Research under grant FA9550-10-1-0166 and NSF grant CNS 0905615.

[1]University of Electronic Science and Technology of China, China and California Institute of Technology, USA (visiting student researcher) ykwei@uestc.edu.cn

[2]California Institute of Technology, USA tho@caltech.edu

ANNEX A2

Unlike prior work on prioritized streaming, in this paper we focus on information/coding theoretic limits for various packet erasure models, generalizing previous work along these lines for non-prioritized streaming e.g. [7, 8, 9, 10]. For a window-based erasure model, we show an upper bound on message sizes that can be asymptotically achieved with a proportional time-invariant intra-session code. For i.i.d. random erasures, we provide an upper bound on message sizes given probabilities of decoding the high and low priority messages respectively, and compare with our proportional coding scheme.

II. SYSTEM MODEL

We consider a discrete-time data streaming system comprising a directed unit-bandwidth packet erasure link from a source to a receiver, illustrated in Fig.13. At each time step $i \in \mathbb{Z}^+$, the data source generates a message, represented by random variable $M_i$. If $i \equiv 1(mod\ c)$, the message $M_i$ is a high priority message with size $s_h$; otherwise, $M_i$ is a low priority message with size $s_l$. That is:

$$s_i = H(M_i) = \begin{cases} s_h & i \equiv 1(mod\ c), \\ s_l & \text{otherwise.} \end{cases} \quad (1)$$

The random variables $\{M_i\}$ are independent. All high-priority messages are identically distributed, and all low priority messages are identically distributed. $M_i = 0$ for $i \leq 0$.

Each message must be decoded no later than a delay of $d$ time steps from its creation time. For example, a message $M_i$ created at time step $i$, is to be decoded by time step $i + d - 1$. In practice, delay is usually a multiple of the length of a data set (such as GOP in MPEG), thus we set $d \equiv 0(mod\ c)$. Let $W_i$ be the *coding window* for message $M_i$ which we define as the interval of $d$ time steps between its creation time and decoding deadline, i.e., $$W_i \triangleq \{i, \cdots, i + d - 1\}.$$

As in the non-prioritized streaming problem considered in [7], at each time step $i \in \mathbb{Z}^+$, a single unit-sized packet $X_i$, which is a function of messages created at or before time step $i$, can be transmitted over the link. For brevity, we define $X[A] \triangleq (X_i)_{i \in A}$. Since we deal with hard message decoding deadlines, fixed-size messages and packets, we use a zero-error decodability condition where a given message $M_i$ is considered to be decodable from the packets received at time steps $t \in A$ if and only if $$H(M_i|X[A]) = 0.$$

An *erasure pattern* $E$ specifies a set of erased packet transmissions: if $i \in E$, then packet $X_i$ is erased, otherwise it is received perfectly. A deterministic erasure model specifies a set of erasure patterns under which we require decoding of all messages by their respective deadlines. A probabilistic erasure model specifies a probability distribution over erasure patterns. In this paper, we consider a window erasure model and i.i.d erasure model.

ANNEX A2

III. WINDOW ERASURE MODEL

A. Erasure model

Since a message is available for coding only after its creation time and is not useful after its decoding deadline, for any message $M_i$ the coding window $W_i = \{i, \cdots, jd, jd+1, \cdots, i+d-1 : j = \lfloor i/d \rfloor + 1\}$. We define the priority of a message $M_i$ by specifying the number of erasures $z_i$ it is required to tolerate, i.e. we require that $M_i$ is recovered by its deadline under any erasure pattern in which the number of erased packets in the coding window $W_i$ is less than or equal to $z_i$. For notational convenience, we define the corresponding fraction of received packets $$\rho_i = \frac{d - z_i}{d}.$$

In the particular system we consider, there are two kinds of messages. The high-priority messages have erasure tolerance $z_h$ and the low priority messages have erasure tolerance $z_l \leq z_h \leq d$. We have $$\rho_h = \frac{d - z_h}{d}, \quad \rho_l = \frac{d - z_l}{d},$$

where $\rho_l \geq \rho_h$. From the pattern of high and low priority messages, we have $$\rho_i = \begin{cases} \rho_h = \dfrac{d - z_h}{d} & i \equiv 1 (mod\ c), \\ \rho_l = \dfrac{d - z_l}{d} & \text{otherwise.} \end{cases} \quad (2)$$

B. Converse bound

We develop a converse bound on message sizes by extending the following bound in [1] from non-streaming prioritized transmission to the streaming case.

*Proposition 1:* [1, Theorem 5.1] Let $\tau_1, \cdots, \tau_m$ be $m$ finite alphabets and let $\sigma_1, \cdots, \sigma_n$ be $n$ finite alphabets. Suppose we have a (deterministic) scheme that encodes each possible vector $M = < M_1, \cdots, M_m >$, where $M_i \in \tau_i$, by a vector $D = < D_1, \cdots, D_n >$, where $D_j \in \sigma_j$. Suppose that $$0 < \rho_1 \leq \rho_2 \leq \ldots \leq \rho_m \leq 1$$

and the value of $M_i$ can be correctly recovered from any set of at least $\rho_i n$ of the coordinates of $D$. Then $$\sum_{i=1}^{m} \frac{log|\tau_i|}{\rho_i} \leq \sum_{i=1}^{n} log|\sigma_i|,$$

where all the logarithms are in base 2.

In extending the above bound to the case of real-time streaming, it is notationally simpler to consider the more general case where each message can have a different priority. We will subsequently specialize it to the case of two priorities.

ANNEX A2

*Theorem 1:* Let $M = \langle M_1, \cdots, M_k \rangle$ be a sequence of messages, and $X = \langle X_1, \cdots, X_n \rangle$ the corresponding sequence of encoded packets each of unit size. Message $M_i$ is created at time step $i$ and $X_i$ is the encoded packet in the $i$-th time step. Message $M_i$ is decodable at time step $i + d - 1$ when a fraction $\rho_i$ of packets in its coding window $W_i$ are unerased. Then $$\sum_{i=1}^{k} \frac{H(M_i)}{\rho_i} \leq \max_{\mathcal{X}} \sum_{i=1}^{n} H(X_i) = n.$$

Figure 14:
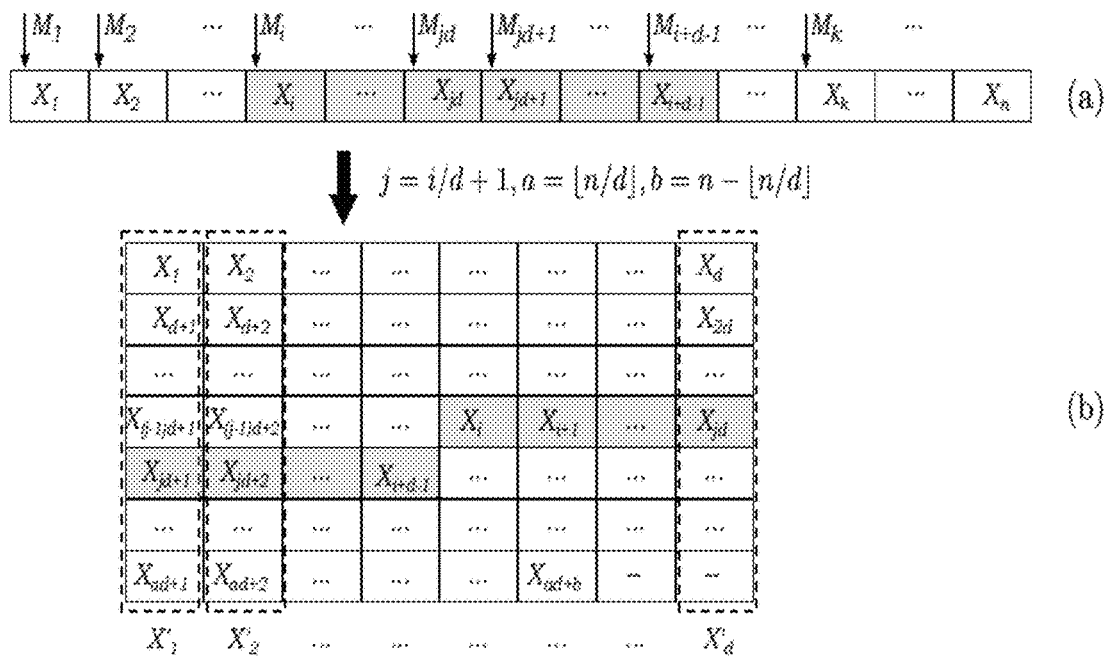
FIG. 14 shows block codes construction based on streaming codes.

*Proof:* The proof is by contradiction. As shown in Fig.14(a), assume there is a coding scheme A that encodes $M = \langle M_1, \cdots, M_k \rangle$ into $X = \langle X_1, \cdots, X_n \rangle$ which satisfies the decoding requirements as well as $$\sum_{i=1}^{k} \frac{H(M_i)}{\rho_i} > \sum_{i=1}^{n} H(X_i). \tag{3}$$

Based on this scheme, we show that we can construct a coding scheme B for a related non-streaming PET system that violates the bound in Proposition 1, as follows. In this system, the messages $M = \langle M_1, \cdots, M_k \rangle$ are all available at the first time step, and are encoded into packets $X' = \langle X'_1, \cdots, X'_d \rangle$. Message $M_i$ is required to be decodable when any $\lceil \rho_i d \rceil$ of the packets are unerased. Let $X'_i$ denote the packet in time step $i$, i.e., $M = \langle M_1, \cdots, M_k \rangle$ is encoded into packets $X' = \langle X'_1, \cdots, X'_d \rangle$.

Scheme B is defined as follows. We reorganize the packets $X = \langle X_1, \cdots, X_n \rangle$ in scheme A into $d$ packets $X' = \langle X'_1, \cdots, X'_d \rangle$, where $$X'_g = \{X_i : i \equiv g \pmod{d}, i \in \{1, \cdots, n\}\}.$$

This is shown in Fig.14(b), where $a = \lfloor n/d \rfloor$ and $b = n - \lfloor n/d \rfloor$.

Now let's verify whether scheme B with the new packets $X' = \langle X'_1, \cdots, X'_d \rangle$ can satisfy the priority requirement. For any message $M_i$, the packets $\langle X_i, \cdots, X_{i+d-1} \rangle$ in $M_i$'s coding window of scheme A will be distributed across different packets in scheme B, as illustrated in Fig.14(b).

Therefore, when there are at least $\lceil \rho_i d \rceil$ unerased packets in scheme B, this corresponds to at least $\lceil \rho_i d \rceil$ unerased packets in $W_i$ in scheme A. By the assumed decoding properties of scheme A, the unerased packets allow decoding of $M_i$ in both schemes.

Since the packets from scheme A are simply grouped together to form the packets in scheme B, we have $$\sum_{g=1}^{d} H(X'_g) \leq \sum_{i=1}^{n} H(X_i),$$

It then follows from assumption (3) that $$\sum_{i=1}^{k} \frac{H(M_i)}{\rho_i} > \sum_{i=1}^{d} H(X'_g). \tag{4}$$

ANNEX A2

Making the correspondence between packets $X_i'$ and symbols $D_i$ in proposition 1, we find a contradiction. ■

This result specializes to the specific two-priority system with window erasure model defined above, as follows.

*Corollary 1:* For the two-priority system with window erasure model, an upper bound on message sizes is $$s_h \rho_l + (c-1) s_l \rho_h \leq \frac{nc}{k} \rho_h \rho_l.$$

*Proof:* With given $\rho_i$, $H(M_i)$, and $H(X_i) = 1$ ($\forall i \in \{1, \cdots, n\}$), Theorem 1 can be translated into $$\sum_{i=1}^{k} \frac{H(M_i)}{\rho_i} \leq \sum_{i=1}^{n} H(X_i)$$

$$\Rightarrow \sum_{i=1}^{\lceil \frac{k}{c} \rceil} \frac{s_h}{\rho_h} + \sum_{i=1}^{k - \lceil \frac{k}{c} \rceil} \frac{s_l}{\rho_l} \leq n$$

$$\Rightarrow \left\lceil \frac{k}{c} \right\rceil \left( \frac{s_h}{\rho_h} - \frac{s_l}{\rho_l} \right) + \frac{k s_l}{\rho_l} \leq n$$

$$\Rightarrow \frac{k}{c} \left( \frac{s_h}{\rho_h} - \frac{s_l}{\rho_l} \right) + \frac{k s_l}{\rho_l} \leq n$$

$$\Rightarrow s_h \rho_l + (c-1) s_l \rho_h \leq \frac{nc}{k} \rho_h \rho_l.$$

■

C. An achievable code construction

In an intra-session code, coding is allowed within the same message but not across different messages. This means that each unit-size packet is partitioned into subpackets or blocks of possibly different sizes, each encoding a different message. We assume that an appropriate code (e.g., a maximum distance separable (MDS) code or a random linear code) is subsequently applied to this allocation so that each message is decodable whenever the total amount of received data that encodes that message, or the total size of the corresponding blocks, is at least the message size $s$. The blocks that encode a given message $M_i$ are confined to the packets transmitted in the corresponding coding window $W_i$. Thus, to decode each message, the decoder needs to access only the packets received at the most recent $d$ time steps. The decoder memory requirements for intra-session codes are therefore modest compared to an intersession code requiring older packets or previous messages for decoding.

As illustrated in Fig.15, we consider the family of *Proportional Time-invariant Intra-session Codes* (PTIC) whose construction is described simply, as follows. Let $A_t$ be the set of *active messages* at time

ANNEX A2 step $i$, defined as messages whose effective coding windows contain the time step $i$, i.e, $$A_i \triangleq \{M_j : j \in W_i\}$$
$$= \{M_j : j \leq i \leq j + d - 1\}$$
$$= \{M_j : i - d + 1 \leq j \leq i\}$$
$$= \{M_{i-d+1}, \cdots, M_i\}.$$

Messages with non-positive time indexes correspond to dummy messages. The unit packet space at each time step is divided among the active messages at that time step. The size of the block allocated to each active message $M_j \in A_i$ at each time step $i \in \mathbb{Z}^+$ is determined by the priorities of the active messages.

Let $M_i[t]$ denote the size of block for message $M_i$ at time step $t$. The size of the block allocated to each active message $M_i$ is in inverse proportion to its priority:

$$\frac{M_i[t]}{M_j[t]} = \frac{s_i/\rho_i}{s_j/\rho_j} = \frac{s_i \rho_j}{s_j \rho_i} \quad (M_i, M_j \in A_t). \tag{5}$$

Since the total size of all blocks in time step $t$ is limited by the unit packet size, we have $$M_i[t] = \frac{s_i/\rho_i}{\sum_{M_j \in A_t} s_j/\rho_j} = \frac{s_i}{\rho_i(\sum_{M_j \in A_t} s_j/\rho_j)}. \tag{6}$$

Since $d$ is a multiple of $c$, the amount of $z_h$ messages and $z_l$ messages are both fixed in each time step. That is to say, the size of blocks allocated to $z_h$ messages is constant in all time steps, and so is it for $z_l$ messages. Combining this with (6), we can get when $M_i \in A_t$ $$M_i[t] = \begin{cases} \dfrac{cs_h\rho_l}{d(s_h\rho_l + (c-1)s_l\rho_h)} & i \equiv 1 \pmod{c}, \\ \dfrac{cs_l\rho_h}{d(s_h\rho_l + (c-1)s_l\rho_h)} & \text{otherwise}. \end{cases}$$

The following result shows that this construction can achieve the upper bound of the maximum achievable message size in Corollary 1.

*Theorem 2:* Consider the sliding window erasure model for a given choice of $(d, h \geq d, \rho_h, \rho_l)$. The PTIC with coding window $d$ can achieve message sizes satisfying $$s_h\rho_l + (c-1)s_l\rho_h \leq c\rho_h\rho_l,$$

which is asymptotically optimal.

*Proof:* Suppose the fraction of unerased time steps in window $W_i$ is at most $\rho_l$. If $M_i$ has low priority, its corresponding received blocks have total size at least $$\frac{cs_l\rho_h}{s_h\rho_l + (c-1)s_l\rho_h} \cdot \rho_l \tag{7}$$

ANNEX A2

If $M_i$ has high priority, its corresponding received blocks have total size at least $$\frac{cs_h\rho_l}{s_h\rho_l + (c-1)s_l\rho_h} \cdot \rho_l > \frac{cs_h\rho_l}{s_h\rho_l + (c-1)s_l\rho_h} \cdot \rho_h \qquad (8)$$

Suppose the fraction of unerased time steps in window $W_i$ is at most $\rho_h$. If $M_i$ has high priority, its corresponding received blocks have total size at least $$\frac{cs_h\rho_l}{s_h\rho_l + (c-1)s_l\rho_h} \cdot \rho_h \qquad (9)$$

Combining (7), (8) and (9), we have that the decoding requirements are satisfied as long as $$\frac{c\rho_l\rho_h}{s_h\rho_l + (c-1)s_l\rho_h} \geq 1$$

$$\Rightarrow s_h\rho_l + (c-1)s_l\rho_h \leq c\rho_h\rho_l.$$

Note that since $k \leq n \leq k + d - 1$, $$s_h\rho_l + (c-1)s_l\rho_h \leq \lim_{k \to \infty} \frac{kc}{d}\rho_h\rho_l = c\rho_h\rho_l.$$

Thus, the messages size can asymptotically reach the upper bound from Corollary 1. ■

IV. IID Erasure Model

A. Erasure model

For i.i.d. erasure models, each packet transmitted over the link is erased i.i.d. with probability $1 - p$ and received with probability $p$. Instead of specifying erasure tolerance, we specify a desired recovery probability $r_i$ for each message $M_i$. For the two-priority streaming system we consider, $$r_i = \begin{cases} r_h & i \equiv 1 \pmod{c}, \\ r_l & \text{otherwise.} \end{cases}$$

B. Converse bound

Consider the i.i.d problem with given values of $(d, c, p, r_h, r_l)$. We develop a converse bound for the class of time-invariant codes with finite encoder memory size $m_E$, in which the decoding statistics for all high-priority messages $M_i$ for which $i \geq m_E$ are the same, and the decoding statistics for all low-priority messages $M_i$ for which $i \geq m_E$ are the same. This result is developed in a similar manner as the converse for the non-prioritized case in [8].

ANNEX A2

*Theorem 3:* For any time-invariant code with encoder memory size $m_E$, the sizes $s_h$ and $s_l$ of high and low priority messages respectively must satisfy $$s_h \alpha_h(j) + (c-1)s_l \alpha_l(j) \leq \frac{c(d-j)}{d}\binom{d}{j}$$

$$\forall j \in \{0, \cdots, d\},$$

$$\sum_{j=0}^{d} \alpha_h(j) p^{d-j}(1-p)^j \geq r_h,$$

$$\sum_{j=0}^{d} \alpha_l(j) p^{d-j}(1-p)^j \geq r_l,$$

$$\alpha_l(j) \leq \binom{d}{j}, \quad \alpha_h(j) \leq \binom{d}{j} \quad \forall j \in \{0, \cdots, d\}$$

for some choice of $\alpha_h(\cdot)$ and $\alpha_l(\cdot)$.

*Proof:* Let $U_i$ denote all of the time steps that are no later than the decoding deadline for message $M_i$, i.e., $U_i = \{1, 2, \cdots, i+d-1\}$, and the random subset $V_i \subseteq U_i$ be the unerased time steps; the received packets that can be used by the decoder for decoding message $M_i$ are therefore given by $X[V_i]$. Consequently, the decoding probability $S_i$, where $i \in \mathbb{Z}^+$, can be expressed in terms of $V_i$ as follows:

$$\mathbb{P}[S_i] = \mathbb{P}[H(M_i|X[V_i]) = 0]$$
$$= \sum_{V_i \subseteq U_i} \mathbb{I}[H(M_i|X[V_i]) = 0] \cdot p^{|V_i|}(1-p)^{|U_i|-|V_i|}, \tag{10}$$

where $\mathbb{I}[\Phi]$ is an indicator. When $\Phi$ is true, there is $\mathbb{I}[\Phi] = 1$. Otherwise, $\mathbb{I}[\Phi] = 0$.

By partitioning the set of unerased time steps $V_i \subseteq U_i$ into two sets $V_i^{(1)} \subseteq U_i \setminus W_i$ (i.e., unerased time steps before the coding window $W_i$) and $V_i^{(2)} \subseteq W_i$ (i.e., unerased time steps in the coding window $W_i$), we can rewrite (10) as follows:

$$\mathbb{P}[S_i] = \sum_{V_i^{(1)} \subseteq U_i \setminus W_i} \sum_{j=0}^{d} \sum_{\substack{V_i^{(2)} \subseteq W_i \\ |V_i^{(2)}| = d-j}} \Big(
\mathbb{I}[H(M_i|X[V_i^{(1)}], X[V_i^{(2)}]) = 0] \\
\cdot p^{|V_i^{(1)}|+d-j}(1-p)^{|U_i|-d-|V_i^{(1)}|+j} \Big). \tag{11}$$

We can upper bound $\mathbb{P}[S_i]$ as:

$$\mathbb{P}[S_i] \leq \sum_{j=0}^{d} \alpha_i(j) \cdot p^{d-j}(1-p)^j, \tag{12}$$

where $$\alpha_i(j) \triangleq \sum_{\substack{V_i^{(2)} \subseteq W_i \\ |V_i^{(2)}| = d-j}} \mathbb{I}[H(M_i|M_{i-m_E+1}^{i-1}, X[V_i^{(2)}]) = 0].$$

ANNEX A2

Consider a fixed choice of subset $V \subseteq \{1, \cdots, d\}$. Suppose that $V_i^{(2)} \subseteq W_i$ is the appropriately time-shifted version of $V$, i.e., $$V_i^{(2)} = \{(i-1) + g : g \in V\}.$$

In time-invariant codes, the packets $X[V_i^{(2)}]$ can be written in terms of $V$ as $$X[V_i^{(2)}] = (f_{(i \bmod c)}(M_{i+g-m_E+1}^{i+g}))_{g \in V},$$

where $M_{i+g-m_E+1}^{i+g} = \{M_{i+g}, \cdots, M_{i+g-m_E+1}\}$.

The conditional entropy term in the definition of $\alpha_i(j)$ can therefore be written in terms of the message random variables as $$H(M_i | M_{i-m_E+1}^{i-1}, X[V_i^{(2)}])$$
$$= H(M_i | M_{i-m_E+1}^{i-1}, (f_{(i \bmod c)}(M_{i+g-m_E+1}^{i+g}))_{g \in V}).$$

For the class of time-invariant codes that we consider, for any $j \in \{0, \cdots, d\}$, $$\alpha_h(j) = \{\alpha_i(j) : i \geq m_E, i \bmod c = 1\},$$
$$\alpha_l(j) = \{\alpha_i(j) : i \geq m_E, i \bmod c \neq 1\}.$$
(13)

Suppose that $j \in \{0, \cdots, d\}$. Consider the first $m_E + ck - 1$ messages $\{1, \cdots, m_E + ck - 1\}$, and the union of their (overlapping) coding windows $U_{m_E+ck-1}$, where $k \in \mathbb{Z}^+$. Let $\widetilde{\mathcal{E}}_j$ be the collection of all $\binom{d}{j}$ possible subsets $\widetilde{E} \subseteq \{1, \cdots, d\}$ of size $j$, i.e., $$\widetilde{\mathcal{E}}_j \triangleq \{\widetilde{E} \subseteq \{1, \cdots, d\} : |\widetilde{E}| = j\}.$$

¿From each $\widetilde{E} \in \widetilde{\mathcal{E}}$, we derive a periodic erasure pattern $E \subseteq U_{m_E+ck-1}$ by concatenating copies of $\widetilde{E}$; let $\mathcal{E}_j$ be the set of these $\binom{d}{j}$ erasure patterns, i.e., $$\mathcal{E}_j \triangleq$$
$$\left\{ \{(m-1)d + n \in U_{m_E+ck-1} : m \in \mathbb{Z}^+, n \in \widetilde{E}\} : \widetilde{E} \in \widetilde{\mathcal{E}}_j \right\}.$$

Note that because of the periodicity of each erasure pattern $E \in \mathcal{E}_j$, there are exactly $j$ erased time steps and therefore exactly $d - j$ unerased time steps in each coding window $W_i$, i.e., $$|W_i \setminus E| = d - j \quad \forall i \in \{1, \cdots, m_E + ck - 1\}, E \in \mathcal{E}_j.$$

Furthermore, $$(E_1, E_2 \in \mathcal{E}_j) \wedge (W_i \setminus E_1 = W_i \setminus E_2) \implies E_1 = E_2$$
$$\forall i \in \{1, \cdots, m_E + ck - 1\}.$$

ANNEX A2

Suppose that $i \in \{1, \cdots, m_E + ck - 1\}$ and $E \in \mathcal{E}_j$. We have $$H(X[W_i \setminus E]|M_1^i)$$
$$= H(X[W_i \setminus E]|M_1^{i-1}) - H(M_i|M_1^{i-1}) \quad (14)$$
$$+ H(M_i|M_1^{i-1}, X[W_i \setminus E]).$$

Since messages are independent, we have $$H(M_i|M_1^{i-1}) = H(M_i) = s.$$

Now, if $$H(M_i|M_1^{i-1}, X[W_i \setminus E]) = 0, \quad (15)$$

then (14) can be expressed as $$H(X[W_i \setminus E]|M_1^i) = H(X[W_i \setminus E]|M_1^{i-1}) - s_i. \quad (16)$$

On the other hand, if condition (15) is not satisfied, then we have the following inequality which always holds:

$$H(X[W_i \setminus E]|M_1^i) \leq H(X[W_i \setminus E]|M_1^{i-1}). \quad (17)$$

According to the definition of $\alpha_i(j)$, there are $\alpha_i(j)$ subsets $V_i^{(2)} \subseteq W_i$ of size $d - j$ for which $$H(M_i|M_{i-m_E+1}^{i-1}, X[V_i^{(2)}]) = 0$$
$$\Leftrightarrow H(M_i|M_{i-m_E+1}^{i-1}, X[W_i \setminus E]) = 0.$$

Now since $$H(M_i|M_1^{i-1}, X[W_i \setminus E]) \leq H(M_i|M_{i-m_E+1}^{i-1}, X[W_i \setminus E]),$$

there are at least $\alpha_i(j)$ erasure patterns $E \in \mathcal{E}_j$ for which condition (15) is satisfied. Summing over all erasure patterns and applying (16) and (17) the appropriate number of times produces the following inequality:

$$\sum_{E \in \mathcal{E}_j} H(X[W_i \setminus E]|M_1^i)$$
$$\leq \left( \sum_{E \in \mathcal{E}_j} H(X[W_i \setminus E]|M_1^{i-1}) \right) - s_i \cdot \alpha_i(j). \quad (18)$$

We now proceed to prove by induction that the following inequality holds for any $i \in \{m_E, \cdots, m_E + ck - 1\}$:

$$\sum_{E \in \mathcal{E}_j} H(X[W_i \setminus E]|M_1^i) \leq \left( \sum_{E \in \mathcal{E}_j} |U_i \setminus E| \right) \quad (19)$$
$$- s_h \psi_a(i) \alpha_h(j) - s_l \psi_b(i) \alpha_l(j),$$

ANNEX A2 where $\psi_a(i) = \lceil \frac{i-m_E+1}{c} \rceil$, and $\psi_b(i) = i - m_E + 1 - \psi_a(i)$.

(Base case) We start from $k = m_E$. According to (18), we have $$\sum_{E \in \mathcal{E}_j} H(X[W_{m_E} \setminus E] | M_1^{m_E})$$
$$\leq \left( \sum_{E \in \mathcal{E}_j} H(X[W_{m_E} \setminus E] | M_1^{m_E-1}) \right) - s_i \cdot \alpha_i(j)$$
$$\leq \left( \sum_{E \in \mathcal{E}_j} |W_{m_E} \setminus E| \right) - s_i \cdot \alpha_i(j)$$
$$\leq \left( \sum_{E \in \mathcal{E}_j} |U_{m_E} \setminus E| \right) - s_i \cdot \alpha_i(j).$$

(Inductive step) Suppose that (19) holds for some $i \in \{m_E, \cdots, m_E + ck - 2\}$. According to (18), we have $$\sum_{E \in \mathcal{E}_j} H(X[W_{i+1} \setminus E] | M_1^{i+1})$$
$$\leq \left( \sum_{E \in \mathcal{E}_j} H(X[W_i \setminus E] | M_1^i) \right)$$
$$+ \left( \sum_{E \in \mathcal{E}_j} H(X[W_{i+1} \setminus E] | M_1^i) \right) - s_{i+1} \cdot \varphi(i+1, j)$$
$$\leq \left( \sum_{E \in \mathcal{E}_j} H(X[W_i \setminus E]) \right) + \left( \sum_{E \in \mathcal{E}_j} H(X[W_{i+1} \setminus E] | M_1^i) \right)$$
$$- s_h \psi_a(i) \alpha_h(j) - s_l \psi_b(i) \alpha_l(j) - s_{i+1} \cdot \varphi(i+1, j)$$
$$= \left( \sum_{E \in \mathcal{E}_j} |U_{i+1} \setminus E| \right)$$
$$- s_h \psi_a(i+1) \alpha_h(j) - s_l \psi_b(i+1) \alpha_l(j),$$

where $\varphi(i, j) = \mathbb{I}[i \equiv 1 (mod\ c)] \alpha_h(j) + \mathbb{I}[i\ mod\ c \neq 1] \alpha_l(j)$.

Since the conditional entropy term in (19) is non-negative, it follows that for the choice of $i = m_E + 2k - 1$, we have $$0 \leq \left( \sum_{E \in \mathcal{E}_j} |U_{m_E+2k-1} \setminus E| \right) - k s_h \alpha_h(j) - (c-1) k s_l \alpha_l(j),$$

ANNEX A2 which implies $$s_h\alpha_h(j) + (c-1)s_l\alpha_l(j)$$
$$\leq \frac{1}{ks}\sum_{E\in\mathcal{E}_j}|U_{m_E+ck-1}\setminus E|$$
$$\leq \frac{1}{k}\binom{d}{j}\left(\frac{m_E+ck-2+d}{d}+1\right)(d-j)$$
$$= \frac{d-j}{d}\binom{d}{j}\left(c+\frac{m_E-2+2d}{k}\right).$$

Furthermore, since $\alpha_i(j)$ is independent of $k$, this upper bound must also hold in the limit $k \to \infty$, i.e., $$s_h\alpha_h(j) + (c-1)s_l\alpha_l(j) \leq \frac{c(d-j)}{d}\binom{d}{j}. \tag{20}$$

The result follows from combining (12), (13) and (20). ∎

For a given ratio of message sizes $s_h/s_l$, an upper bound on message size can be obtained by maximizing $s_h$ subject to the constraints in Theorem 3 using Mixed Integer Linear Programming (MILP). This can be solved in reasonable time for modest values of $d$, e.g. when $(c,d) = (3,18)$, the running time is less than 10 seconds.

C. Comparison with achievable and converse bounds for non-prioritized streaming We show that our achievable and converse results indeed exploit the two-priority structure by comparing against the corresponding bounds for the non-prioritized streaming problem from [8] and [7]. For ease of comparison, we assume $s_h = s_l = s$ in this section.

Figure 16:
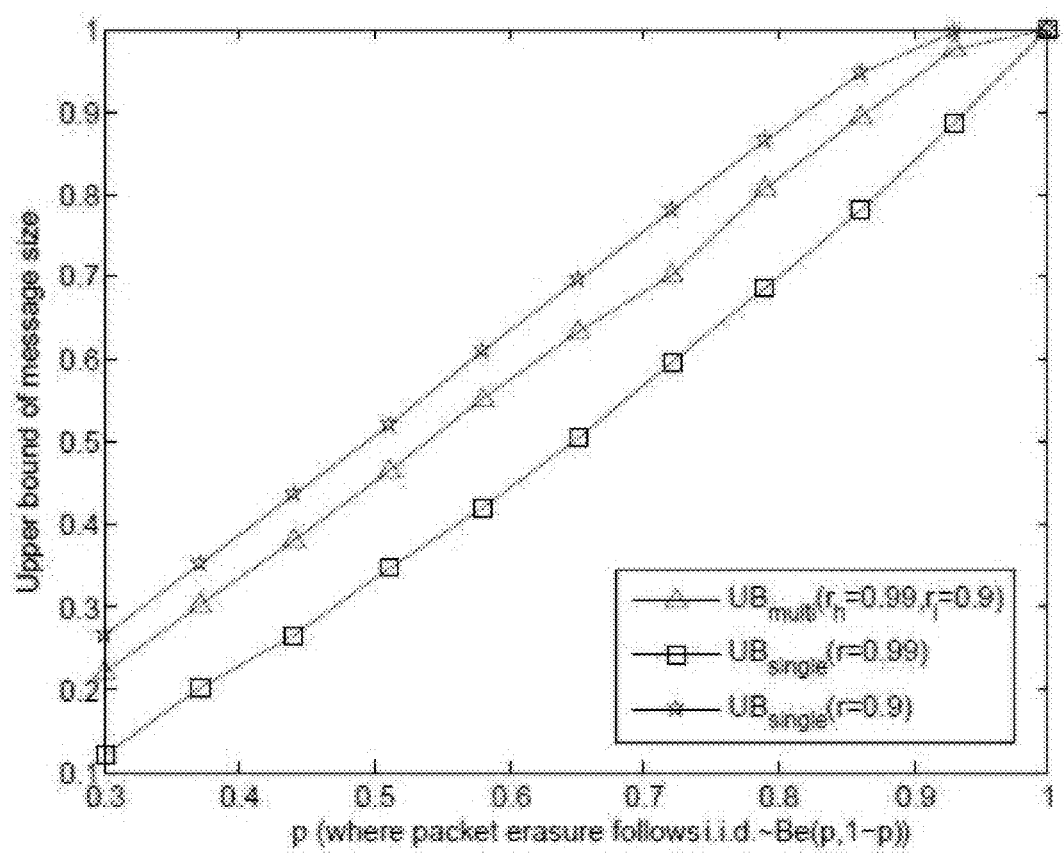
FIG. 16 shows a comparison between upper bounds on message size for (c, d)=(2, 20).

The converse bound for the non-prioritized case from [8] (Theorem 4) can be expressed as:

$$\max s$$
$$\text{s.t.} \begin{cases} \sum_{j=0}^{d}\alpha(j)p^{d-j}(1-p)^j \geq r, \\ \alpha(j) \leq \left\lfloor \min\left(\frac{d-j}{ds},1\right)\binom{d}{j}\right\rfloor \\ \forall j \in \{0,\cdots,d\}, \end{cases} \tag{21}$$

where $r$ is the required successful recovery probability, and $\alpha(j)$ is the number of sets that can recover the message when $j$ time steps are erased. For brevity, denote this upper bound with $UB_{single}(r)$, and the upper bound in (3) with $UB_{multi}(r_h, r_l)$. The comparison is shown in Fig.16 for $r_h = 0.99$ and $r_l = 0.9$.

On the achievability side, we compare the PTIC scheme against the achievable symmetric time-invariant coding (STIC) scheme in [7]. For the PTIC scheme, let $\gamma$ denote the fraction of each packet allocated to high priority messages and $1-\gamma$ the fraction allocated to low priority messages.

ANNEX A2

If a message $M_i$ is decodable by its delay deadline, then $$\begin{cases} \dfrac{c\gamma}{d}(d - L_h) \geq s_h & i \equiv 1 \pmod{c}, \\ \dfrac{c(1-\gamma)}{(c-1)d}(d - L_l) \geq s_l & \text{otherwise}, \end{cases}$$

where $L_h$ denotes the maximum number of lost packets in a coding window when the high priority message is decodable, and $L_l$ is the corresponding number for a low priority message. Since $L_h$ and $L_l$ are the maximum integers satisfying these conditions respectively, we have $$\begin{aligned} L_h &= d - \left\lceil \dfrac{d s_h}{c\gamma} \right\rceil, \\ L_l &= d - \left\lceil \dfrac{(c-1)d s_l}{c(1-\gamma)} \right\rceil. \end{aligned} \quad (22)$$

Let $S_i$ denote the success event "message $M_i$ is decodable by its decoding deadline, i.e, time step $i + d - 1$", and let $\overline{S_i}$ denote the complementary failure event. For the recovery probability to be $r_h$ for high-priority messages and $r_l$ for low priority messages, we need $$\begin{cases} \dfrac{S_i}{S_i + \overline{S_i}} \geq r_h & i \equiv 1 \pmod{c}, \\ \dfrac{S_i}{S_i + \overline{S_i}} \geq r_l & \text{Others}, \end{cases}$$

which equals $$\begin{cases} \displaystyle\sum_{j=0}^{L_h} \binom{d}{j} p^{d-j}(1-p)^j \geq r_h, \\ \displaystyle\sum_{j=0}^{L_l} \binom{d}{j} p^{d-j}(1-p)^j \geq r_l. \end{cases}$$

For comparison, we set $s_h = s_l = s$ to keep consistency in message size with previous work [7, 8].

*Proposition 2:* For the i.i.d. problem with given $(d, c, p, r_h, r_l)$ and $s_h = s_l$, the PTIC scheme can achieve a message size of $$s^* = \dfrac{c(d - \underline{L_h})(d - \underline{L_l})}{d\left((c-1)(d - \underline{L_h}) + (d - \underline{L_l})\right)},$$

with the allocation ratio $$\gamma^* = \dfrac{d - \underline{L_l}}{2d - \underline{L_h} - \underline{L_l}},$$

where $$\underline{L_h} = \min L_h$$

$$\text{s.t.} \sum_{j=0}^{L_h} \binom{d}{j} p^{1-j}(1-p)^j \geq r_h,$$

ANNEX A2 and $$\underline{L_l} = \min L_l$$
$$\text{s.t.} \sum_{j=0}^{L_l} \binom{d}{j} p^{1-j}(1-p)^j \geq r_l.$$

*Proof:* Note that $\underline{L_h}$ and $\underline{L_l}$ are the minimum values of $L_h$ and $L_l$ respectively such that the required decoding probabilities are satisfied. From (22), the message size $s$ and allocation ratio $\gamma$ should satisfy $$\begin{cases} d - \left\lceil \dfrac{ds}{c\gamma} \right\rceil \geq \underline{L_h} \Rightarrow \left\lceil \dfrac{ds}{c\gamma} \right\rceil \leq d - \underline{L_h}, \\ d - \left\lceil \dfrac{(c-1)ds}{c(1-\gamma)} \right\rceil \geq \underline{L_l} \Rightarrow \left\lceil \dfrac{(c-1)ds}{c(1-\gamma)} \right\rceil \leq d - \underline{L_l}. \end{cases}$$

Note that $\lceil a \rceil \leq b \Rightarrow a \leq b$, thus, $$\begin{cases} \dfrac{ds}{c\gamma} \leq d - \underline{L_h}, \\ \dfrac{(c-1)ds}{c(1-\gamma)} \leq d - \underline{L_l}, \end{cases}$$

which is equivalent to $$s = \min\left( \frac{c(d - \underline{L_h})}{d}\gamma, \frac{c(d - \underline{L_l})}{(c-1)d}(1 - \gamma^*) \right).$$

When $s^*$ gets the optimal value, we should have $$\frac{c(d - \underline{L_h})}{d}\gamma^* = \frac{c(d - \underline{L_l})}{(c-1)d}(1 - \gamma^*)$$
$$\Rightarrow \gamma^* = \frac{d - \underline{L_l}}{(c-1)(d - \underline{L_h}) + (d - \underline{L_l})}.$$

Therefore, the optimal messages size under PTIC is $$s^* = \frac{c(d - \underline{L_h})(d - \underline{L_l})}{d\left((c-1)(d - \underline{L_h}) + (d - \underline{L_l})\right)}.$$

∎

Figure 17:
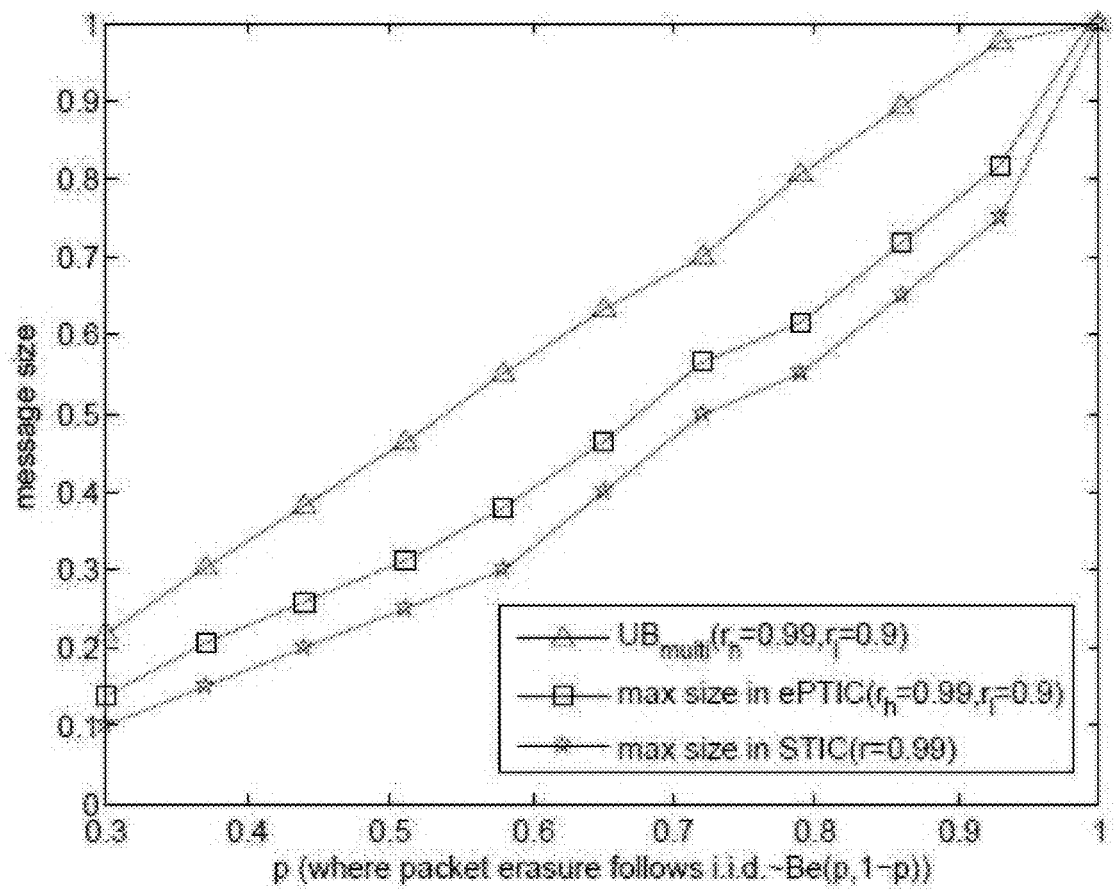
FIG. 17 shows a maximum message size in the proposed proportional time-invariant intra-session code scheme and in the proposed non-prioritized symmetric time-invariant intra-session code scheme, compared with an upper bound $UB_{multi}(r_h, r_l)$ when (c, d)=(2, 20).

The maximum message sizes of PTIC, STIC and the upper bound $UB_{multi}(r_h, r_l)$ are shown in Fig.17. PTIC can achieve bigger message size than STIC, which has to treat all messages with the high priority $r_h$. When the gap between $r_h$ and $r_l$ becomes larger, the gap between PTIC and STIC becomes larger too.

At the same time, there is a gap between PTIC and $UB_{multi}(r_h, r_l)$. This gap decreases as $\rho_h$ and $\rho_l$ become closer or $d$ goes to infinity.

ACKNOWLEDGMENT

The authors would like to thank Michelle Effros, Zhiying Wang, Pak Hou Che and Fei Sun for interesting discussions and helpful suggestions.

LIST OF REFERENCES: ANNEX A1

[1] D. Leong and T. Ho, "Erasure coding for real-time streaming," in *Proc. IEEE Int. Symp. Inf. Theory (ISIT)*, (Cambridge, Massachusetts, USA), July 2012.

[2] D. Leong, A. Qureshi, and T. Ho, "On coding for real-time streaming under packet erasures," in *Proc. IEEE Int. Symp. Inf. Theory (ISIT)*, (Istanbul, Turkey), July 2013.

[3] B. Masnick and J. Wolf, "On linear unequal error protection codes," *IEEE Trans. Inf. Theory*, vol. IT-13, no. 3, pp. 600–607, 1967.

[4] L. J. Schulman, "Coding for interactive communication," *IEEE Trans. Inf. Theory*, vol. 42, pp. 1745–1756, Nov. 1996.

[5] A. Sahai, *Anytime Information Theory*. PhD thesis, Massachusetts Institute of Technology, 2001.

[6] R. T. Sukhavasi, *Distributed Control and Computing: Optimal Estimation, Error Correcting Codes, and Interactive Protocols*. PhD thesis, California Institute of Technology, 2012.

[7] E. Martinian and C.-E. W. Sundberg, "Low delay burst erasure correction codes," in *Proc. IEEE Int. Conf. Commun. (ICC)*, pp. 1736–1740, May 2002.

[8] E. Martinian and M. Trott, "Delay-optimal burst erasure code construction," in *Proc. IEEE Int. Symp. Inf. Theory (ISIT)*, pp. 1006–1010, June 2007.

[9] A. Badr, A. Khisti, W.-T. Tan, and J. Apostolopoulos, "Streaming codes for channels with burst and isolated erasures," *arXiv:1208.0072*, Aug. 2012

[10] O. F. Tekin, S. Vyetrenko, T. Ho, and H. Yao, "Erasure correction for nested receivers," in Proc. Annu. Allerton Conf. Commun. Control, Comput. (Allerton), pp.1454-1461, Sept. 2011.

[11] Y.-K. Wang, R. Even, T. Kristensen, and R. Jesup, "RTP payload format for H.264 video." IETF RFC 6184, May 2011.

[12] "UMTS; LTE; MBMS; Protocols and codecs." 3GPP TS 26.346 version 11.2.0 Release 11, Oct. 2012.

[13] A. H. Li, "RTP payload format for generic forward error correction." IETF RFC 5109, Dec. 2007.

[14] L. Rizzo, "Effective erasure codes for reliable computer communication protocols," *ACM SIGCOMM Comput. Commun. Rev.*, vol. 27, pp. 24–36, Apr. 1997.

[15] Y. Wang and Q.-F. Zhu, "Error control and concealment for video communication: A review," *Proc. IEEE*, vol. 86, pp. 974–997, May 1998.

[16] B. W. Wah, X. Su, and D. Lin, "A survey of error-concealment schemes for real-time audio and video transmissions over the Internet," in *Proc. Int. Symp. Multimedia Software Eng.*, pp. 17–24, Dec. 2000.

[17] J. Rasmussen, A. Shokrollahi, S. Lassen, G. Horn, V. Goyal, B. Dobyns, and M. Luby, "System and method for reliably communicating the content of a live data stream," July 2007.

[18] M. Luby, "LT codes," in *Proc. Annu. IEEE Symp. Found. Comput. Sci. (FOCS)*, Nov. 2002.

[19] M. G. Luby, M. Watson, and M. A. Shokrollahi, "Forward error-correcting (FEC) coding and streaming," Mar. 2010.

[20] D. Leong, A. G. Dimakis, and T. Ho, "Distributed storage allocations," *IEEE Trans. Inf. Theory*, vol. 58, pp. 4733–4752, July 2012.

LIST OF REFERENCES: ANNEX A2

[1] A. Albanese, J. Blomer, J. Edmonds, M. Luby, and M. Sudan, "Priority encoding transmission," *IEEE Transactions on Information Theory*, vol. 42, pp. 1737–1744, Nov. 1996.

[2] B. Masnick and J. Wolf, "On linear unequal error protection codes," *IEEE Trans. Inf. Theory*, vol. IT-13, no. 3, pp. 600–607, 1967.

[3] R. Janakiraman and L. Xu, "Layered priority encoded transmission for video streaming to heterogeneous clients," in *International Symposium on Information Theory (ISIT)*, (Chicago, IL), p. 331, Jun. 2004.

[4] Q. Qu, Y. Pei, and J. W.Modestino, "An adaptive motion-based unequal error protection approach for real-time video transport over wireless ip networks," *IEEE Transactions on Multimedia*, vol. 8, pp. 1033–1044, Oct. 2006.

[5] K.-C. Yang and J.-S. Wang, "Unequal error protection for streaming media based on rateless codes,"

*IEEE Transactions on Computers*, vol. 61, pp. 666–675, May 2012.

[6] Y.-C. Wang, C.-H. Lin, M.-F. Tsai, and C.-K. Shieh, "Cross-layer unequal error protection mechanism with an interleaved strategy for video streaming over wireless networks," in *IEEE Wireless Communications and Networking Conference (WCNC)*,, (Sydney, NSW), pp. 1–6, Apr. 2010.

[7] D. Leong and T. Ho, "Erasure coding for real-time streaming," in *IEEE International Symposium on Information Theory (ISIT)*, (Cambridge, MA), pp. 289–293, July 2012.

[8] D. Leong, A. Qureshi, and T. Ho, "On coding for real-time streaming under packet erasures," in

*IEEE International Symposium on Information Theory (ISIT)*, (Istanbul, Turkey), Jul. 2013.

[9] E. Martinian and C.-E. W.Sundberg, "Burst erasure correction codes with low decoding delay," *IEEE Transactions on Information Theory*, vol. 50, pp. 2492–2502, Oct. 2004.

[10] A. Badr, A. Khisti, and E. Martinian, "Diversity embedded streaming erasure codes (de-sco): Constructions and optimality," *IEEE Journal on Selected Areas in Communications*, vol. 29, pp. 1042–1054, May 2011.

The invention claimed is:

1. A computer-based method for real-time streaming of a plurality of independent messages over a communication link, the computer-based method comprising the steps:
   i) providing via a computer, a message size s of each of the plurality of independent messages at the creation time thereof;
   ii) providing via a computer, a message creation interval c based on a number of time steps, wherein the message creation interval defines the time interval between creation times of two consecutive messages of the plurality of independent messages;
   iii) providing via a computer, a packet size, wherein the packet size defines a size of an encoded packet transmitted at each time step;
   iv) providing via a computer, a link erasure characteristic, wherein the link erasure characteristic defines a communication link over which the encoded packet is transmitted;
   v) providing via a computer, a fixed decoding delay d in number of time steps, wherein the fixed decoding delay defines a delay with respect to a creation time of a message from the plurality of independent messages within which the message must be decoded, via a computer-based decoder, based on one or more transmitted encoded packets;
   vi) based on the steps i)-v), generating via a computer an encoding algorithm;
   vii) based on step vi), generating via a computer a decoding algorithm;
   viii) creating a computer-based encoder operatively implementing the encoding algorithm in one or more of hardware, firmware and software of the computer-based encoder, and
   ix) creating a computer-based decoder operatively implementing the decoding algorithm in one or more of hardware, firmware and software of the computer-based decoder,
   wherein a message of the plurality of independent messages encoded by the computer-based encoder into one or more encoded packets and transmitted over a communication link having the link erasure characteristic is decoded by the computer-based decoder within the fixed decoding delay from the creation time of the message.

2. The computer-based method of claim 1, wherein the link erasure characteristic is based on a window-based erasure model in which all erasure patterns containing a limited number of erasures in each specifically defined window are admissible.

3. The computer-based method of claim 2, wherein the specifically defined window is one of: a) a coding window, and b) a sliding window.

4. The computer-based method of claim 1, wherein the link erasure characteristic is based on a bursty erasure model in which all erasure patterns containing erasure bursts of a limited length, separated by intervals of at least a specified length, are admissible.

5. The computer-based method of claim 1, wherein the link erasure characteristic is based on an independent and identically distributed erasure model in which transmitted packets are erased independently with the same probability.

6. The computer-based method of claim 2, wherein the computer-based encoder has a fixed memory size $m_E$ and wherein the encoding algorithm operatively implemented within the computer-based encoder is a symmetric time-invariant intra-session coding (STIC) algorithm and comprises the computer-generated steps of:
   a. choosing a spreading parameter $m = \in \{c, c+1, \ldots, \min(d, m_E)\}$ where $m_E$ is the encoder memory size;
   b. defining an effective coding window $W_i \triangleq \{(i-1)c+1, \ldots, (i-1)c+m\}$ for each message $M_i$ of the plurality of independent messages;
   c. defining a set of active messages $A_t$ at each time step t as $A_t \triangleq \{M_i : t \in W_i\}$;
   d. dividing a packet space of a packet to be transmitted at each time step t evenly among the set of active messages at time step t, and
   e. using a max distance separable (MDS) code or random linear code to encode each message $M_i$ of the set of active messages into an appropriate number of symbols corresponding to a space of the packet space allocated to that message in the packet to be transmitted.

7. The computer-based method of claim 6, wherein the computer-based decoder receives a subset of the encoded packets, and based on the received packets, decodes each message separately using a computer-based decoder for the MDS or random linear code used to encode that message.

8. The computer-based method of claim 7, wherein the MDS code is a Reed-Solomon code.

9. The computer-based method of claim 7, wherein the linear code is constructed based on a random linear combination of symbols in a finite field.

10. The computer-based method of claim 4, wherein the bursty erasure model has a maximum erasure burst length z so that $s \leq c(d-z)/d$, and wherein the encoding algorithm operatively implemented within the computer-based encoder is a diagonally interleaved coding (DIC) algorithm and comprises the computer-generated steps of:
   a. considering a rectangular grid with d rows, where each column represents one encoded packet of normalized unit size; each cell in the grid contains one symbol of normalized size 1/d; the top d-z rows of the grid contain the message information symbols, while the bottom z rows contain the parity symbols;
   b. inserting the c(d-z) message symbols of message k, which is created at time step (k-1)c+1, into the cells in the top d-z rows of columns (k-1)c+1, ..., (k-1)c+c, wherein zero padding or repeated symbols may be used if there are fewer than c(d-z) message symbols;
   c. applying a computer-generated component systematic block code C to each diagonal on the grid, to generate the parity symbols in the bottom z rows, and
   d. transmitting each column of d symbols as a packet at the corresponding time step.

11. The computer-based method of claim 10, wherein the computer-generated component systematic block code C comprises d symbols, the first d-z symbols being information symbols, while the last z symbols being parity symbols which can be non-degenerate or degenerate, and is generated using the following computer-generated steps:
   a. selecting the degenerate parity symbols by grouping parity symbols into disjoint intervals of d-z symbols, if available, counting from the end of the block code, wherein degenerate parity symbols are uncoded copies of the information symbols, arranged in the same order;
   b. setting the remaining z' parity symbols as the non-degenerate parity symbols, where $0 \leq z' < d-z$;
   c. arranging the information symbols into rows of z' symbols, counting from the beginning of the block code; If there are fewer than z' symbols in the last row, then repeat them as many times as necessary until the row is filled, and d. arranging the z' non-degenerate parity symbols below the last row of information symbols, and setting each non-degenerate parity symbol to be the bit-wise modulo-2 sum of the information symbols above the each non-degenerate parity symbol, wherein the computer-generated component systematic block code is given by the d−z information symbols, followed by the z' non-degenerate parity symbols (if any), followed by the z−z' degenerate parity symbols, if any.

12. The computer-based method of claim 10, wherein the computer-based decoder receives a subset of the encoded packets, and recovers the erased message symbols by taking a bit-wise modulo-2 sum of appropriate codeword symbols on each diagonal.

13. The computer-based method of claim 1 further comprising:
providing parameters specifying decoding requirements for high and low priority messages, wherein high and low priority messages are created according to a periodic pattern such as a message of the plurality of messages is a high priority message or a low priority message.

14. The computer-based method of claim 13, wherein the encoder algorithm operatively implemented within the computer-based encoder is a proportional time-invariant intra-session coding (PTIC) algorithm and comprises the computer-generated steps of:
a. choosing a spreading parameter m=d;
b. defining an effective coding window $W_i \triangleq \{i, i+1, \ldots, i+d-1\}$ for each message $M_i$;
c. defining a set of active messages $A_t$ at each time step t as $A_t \triangleq \{M_i : t \in W_i\}$;
d. dividing a packet space of a packet to be transmitted at each time step t into one or more blocks according to the priority of an active message $M_i$ of the set of active messages, such as a block size allocated to the message $M_1$ at time step t is:

$$M_i[t] = \begin{cases} \dfrac{cs_h\rho_l}{d(s_h\rho_l + (c-1)s_l\rho_h)} & i \equiv 1 \pmod{c}, \\ \dfrac{cs_l\rho_h}{d(s_h\rho_l + (c-1)s_l\rho_h)} & \text{otherwise} \end{cases} ; \text{ and}$$

otherwise; and
e. using a max distance separable (MDS) code or random linear code to encode the message $M_i$ into an appropriate number of symbols corresponding to the block size allocated to the message $M_i$ in the packet to be transmitted, wherein parameters $\rho_h$ and $\rho_l$ specify decoding requirements for high and low priority messages respectively and wherein a size $s_h$ for a high priority message and $s_l$ for a low priority message are bound by the expression:
$s_h\rho_l + (c-1)s_l\rho_h \leq c\rho_h\rho_l$.

15. The computer-based method of claim 14, wherein the computer-based decoder receives a subset of the encoded packets, and based on the received packets, decodes each message separately using a decoder for the MDS or random linear code used to encode that message.

16. The computer-based method of claim 15, wherein the parameters specifying decoding requirements for high and low priority messages are based on a number of erasures $z_h$ and $z_l$ respectively a message is required to tolerate, so that $z_l \leq z_h \leq d$ and given by the expressions:

$$\rho_h = \frac{d - z_h}{d}, \quad \rho_l = \frac{d - z_l}{d},$$

where $\rho_l \geq \rho_h$.

17. A computer-based real-time streaming system comprising:
a computer-based source module configured to create a message of a plurality of independent messages of uniform size at a creation time of the message and encode the message into a plurality of sub-packets of a plurality of encoded packets, and
a computer-based receiver module configured to decode the message of the plurality of independent messages within a fixed time delay from the creation time of the message based on a subset of the plurality of encoded packets,
wherein the plurality of encoded packets are transmitted by the computer-based source module over a communication link to the computer-based receiver module;
wherein the computer-based receiver module receives the subset of the plurality of encoded packets, and
wherein an encoded packet of the plurality of encoded packets is encoded according to a set of parameters comprising: a) a link erasure characteristic of the communication link, b) the fixed time delay, c) the uniform size, d) a configurable size of the encoded packet, and e) a time interval between two consecutive creation times of the plurality of the independent messages.

* * * * *